(12) United States Patent
Inabe

(10) Patent No.: US 12,111,487 B2
(45) Date of Patent: Oct. 8, 2024

(54) COLOR FILTER, SOLID-STATE IMAGING ELEMENT, AND IMAGE DISPLAY DEVICE

(71) Applicant: FUJIFILM Corporation, Tokyo (JP)

(72) Inventor: Haruki Inabe, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 542 days.

(21) Appl. No.: 17/553,802

(22) Filed: Dec. 17, 2021

(65) Prior Publication Data

US 2022/0107450 A1 Apr. 7, 2022

Related U.S. Application Data

(63) Continuation of application No. PCT/JP2020/025751, filed on Jul. 1, 2020.

(30) Foreign Application Priority Data

Jul. 9, 2019 (JP) .................. 2019-127328

(51) Int. Cl.
*G02B 5/20* (2006.01)
*C09B 47/06* (2006.01)
*G02B 1/04* (2006.01)
*H01L 27/146* (2006.01)

(52) U.S. Cl.
CPC .............. *G02B 5/208* (2013.01); *C09B 47/06* (2013.01); *G02B 1/04* (2013.01); *H01L 27/14621* (2013.01)

(58) Field of Classification Search
CPC .......... G02B 5/208; G02B 1/04; C09B 47/06; H01L 27/14621
See application file for complete search history.

(56) References Cited

U.S. PATENT DOCUMENTS

2020/0119071 A1    4/2020   Takishita et al.

FOREIGN PATENT DOCUMENTS

| JP | 2014012813 | 1/2014 |
|----|------------|--------|
| JP | 2018091886 | 6/2018 |
| JP | 2018105959 | 7/2018 |
| JP | 2019066834 | 4/2019 |
| WO | 2019039172 | 2/2019 |

OTHER PUBLICATIONS

"International Search Report (Form PCT/ISA/210) of PCT/JP2020/025751," mailed on Aug. 25, 2020, with English translation thereof, pp. 1-5.
"Written Opinion of the International Searching Authority (Form PCT/ISA/237)" of PCT/JP2020/025751, mailed on Aug. 25, 2020, with English translation thereof, pp. 1-6.
Office Action of Japan Counterpart Application, with English translation thereof, issued on Sep. 13, 2022, pp. 1-6.

*Primary Examiner* — Joseph L Williams
(74) *Attorney, Agent, or Firm* — JCIPRNET

(57) ABSTRACT

Provided are a color filter including a colored pixel A including an aluminum phthalocyanine pigment and an ultraviolet absorbing layer which is provided on an optical path on a light incident side of the colored pixel A and has a wavelength region having a transmittance of 20% or less in a wavelength range of 300 to 450 nm, in which a transmittance in a wavelength region of 550 to 800 nm is 80% or more; and a solid-state imaging element and an image display device which include the color filter.

13 Claims, 1 Drawing Sheet

COLOR FILTER, SOLID-STATE IMAGING ELEMENT, AND IMAGE DISPLAY DEVICE

CROSS-REFERENCE TO RELATED APPLICATIONS

This application is a Continuation of PCT International Application No. PCT/JP2020/025751 filed on Jul. 1, 2020, which claims priority under 35 U.S.C § 119(a) to Japanese Patent Application No. 2019-127328 filed on Jul. 9, 2019. Each of the above application(s) is hereby expressly incorporated by reference, in its entirety, into the present application.

BACKGROUND OF THE INVENTION

1. Field of the Invention

The present invention relates to a color filter. More specifically, the present invention relates to a color filter having a pixel including an aluminum phthalocyanine pigment. The present invention also relates to a solid-state imaging element including the color filter and an image display device.

2. Description of the Related Art

In recent years, as a digital camera, a mobile phone with a camera, and the like have been further spreading, there has been a greatly increasing demand for a solid-state imaging element such as a charge coupled device (CCD) image sensor. A color filter has been used as a key device in a display or an optical element. Generally, a color filter has a colored pixel including a colorant.

For example, the colored pixel of the color filter is manufactured using a coloring composition including a colorant. In addition, in recent years, the use of an aluminum phthalocyanine pigment as the colorant has been studied.

JP2018-105959A discloses that a photosensitive coloring composition for a color filter, which contains a colorant including a predetermined aluminum phthalocyanine pigment, a binder resin, an antioxidant, a photopolymerization initiator, and a photopolymerizable monomer, is used for manufacturing a colored pixel of a color filter.

SUMMARY OF THE INVENTION

As a result of studies with regard to a color filter which has a colored pixel including an aluminum phthalocyanine pigment, the present inventor has found that foreign matter is likely to be generated in a vicinity of a boundary between the colored pixel including an aluminum phthalocyanine pigment and other pixels adjacent to the colored pixel.

Therefore, an object of the present invention is to provide a color filter which has a colored pixel including an aluminum phthalocyanine pigment and in which the generation of foreign matters is suppressed. Another object of the present invention is to provide a solid-state imaging element and an image display device which include the color filter.

According to the studies, the present inventor has found that the aluminum phthalocyanine pigment tends to be decomposed or denatured by light irradiation. The reason why the aluminum phthalocyanine pigment is easily decomposed by light irradiation is unclear, but the present inventor presumes as follows. That is, since a central metal aluminum is a trivalent metal, the aluminum phthalocyanine pigment has a monovalent ligand in addition to the phthalocyanine which is a divalent ligand. However, due to an influence of this monovalent ligand, a leveling of the phthalocyanine skeleton is slightly lost, and a triangular pyramid-shaped complex centered on aluminum is formed. Due to this influence, the leveling of the phthalocyanine skeleton is slightly lost and an aromaticity thereof is slightly reduced, so that it is presumed that the aluminum phthalocyanine pigment is easily decomposed or denatured by light irradiation. As a result of further studies by the present inventor, it is considered that the foreign matters are generated due to a decomposition product or denatured product derived from an aluminum phthalocyanine pigment decomposed or denatured by light irradiation. In the color filter which has a colored pixel including an aluminum phthalocyanine pigment, in a case where an ultraviolet absorbing layer is provided on a light incident side of the color filter rather than the colored pixel including an aluminum phthalocyanine pigment, surprisingly, it has been found that the generation of foreign matters, in particular, the generation of foreign matters in the vicinity of the boundary between the colored pixel including an aluminum phthalocyanine pigment and other pixels adjacent to the colored pixel can be effectively suppressed, thereby leading to the completion of the present invention. That is, the present invention is as follows.

<1> A color filter comprising:
a colored pixel A including an aluminum phthalocyanine pigment; and
an ultraviolet absorbing layer which is provided on an optical path on a light incident side of the colored pixel A and has a wavelength region having a transmittance of 20% or less in a wavelength range of 300 to 450 nm, in which a transmittance in a wavelength region of 550 to 800 nm is 80% or more.

<2> The color filter according to <1>,
in which the ultraviolet absorbing layer is laminated on a surface of the colored pixel A.

<3> The color filter according to <1> or <2>,
In which the aluminum phthalocyanine pigment is at least one selected from a compound represented by Formula (AL1) or a compound represented by Formula (AL2),

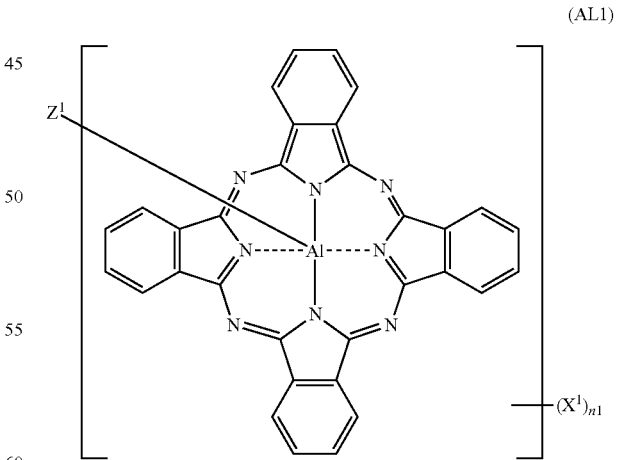

(AL1)

in Formula (AL1), $X^1$ represents a halogen atom,
$Z^1$ represents a hydroxy group, $-OP(=O)R^1R^2$, $-OC(=O)R^3$, $-OS(=O)_2R^4$, or $-O-SiR^5R^6R^7$, where $R^1$ and $R^2$ each independently represent a hydroxy group, an alkyl group, an aryl group, a heterocyclic group, an alkoxy group, or an aryloxy group, $R^1$ and $R^2$ may be bonded to each other to form a ring, $R^3$ to $R^7$ each independently represent a hydrogen atom, a hydroxy group, an alkyl group, an aryl group, a heterocyclic group, an alkoxy group, or an aryloxy group, and $R^5$ and $R^6$ may be bonded to each other to form a ring, and n1 represents an integer of 0 to 16,

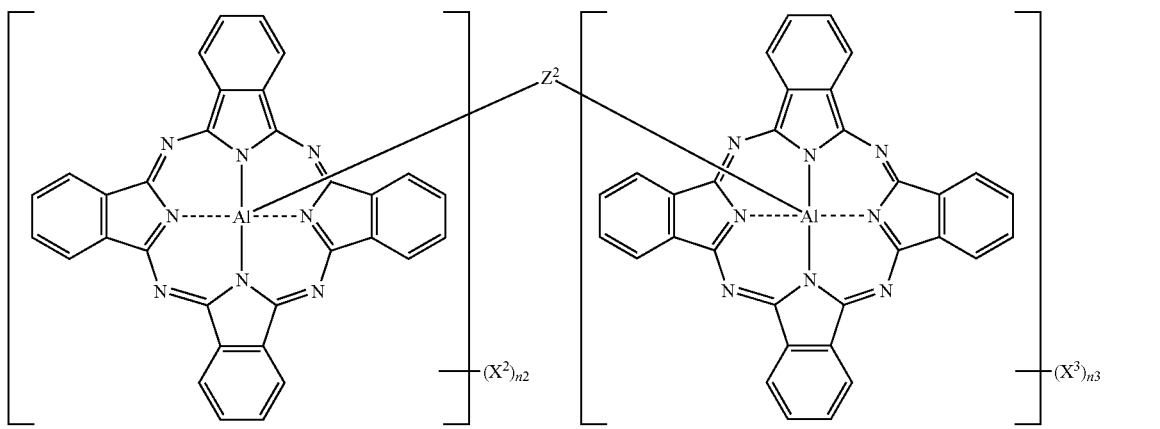

in Formula (AL2), $X^2$ and $X^3$ each independently represent a halogen atom, $Z^2$ represents —O—$SiR^{11}R^{12}$—O—, —O—$SiR^{13}R^{14}$—O—$SiR^{15}R^{16}$—O—, or —O—P(=O)$R^{17}$—O—, where $R^{11}$ to $R^{17}$ each independently represent a hydrogen atom, a hydroxy group, an alkyl group, an aryl group, a heterocyclic group, an alkoxy group, or an aryloxy group, and n2 and n3 each independently represent an integer of 0 to 16.

<4> The color filter according to <3>,
in which the aluminum phthalocyanine pigment is the compound represented by Formula (AL1), and $Z^1$ is —OP(=O)$R^1R^2$.

<5> The color filter according to <3> or <4>,
in which the aluminum phthalocyanine pigment is the compound represented by Formula (AL1), and n1 represents an integer of 4 to 16, an average value of the number of substitutions of halogen atoms represented by $X^1$ is 6 to 15, and a halogen distribution width is 4 or more.

<6> The color filter according to <5>,
in which $X^1$ is a bromine atom.

<7> The color filter according to any one of <1> to <6>,
in which the colored pixel A includes a phthalocyanine pigment derivative.

<8> The color filter according to any one of <1> to <7>,
in which the colored pixel A includes a resin having an aromatic carboxyl group.

<9> The color filter according to any one of <1> to <8>,
in which the ultraviolet absorbing layer includes at least one selected from an ultraviolet absorber or a yellow colorant.

<10> The color filter according to any one of <1> to <9>, further comprising:
an another pixel which is different from the colored pixel A and is in contact with at least a part of a side surface of the colored pixel A.

<11> The color filter according to <10>,
in which the another pixel includes a phthalocyanine pigment.

<12> A solid-state imaging element comprising:
the color filter according to any one of <1> to <11>.

<13> An image display device comprising:
the color filter according to any one of <1> to <11>.

According to the present invention, it is possible to provide a color filter in which the generation of foreign matters is suppressed, a solid-state imaging element, and an image display device.

DESCRIPTION OF THE PREFERRED EMBODIMENTS

Figure 1:
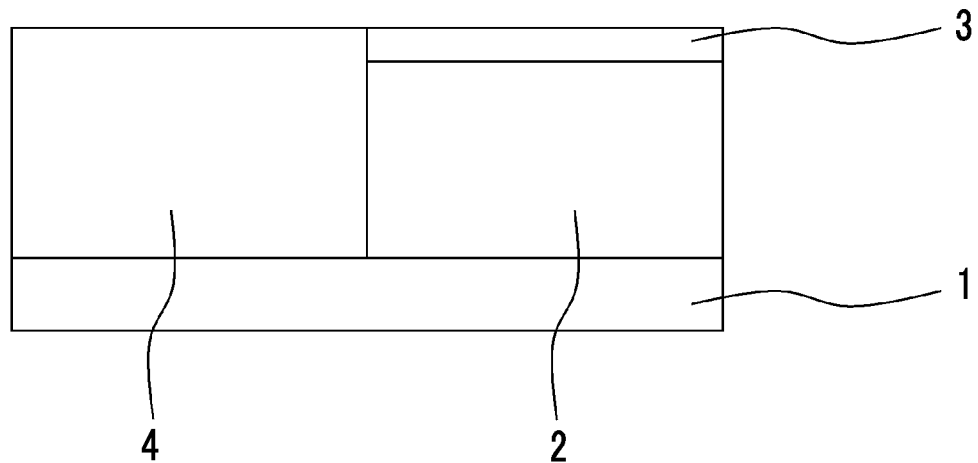
FIG. 1 is a schematic diagram indicating an embodiment of a color filter.

Hereinafter, the contents of the present invention will be described in detail.

In the present specification, "to" is used to refer to a meaning including numerical values denoted before and after "to" as a lower limit value and an upper limit value.

In the present specification, unless specified as a substituted group or as an unsubstituted group, a group (atomic group) denotes not only a group (atomic group) having no substituent but also a group (atomic group) having a substituent. For example, an "alkyl group" includes not only an alkyl group having no substituent (unsubstituted alkyl group), but also an alkyl group having a substituent (substituted alkyl group).

In the present specification, unless specified otherwise, "exposure" denotes not only exposure using light but also drawing using a corpuscular beam such as an electron beam or an ion beam. In addition, examples of light used for the exposure include actinic rays or radiation such as a bright line spectrum of a mercury lamp, far ultraviolet rays typified by an excimer laser, extreme ultraviolet rays (EUV light), X-rays, or electron beams.

In the present specification, "(meth)acrylate" denotes either or both of acrylate and methacrylate, "(meth)acryl"

denotes either or both of acryl and methacryl, and "(meth) acryloyl" denotes either or both of acryloyl and methacryloyl.

In the present specification, in a structural formula, Me represents a methyl group, Et represents an ethyl group, Bu represents a butyl group, and Ph represents a phenyl group.

In the present specification, a weight-average molecular weight and a number-average molecular weight are values in terms of polystyrene through measurement by a gel permeation chromatography (GPC) method.

In the present specification, the total solid content refers to a total mass of components other than a solvent from all the components of a composition.

In the present specification, a pigment means a compound which is hardly dissolved in a solvent.

In the present specification, the term "step" is not only an independent step, but also includes a step which is not clearly distinguished from other steps in a case where an intended action of the step is obtained.

<Color Filter>

A color filter according to an embodiment of the present invention includes a colored pixel A including an aluminum phthalocyanine pigment and an ultraviolet absorbing layer which is provided on an optical path on a light incident side of the colored pixel A and has a wavelength region having a transmittance of 20% or less in a wavelength range of 300 to 450 nm, in which a transmittance in a wavelength region of 550 to 800 nm is 80% or more.

The color filter according to the embodiment of the present invention can be a color filter in which the generation of foreign matters is suppressed. The detailed reason for obtaining such an effect is not sure, but is presumed as follows. In the color filter according to the embodiment of the present invention, since the ultraviolet absorbing layer having the above-described predetermined spectral characteristics is provided on the optical path on the light incident side of the above-described colored pixel A, it is presumed that the ultraviolet absorbing layer can effectively absorb light in a visible region near an ultraviolet region, and decomposition or the like of the aluminum phthalocyanine pigment included in the colored pixel A can be effectively suppressed. Therefore, it is presumed that the generation of a decomposition product or denatured product derived from the aluminum phthalocyanine pigment is suppressed, so that the generation of foreign matters can be suppressed. In addition, since the decomposition or the like of the aluminum phthalocyanine pigment included in the colored pixel A can be suppressed by providing the ultraviolet absorbing layer, variation in spectral characteristics of the colored pixel A due to light irradiation can be suppressed, and light resistance of the colored pixel A can be improved.

The colored pixel A in the color filter according to the embodiment of the present invention is preferably formed on a support. The support is not particularly limited. Examples thereof include a substrate (silicon wafer, silicon carbide wafer, silicon nitride wafer, sapphire wafer, and glass wafer) used in various electronic devices such as a solid-state imaging element. In addition, as necessary, an undercoat layer may be provided on these substrates so as to improve adhesiveness to an upper layer, prevent the diffusion of substances, or planarize the surface. A contact angle of the undercoat layer with respect to diiodomethane at 25° C. is preferably 20° to 70°. In addition, a contact angle of the undercoat layer with respect to water at 25° C. is preferably 30° to 80°.

A film thickness of the colored pixel A in the color filter according to the embodiment of the present invention is preferably 0.05 to 10.0 μm, more preferably 0.10 to 3.0 μm, and still more preferably 0.20 to 1.0 μm.

A hue of the colored pixel A is not particularly limited, and examples thereof include green and cyan.

In the color filter according to the embodiment of the present invention, the ultraviolet absorbing layer is provided on the optical path on the light incident side of the colored pixel A. Another layer may be interposed between the ultraviolet absorbing layer and the colored pixel A, but since the effect of the present invention can be easily exerted, it is preferable that the ultraviolet absorbing layer is laminated on a surface of the colored pixel A.

A film thickness of the ultraviolet absorbing layer is preferably 0.10 to 0.60 μm, more preferably 0.15 to 0.50 μm, and still more preferably 0.20 to 0.40 μm. In addition, the film thickness of the ultraviolet absorbing layer is preferably 0.02 to 1.50 times the film thickness of the colored pixel A. The upper limit is preferably 1.00 times or less and more preferably 0.70 times or less. The lower limit is preferably 0.05 times or more and more preferably 0.10 times or more.

The ultraviolet absorbing layer has a wavelength region having a transmittance of 20% or less in a wavelength range of 300 to 450 nm, and it is preferable to have a wavelength region having a transmittance of 15% or less in the wavelength range of 300 to 450 nm, it is more preferable to have a wavelength region having a transmittance of 10% or less in the wavelength range of 300 to 450 nm, it is still more preferable to have a wavelength region having a transmittance of 7% or less, and it is particularly preferable to have a wavelength region having a transmittance of 5% or less. In addition, in the ultraviolet absorbing layer, a transmittance in a wavelength region of 550 to 800 nm is 80% or more, preferably 85% or more, more preferably 87% or more, and still more preferably 90% or more.

Examples of one form of the color filter include an aspect (also referred to as an aspect 1) including the colored pixel A and another pixel (hereinafter, also referred to as a pixel B) which is different from the colored pixel A and is in contact with at least a part of a side surface of the colored pixel A.

According to studies, in a color filter which has a colored pixel (colored pixel A) including an aluminum phthalocyanine pigment in the related art, the present inventor has found that foreign matters are particularly likely to be generated in a vicinity of a boundary between the colored pixel (colored pixel A) including an aluminum phthalocyanine pigment and another pixel adjacent to this colored pixel (colored pixel A). In a case of the color filter according to the embodiment of the present invention, since the above-described ultraviolet absorbing layer is provided on the light incident side rather than the colored pixel A, the generation of foreign matters in the vicinity of the boundary between the colored pixel A and another pixel adjacent to the colored pixel A, so that it is particularly effective in the case of the color filter of the above-described aspect 1.

Figure 2:
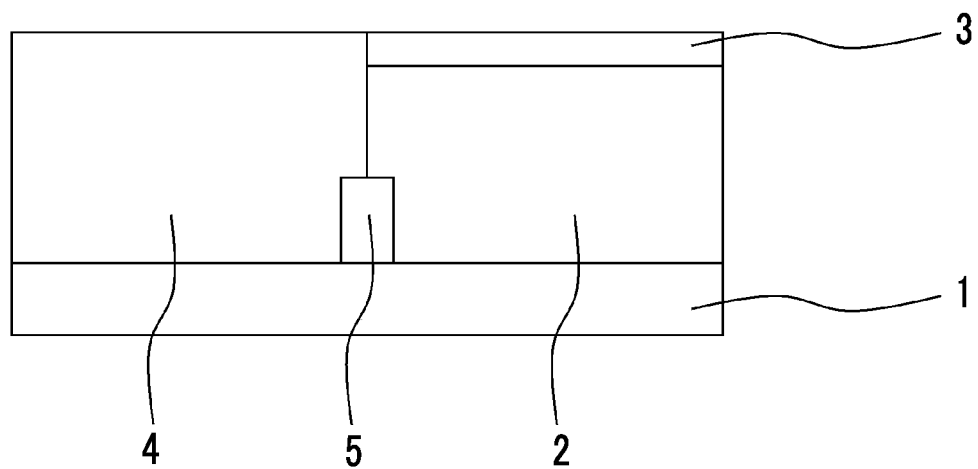
FIG. 2 is a schematic diagram indicating an embodiment of a color filter.

In the color filter of the aspect 1, the pixel B may be in contact with at least a part of the side surface of the colored pixel A. For example, as shown in FIG. 1, the colored pixel A (reference numeral 2) and the pixel B (reference numeral 4) may be provided adjacent to each other on a support 1, and as shown in FIG. 2, between the colored pixel A (reference numeral 2) and the pixel B (reference numeral 4), a partition wall 5 having a height lower than those of these pixels may be provided, so that the colored pixel A and the pixel B may be in contact with each other on the partition wall 5. In FIGS. 1 and 2, the reference numeral 3 is the ultraviolet absorbing layer. In FIGS. 1 and 2, the ultraviolet absorbing layer 3 is laminated on the surface of the colored pixel A (reference numeral 2), but an interlayer may be provided between the colored pixel A (reference numeral 2) and the ultraviolet absorbing layer 3. In addition, in FIGS. 1 and 2, the total thickness of the colored pixel A (reference numeral 2) and ultraviolet absorbing layer 3 and the thickness of the pixel B (reference numeral 4) are substantially the same, and the thickness of the colored pixel A (reference numeral 2) is thinner than that of the pixel B (reference numeral 4) by the thickness of the ultraviolet absorbing layer 3, but the colored pixel A (reference numeral 2) and the pixel B (reference numeral 4) may have the same thickness, and the colored pixel A (reference numeral 2) may be thicker than the pixel B (reference numeral 4).

In the above-described color filter of the aspect 1, examples of the another pixel (pixel B) include a colored pixel having a hue different from that of the colored pixel, a transparent pixel, and a pixel of an infrared transmission layer. Examples of the colored pixel include a green pixel, a red pixel, a blue pixel, a cyan pixel, a magenta pixel, and a yellow pixel.

Examples of the transparent pixel include a pixel in which the minimum value of a transmittance in a wavelength range of 400 to 600 nm is 80% or more. The minimum value of the above-described transmittance is preferably 90% or more and more preferably 95% or more. The transparent pixel can be formed of a composition for forming a transparent pixel, which will be described later.

The pixel of an infrared transmission layer is not particularly limited as long as the pixel is a pixel having spectral characteristics which shield visible light and transmit at least a part of infrared ray.

Preferred examples of the pixel of an infrared transmission layer include pixels having any of the following spectral characteristics (1) to (4).

(1): pixel in which the maximum value of the light transmittance in a thickness direction in a wavelength range of 400 to 640 nm is 20% or less (preferably 15% or less and more preferably 10% or less) and the minimum value of the light transmittance in the thickness direction in a wavelength range of 800 to 1300 nm is 70% or more (preferably 75% or more and more preferably 80% or more). According to this pixel, light having a wavelength range of 400 to 640 nm can be shielded, and light having a wavelength exceeding 670 nm can be transmitted.

(2): pixel in which the maximum value of the light transmittance in a thickness direction in a wavelength range of 400 to 750 nm is 20% or less (preferably 15% or less and more preferably 10% or less) and the minimum value of the light transmittance in the thickness direction in a wavelength range of 900 to 1300 nm is 70% or more (preferably 75% or more and more preferably 80% or more). According to this pixel, light having a wavelength range of 400 to 750 nm can be shielded, and light having a wavelength exceeding 850 nm can be transmitted.

(3): pixel in which the maximum value of the light transmittance in a thickness direction in a wavelength range of 400 to 830 nm is 20% or less (preferably 15% or less and more preferably 10% or less) and the minimum value of the light transmittance in the thickness direction in a wavelength range of 1000 to 1300 nm is 70% or more (preferably 75% or more and more preferably 80% or more). According to this pixel, light having a wavelength range of 400 to 830 nm can be shielded, and light having a wavelength exceeding 940 nm can be transmitted.

(4): pixel in which the maximum value of the light transmittance in a thickness direction in a wavelength range of 400 to 950 nm is 20% or less (preferably 15% or less and more preferably 10% or less) and the minimum value of the light transmittance in the thickness direction in a wavelength range of 1100 to 1300 nm is 70% or more (preferably 75% or more and more preferably 80% or more). According to this pixel, light having a wavelength range of 400 to 950 nm can be shielded, and light having a wavelength exceeding 1040 nm can be transmitted.

According to studies, the present inventor has found that, in a case where the colored pixel including an aluminum phthalocyanine pigment is adjacent to a pixel including a phthalocyanine pigment, foreign matters are particularly likely to be generated in the vicinity of the boundary between them. However, by providing the ultraviolet absorbing layer having the above-described predetermined spectral characteristics on the optical path on the light incident side of the colored pixel having an aluminum phthalocyanine pigment, even in a case where the colored pixel including an aluminum phthalocyanine pigment is adjacent to another pixel including a phthalocyanine pigment, the generation of foreign matters can be suppressed. Therefore, the effect of the present invention is remarkable in a case where the pixel B includes a phthalocyanine pigment. Examples of the pixel including a phthalocyanine pigment include a blue pixel, a green pixel, a cyan pixel, and a pixel of an infrared transmission layer, and a blue pixel is preferable.

Examples of the above-described phthalocyanine pigment include C. I. Pigment Blue 15, 15:1, 15:2, 15:3, 15:4, 15:6, and 16, and C. I. Pigment Blue 15, 15:1, 15:2, 15:3, 15:4, or 15:6 is effective and C. I. Pigment 15:6 is particularly effective.

The content of the phthalocyanine pigment in the pixel B is preferably 5 to 70 mass %, more preferably 10 to 65 mass %, and still more preferably 15 to 60 mass %.

In the above-described aspect 1, the ultraviolet absorbing layer may be provided on a surface of the pixel B (reference numeral 4).

In the above-described aspect 1, the color filter may further include another pixel (hereinafter, also referred to as a pixel C) which is different from the colored pixel A and the pixel B. Examples of the pixel C include a colored pixel, a transparent pixel, and a pixel of an infrared transmitting filter. The pixel C may be one type or two or more types. In addition, the pixel C may be in contact with at least a part of the side surface of the colored pixel A, or may not be in contact with both. In addition, in a case of further including the pixel C, the ultraviolet absorbing layer may be provided on a surface of the pixel C as well.

Hereinafter, details of the colored pixel A and the ultraviolet absorbing layer in the color filter according to the embodiment of the present invention will be described.

<<Colored Pixel A>>

(Aluminum Phthalocyanine Pigment)

The colored pixel A includes an aluminum phthalocyanine pigment. The aluminum phthalocyanine pigment is a phthalocyanine pigment in which a central metal is aluminum. As the aluminum phthalocyanine pigment, at least one selected from a compound represented by Formula (AL1) or a compound represented by Formula (AL2) is preferable, and a compound represented by Formula (AL1) is more preferable.

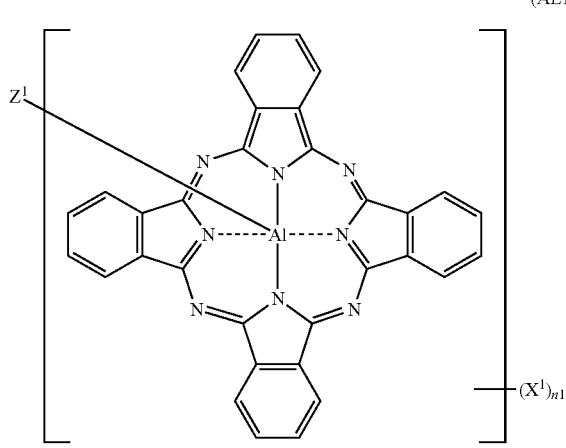

(AL1)

In Formula (AL1), $X^1$ represents a halogen atom,
$Z^1$ represents a hydroxy group, —OP(=O)$R^1R^2$, —OC(=O)$R^3$, —OS(=O)$_2R^4$, or —O—Si$R^5R^6R^7$, where $R^1$ and $R^2$ each independently represent a hydroxy group, an alkyl group, an aryl group, a heterocyclic group, an alkoxy group, or an aryloxy group, $R^1$ and $R^2$ may be bonded to each other to form a ring, $R^3$ to $R^7$ each independently represent a hydrogen atom, a hydroxy group, an alkyl group, an aryl group, a heterocyclic group, an alkoxy group, or an aryloxy group, and $R^5$ and $R^6$ may be bonded to each other to form a ring, and
n1 represents an integer of 0 to 16.

n2 and n3 each independently represent an integer of 0 to 16.

First, Formula (AL1) will be described.

In Formula (AL1), examples of the halogen atom represented by $X^1$ include a fluorine atom, a chlorine atom, a bromine atom, and an iodine atom, and a chlorine atom or a bromine atom is preferable, and a bromine atom is more preferable.

In Formula (AL1), n1 represents an integer of 0 to 16, and is preferably an integer of 4 to 16. N1 may be 0.

In addition, in Formula (AL1), an average value of the number of substitutions of halogen atoms represented by $X^1$ is preferably 1 to 15, more preferably 4 to 15, and from the viewpoint of fastness, still more preferably 6 to 15. Here, the "average value of the number of substitutions of halogen atoms represented by $X^1$" is the average value of the number of halogens substituted to the compound represented by Formula (AL1). In addition, a halogen distribution width is preferably 2 or more, more preferably 4 or more, and still more preferably 4 to 9. In a case where the halogen distribution width is 2 or more, association between phthalocyanine molecules is remarkably suppressed, so that it is possible to suppress an increase in particle size due to the association between molecules, and thus a decrease in contrast. Here, the "halogen distribution width" is the distribution of the number of halogens substituted to the compound represented by Formula (AU). As the halogen distribution width, in the mass spectrum obtained by mass spectrometry, the signal intensity (each peak value) of molecular ion peaks corresponding to each component and the integrated value (all peak values) of each peak value are calculated, and the number of peaks in which the ratio of each peak value to all peak values is 1% or more is counted and defined as the halogen distribution width.

In Formula (AL1), $Z^1$ represents a hydroxy group, —OP(=O)$R^1R^2$, —OC(=O)$R^3$, —OS(=O)$_2R^4$, or —O—Si$R^5R^6R^7$, where $R^1$ and $R^2$ each independently rep-

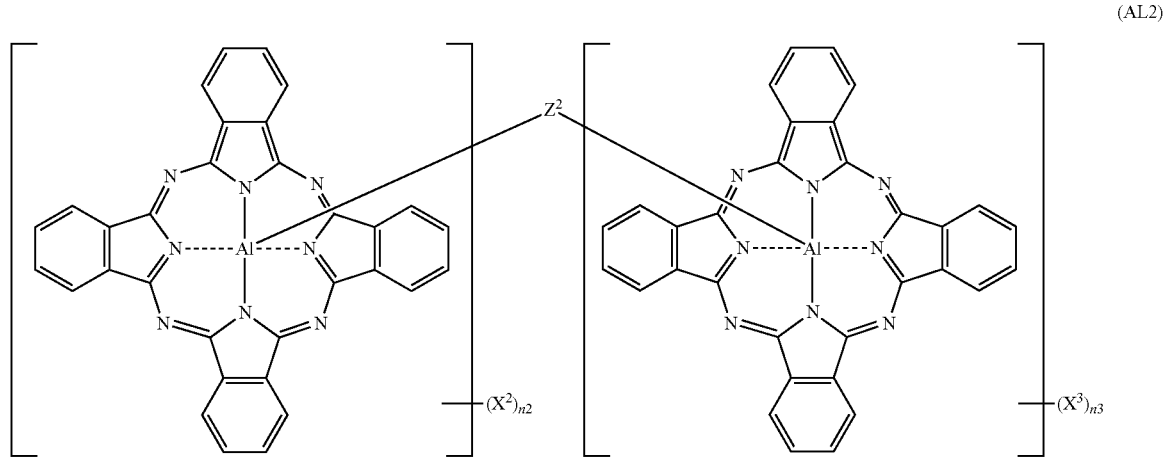

(AL2)

In Formula (AL2), $X^2$ and $X^3$ each independently represent a halogen atom,
$Z^2$ represents —O—Si$R^{11}R^{12}$—O—, —O—Si$R^{13}R^{14}$—O—Si$R^{15}R^{16}$—O—, or —O—P(=O)$R^{17}$—O—, where $R^{11}$ to $R^{17}$ each independently represent a hydrogen atom, a hydroxy group, an alkyl group, an aryl group, a heterocyclic group, an alkoxy group, or an aryloxy group, and resent a hydroxy group, an alkyl group, an aryl group, a heterocyclic group, an alkoxy group, or an aryloxy group, $R^1$ and $R^2$ may be bonded to each other to form a ring, $R^3$ to $R^7$ each independently represent a hydrogen atom, a hydroxy group, an alkyl group, an aryl group, a heterocyclic group, an alkoxy group, or an aryloxy group, and $R^5$ and $R^6$ may be bonded to each other to form a ring.

The alkyl group represented by $R^1$ to $R^7$ preferably has 1 to 20 carbon atoms, more preferably has 1 to 15 carbon atoms, and still more preferably has 1 to 6 carbon atoms. The alkyl group may be linear, branched, or cyclic. The alkyl group may have a substituent. Examples of the substituent include a halogen atom, an alkoxy group, an aryl group, and a nitro group. In addition, there may be a plurality of substituents.

The aryl group represented by $R^1$ to $R^7$ preferably has 6 to 20 carbon atoms and more preferably has 6 to 12 carbon atoms. The aryl group may have a substituent. Examples of the substituent include a halogen atom, an alkyl group, an alkoxy group, and a nitro group. In addition, there may be a plurality of substituents.

The heterocyclic group represented by $R^1$ to $R^7$ is preferably a heterocyclic group having a single ring or a fused ring having 2 to 8 fused numbers, and more preferably a heterocyclic group having a single ring or a fused ring having 2 to 4 fused numbers. The number of heteroatoms constituting a ring of the heterocyclic group is preferably 1 to 3. Examples of the heteroatom constituting the ring of the heterocyclic group include a nitrogen atom, an oxygen atom, and a sulfur atom, and a nitrogen atom is preferable. The number of carbon atoms constituting the ring of the heterocyclic group is preferably 3 to 20, more preferably 3 to 18, and more preferably 3 to 12. The heterocyclic group is preferably a 5-membered or 6-membered heterocyclic group. The heterocyclic group may have a substituent. Examples of the substituent include a halogen atom such as chlorine, fluorine, and bromine, an alkyl group, an alkoxy group, an aryl group, a hydroxy group, an amino group, and a nitro group.

The alkoxy group represented by $R^1$ to $R^7$ preferably has 1 to 20 carbon atoms, more preferably has 1 to 15 carbon atoms, and still more preferably has 1 to 6 carbon atoms. The alkoxy group may be linear or branched. The alkoxy group may have a substituent. Examples of the substituent include a halogen atom, an aryl group, and a nitro group. In addition, there may be a plurality of substituents.

The aryloxy group represented by $R^1$ to $R^7$ preferably has 6 to 20 carbon atoms and more preferably has 6 to 12 carbon atoms. The aryloxy group may have a substituent. Examples of the substituent include a halogen atom, an alkyl group, an alkoxy group, an amino group, and a nitro group. In addition, there may be a plurality of substituents.

In a case where $Z^1$ is —OP(=O)$R^1R^2$, $R^1$ and $R^2$ may be bonded to each other to form a ring. The ring formed by bonding $R^1$ and $R^2$ to each other may be an aromatic ring or a non-aromatic ring.

In addition, in a case where $Z^1$ is —O—SiR$^5$R$^6$R$^7$, $R^5$ and $R^6$ may be bonded to each other to form a ring. The ring formed by bonding these groups to each other may be an aromatic ring or a non-aromatic ring.

In Formula (AL1), $Z^1$ is preferably —OP(=O)$R^1R^2$, —OC(=O)$R^3$, or —OS(=O)$_2R^4$, and from the reason that the generation of foreign matters can be suppressed more effectively, more preferably —OP(=O)$R^1R^2$. In addition, $R^1$ and $R^2$ in —OP(=O)$R^1R^2$ are each independently preferably an alkyl group, an aryl group, an alkoxy group, or an aryloxy group, and more preferably an aryloxy group.

Specific examples of $Z^1$ include groups shown below. In the following, * represents a bonding position with Al in Formula (AL1).

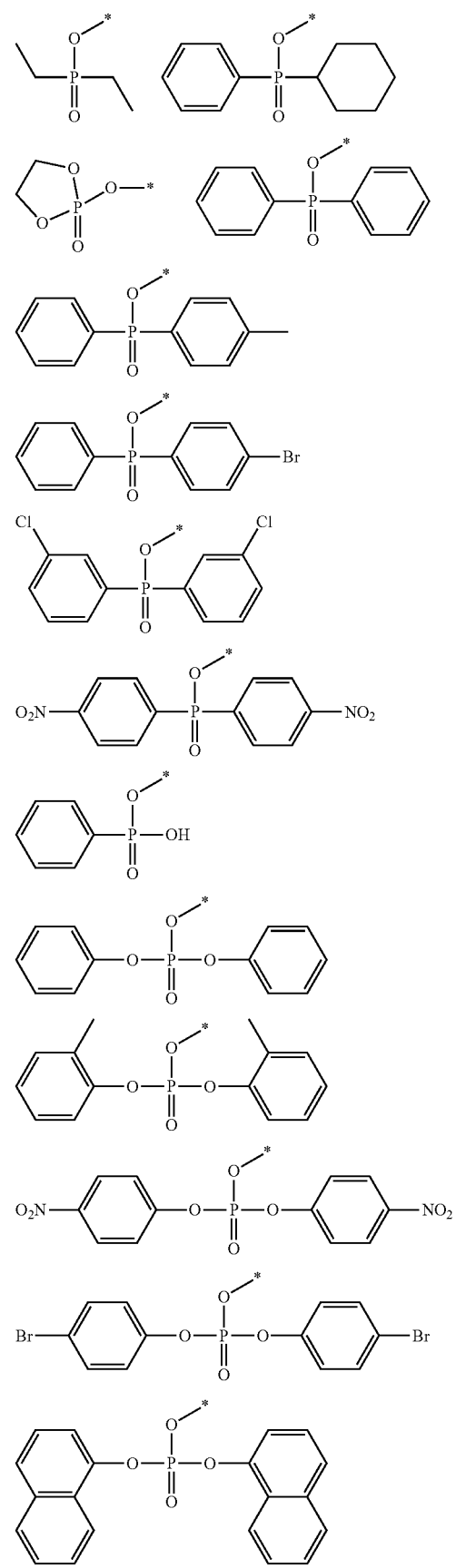

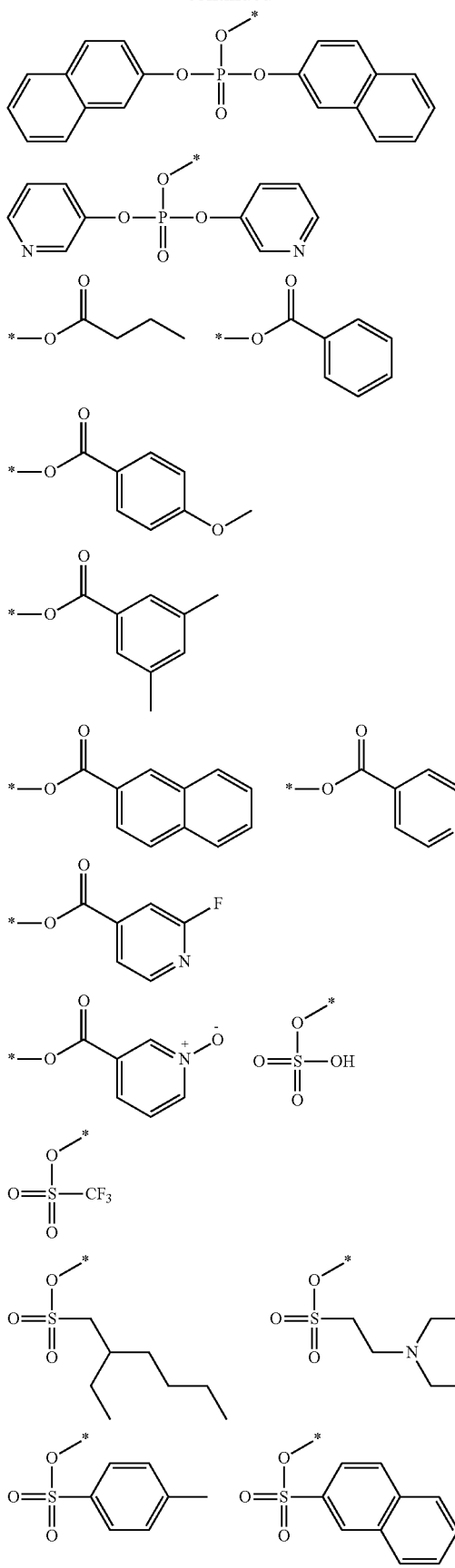

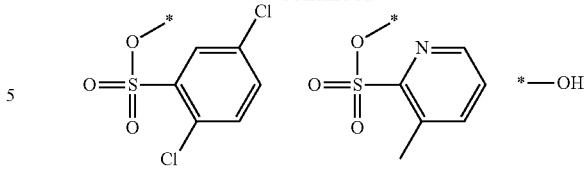

Among these, from the reason that the generation of foreign matters can be suppressed more effectively, $Z^1$ is particularly preferably a group represented by the following formula.

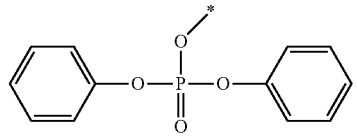 [SMILES: *OP(=O)(Oc1ccccc1)Oc1ccccc1]

Next, Formula (AL2) will be described.

In Formula (AL2), examples of the halogen atom represented by $X^2$ and $X^3$ include a fluorine atom, a chlorine atom, a bromine atom, and an iodine atom, and a chlorine atom or a bromine atom is preferable, and a bromine atom is more preferable.

In Formula (AL2), n2 represents an integer of 0 to 16, and is preferably an integer of 0 to 8, more preferably an integer of 0 to 4, and still more preferably 0. In Formula (AL2), n3 represents an integer of 0 to 16, and is preferably an integer of 0 to 8, more preferably an integer of 0 to 4, and still more preferably 0.

In Formula (AL2), $Z^2$ represents —O—SiR$^{11}$R$^{12}$—O—, —O—SiR$^{13}$R$^{14}$—O—SiR$^{15}$R$^{16}$—O—, or —O—P(=O)R$^{17}$—O—, where $R^{11}$ to $R^{17}$ each independently represent a hydrogen atom, a hydroxy group, an alkyl group, an aryl group, a heterocyclic group, an alkoxy group, or an aryloxy group.

Examples of the alkyl group, aryl group, heterocyclic group, alkoxy group, or aryloxy group represented by $R^{11}$ to $R^{17}$ include the groups described in the section of $R^1$ to $R^7$, and the preferred ranges are also the same.

In Formula (AL2), $Z^2$ is preferably —O—P(=O)R$^{17}$—O—. In addition, $R^{17}$ is preferably an alkyl group, an aryl group, an alkoxy group, or an aryloxy group, and more preferably an aryl group.

Specific examples of the aluminum phthalocyanine pigment include aluminum phthalocyanine pigments described in Examples described later, and Color Index (C. I.) Pigment Green 62 and 63. In addition, specific examples of the aluminum phthalocyanine pigment include phthalocyanine pigments PCY-1 to PCY-42 described in paragraph Nos. 0151 to 0195 of JP2018-105959A, and phthalocyanine pigments P-1 to P-35, PC-1 to PC-12, and PCY-1 to PCY-20 described in paragraph Nos. 0193 to 0202 of WO2016/125806A, the contents of which are incorporated herein by reference.

The content of the aluminum phthalocyanine pigment in the colored pixel A is preferably 5 to 70 mass %. The upper limit is preferably 65 mass % or less and more preferably 60 mass % or less. The lower limit is preferably 10 mass % or more and more preferably 15 mass % or more. The aluminum phthalocyanine pigment may be used singly or in combination of two or more kinds thereof. In a case where two or more kinds thereof are used in combination, the total amount thereof is preferably within the above-described range.

(Other Colorants)

The colored pixel A can further contain a colorant other than the aluminum phthalocyanine pigment (hereinafter, also referred to as other colorants). Examples of the other colorants include chromatic colorants such as a red colorant, a green colorant, a blue colorant, a yellow colorant, a violet colorant, and an orange colorant. The other colorants may be either a pigment or a dye. The pigment and the dye may be used in combination. In addition, the pigment may be either an inorganic pigment or an organic pigment. In addition, as the pigment, a material in which a part of an inorganic pigment or an organic-inorganic pigment is replaced with an organic chromophore can also be used. By substituting an inorganic pigment or an organic-inorganic pigment with an organic chromophore, hue design can be easily performed.

The volume average primary particle diameter of the pigment is preferably 1 to 200 nm. The lower limit is preferably 5 nm or more and more preferably 10 nm or more. The upper limit is preferably 180 nm or less, more preferably 150 μm or less, and still more preferably 100 nm or less. The volume average primary particle diameter of the pigment is a value measured according to the method in Examples described later.

Examples of the pigment include the following pigments:

Color Index (C. I.) Pigment Yellow 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, 214, 215, 228, 231, 232 (methine-based), 233 (quinoline-based), and the like (all of which are yellow pigments);

C. I. Pigment Orange 2, 5, 13, 16, 17:1, 31, 34, 36, 38, 43, 46, 48, 49, 51, 52, 55, 59, 60, 61, 62, 64, 71, 73, and the like (all of which are orange pigments);

C. I. Pigment Red 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 122, 123, 144, 146, 149, 150, 155, 166, 168, 169, 170, 171, 172, 175, 176, 177, 178, 179, 184, 185, 187, 188, 190, 200, 202, 206, 207, 208, 209, 210, 216, 220, 224, 226, 242, 246, 254, 255, 264, 270, 272, 279, 294 (xanthene-based, Organo Ultramarine, Bluish Red), 295 (monoazo-based), 296 (diazo-based), and the like (all of which are red pigments);

C. I. Pigment Green 7, 10, 36, 37, 58, 59, and the like (all of which are green pigments);

C. I. Pigment Violet 1, 19, 23, 27, 32, 37, 42, 60 (triarylmethane-based), 61 (xanthene-based), and the like (all of which are violet pigments); and C. I. Pigment Blue 1, 2, 15, 15:1, 15:2, 15:3, 15:4, 15:6, 16, 22, 29, 60, 64, 66, 79, 80, 87 (monoazo-based), 88 (methine-based), and the like (all of which are blue pigments).

In addition, a halogenated zinc phthalocyanine pigment having an average number of halogen atoms in one molecule of 10 to 14, an average number of bromine atoms in one molecule of 8 to 12, and an average number of chlorine atoms in one molecule of 2 to 5 can also be used as the green colorant. Specific examples thereof include the compounds described in WO2015/118720A. In addition, as the green colorant, a compound described in CN2010-6909027A, a phthalocyanine compound described in JP2019-008014A, a phthalocyanine compound described in JP2018-180023A, a compound described in JP2019-038958A, and the like can also be used.

In addition, as the yellow colorant, compounds described in JP2017-201003A, compounds described in JP2017-197719A, compounds described in paragraph Nos. 0011 to 0062 and 0137 to 0276 of JP2017-171912A, compounds described in paragraph Nos. 0010 to 0062 and 0138 to 0295 of JP2017-171913A, compounds described in paragraph Nos. 0011 to 0062 and 0139 to 0190 of JP2017-171914A, compounds described in paragraph Nos. 0010 to 0065 and 0142 to 0222 of JP2017-171915A, quinophthalone compounds described in paragraph Nos. 0011 to 0034 of JP2013-054339A, quinophthalone compounds described in paragraph Nos. 0013 to 0058 of JP201.4-026228A, isoindoline compounds described JP2018-062644A, quinophthalone compounds described in JP2018-203798A, quinophthalone compounds described in JP2018-062578A, quinophthalone compounds described in JP6432077B, quinophthalone compounds described in JP6432076B, quinophthalone compounds described in JP2018-155881A, quinophthalone compounds described in JP2018-111757A, quinophthalone compounds described in JP2018-040835A, quinophthalone compounds described in JP2017-197640A, quinophthalone compounds described in JP2016-145282A, quinophthalone compounds described in JP2014-085565A, quinophthalone compounds described in JP2014-021139A, quinophthalone compounds described in JP2013-209614A$_2$ quinophthalone compounds described in JP2013-209435A, quinophthalone compounds described in JP2013-181015A, quinophthalone compounds described in JP2013-061622A, quinophthalone compounds described in JP2013-054339A, quinophthalone compounds described in JP2013-032486A, quinophthalone compounds described in JP2012-226110A, quinophthalone compounds described in JP2008-074987A, quinophthalone compounds described in JP2008-081565A, quinophthalone compounds described in JP2008-074986A, quinophthalone compounds described in JP2008-074985A, quinophthalone compounds described in JP2008-050420A, quinophthalone compounds described in JP2008-031281A, quinophthalone compounds described in JP1973-032765A (JP-S48-032765A), quinophthalone compounds described in JP2019-008014A, a compound represented by Formula (QP1), and a compound represented by Formula (QP2) can also be used.

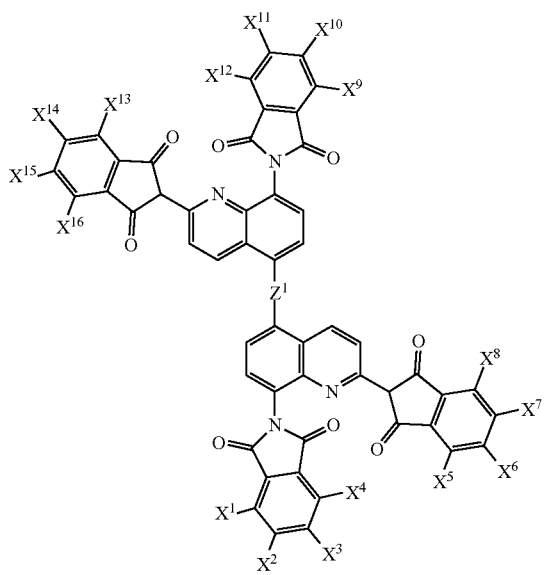

(QP1)

In Formula (QP1), $X^1$ to $X^{16}$ each independently represent a hydrogen atom or a halogen atom, and $Z^1$ represents an alkylene group having 1 to 3 carbon atoms. Specific examples of the compound represented by Formula (QP1) include compounds described in paragraph No. 0016 of JP6443711B.

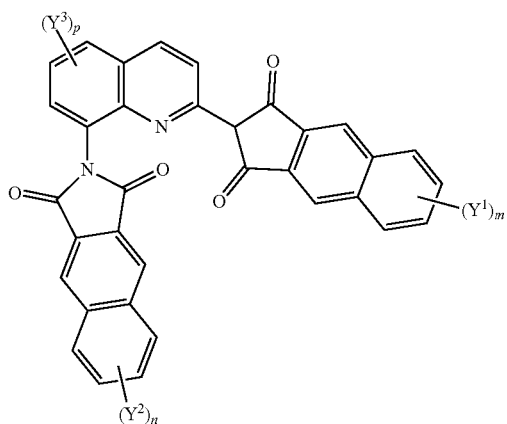

(QP2)

In Formula (QP2), $Y^1$ to $Y^3$ each independently represent a halogen atom. N and m represent an integer of 0 to 6, and p represents an integer of 0 to 5. (n+m) is 1 or more. Specific examples of the compound represented by Formula (QP2) include compounds described in paragraph Nos. 0047 and 0048 of JP6432077B.

As the red colorant, diketopyrrolopyrrole compounds described in JP2017-201384A, in which the structure has at least one substituted bromine atom, diketopyrrolopyrrole compounds described in paragraph Nos. 0016 to 0022 of JP6248838B, diketopyrrolopyrrole compounds described in WO2012/102399A, diketopyrrolopyrrole compounds described in WO2012/117965A, naphtholazo compounds described in JP2012-229344, red colorants described in JP6516119B, red colorant described in JP6525101B, and the like can also be used. In addition, as the red pigment, a compound having a structure that an aromatic ring group in which a group bonded with an oxygen atom, a sulfur atom, or a nitrogen atom is introduced to an aromatic ring is bonded to a diketopyrrolopyrrole skeleton can be used.

A dye can also be used as the other colorants. The dye is not particularly limited and a known dye can be used. Examples thereof include a pyrazoleazo-based dye, an anilinoazo-based dye, a triarylmethane-based dye, an anthraquinone-based dye, an anthrapyridone-based dye, a benzylidene-based dye, an oxonol-based dye, a pyrazolotriazoleazo-based dye, a pyridoneazo-based dye, a cyanine-based dye, a phenothiazine-based dye, a pyrrolopyrazoleazomethine-based dye, a xanthene-based dye, a phthalocyanine-based dye, a benzopyran-based dye, an indigo-based dye, and a pyrromethene-based dye. In addition, thiazole compounds described in JP2012-158649A, azo compounds described in JP2011-184493A, or azo compounds described in JP2011-145540A can also be preferably used. In addition, as yellow dyes, the quinophthalone compounds described in paragraph Nos. 0011 to 0034 of JP2013-054339A, or the quinophthalone compounds described in paragraph Nos. 0013 to 0058 of JP2014-026228A can be used.

A coloring agent multimer can also be used as the other colorants. The coloring agent multimer is preferably a dye which is used after being dissolved in a solvent. In addition, the coloring agent multimer may form a particle. In a case where the coloring agent multimer is a particle, the coloring agent multimer is usually used in a state of being dispersed in a solvent. The coloring agent multimer in the particle state can be obtained by, for example, emulsion polymerization, and specific examples thereof include the compounds and production methods described in JP2015-214682A. The coloring agent multimer has two or more coloring agent structures in one molecule, and preferably has three or more coloring agent structures in one molecule. The upper limit is particularly not limited, but may be 100 or less. A plurality of coloring agent structures included in one molecule may be the same coloring agent structure or different coloring agent structures. The weight-average molecular weight (Mw) of the coloring agent multimer is preferably 2000 to 50000. The lower limit is more preferably 3000 or more and still more preferably 6000 or more. The upper limit is more preferably 30000 or less and still more preferably 20000 or less. As the coloring agent multimer, the compounds described in JP2011-213925A, JP2013-041097A, JP2015-028144A, JP2015-030742A, WO2016/031442A, or the like can also be used.

The total content of the aluminum phthalocyanine pigment and the other colorants in the colored pixel A is preferably 25 to 80 mass %. The upper limit is preferably 75 mass % or less and more preferably 70 mass % or less. The lower limit is preferably 30 mass % or more and more preferably 40 mass % or more. In addition, the proportion of the aluminum phthalocyanine pigment in the total of 100 parts by mass of the aluminum phthalocyanine pigment and the other colorants is preferably 50 parts by mass or more, more preferably 60 parts by mass or more, and still more preferably 70 parts by mass or more. In addition, the content of the other colorants in the colored pixel A is preferably 50 mass % or less, more preferably 40 mass % or less, and still more preferably 30 mass % or less. The other colorants may be used singly or in combination of two or more kinds thereof. In a case where two or more kinds thereof are used in combination, the total amount thereof is preferably within the above-described range.

(Pigment Derivative)

The colored pixel A can contain a pigment derivative. Examples of the pigment derivative include a compound having a structure in which a part of a chromophore is substituted with an acid group or a basic group. Examples of the chromophore constituting the pigment derivative include a quinoline skeleton, a benzimidazolone skeleton, a diketopyrrolopyrrole skeleton, an azo skeleton, a phthalocyanine skeleton, an anthraquinone skeleton, a quinacridone skeleton, a dioxazine skeleton, a perinone skeleton, a perylene skeleton, a thioindigo skeleton, an isoindoline skeleton, an isoindolinone skeleton, a quinophthalone skeleton, a threne skeleton, and a metal complex skeleton. Among these, a quinoline skeleton, a benzimidazolone skeleton, a diketopyrrolopyrrole skeleton, an azo skeleton, a quinophthalone skeleton, an isoindoline skeleton, or a phthalocyanine skeleton is preferable, and an azo skeleton or a benzimidazolone skeleton is more preferable. Examples of the acid group include a sulfo group, a carboxyl group, a phosphoric acid group, and a salt thereof. Examples of an atom or atomic group constituting the salts include alkali metal ions ($Li^+$, $Na^+$, $K^+$, and the like), alkaline earth metal ions ($Ca^{2+}$, $Mg^{2+}$, and the like), an ammonium ion, an imidazolium ion, a pyridinium ion, and a phosphonium ion. Examples of the basic group include an amino group, a pyridinyl group, or a salt thereof, a salt of an ammonium group, and a phthalimidomethyl group. Examples of an atom or atomic group constituting the salts include a hydroxide ion, a halogen ion, a carboxylate ion, a sulfonate ion, and a phenoxide ion.

The colored pixel A preferably includes a phthalocyanine pigment derivative. As the phthalocyanine pigment derivative, a compound represented by Formula (PC-1) is preferable.

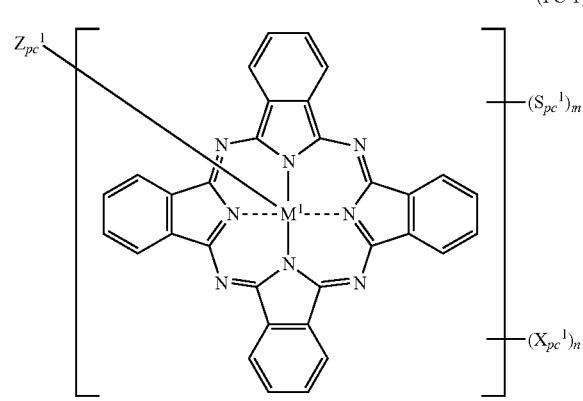

(PC-1)

In Formula (PC-1), $X_{pc}^1$ represents a halogen atom.

$M^1$ represents Al, Ga, In, Si, or Sn.

$Z_{pc}^1$ represents a hydroxy group, $-OP(=O)R_{pc}^1R_{pc}^2$, $-OC(=O)R_{pc}^3$, $-OS(=O)_2R_{pc}^4$, or $-O-SiR_{pc}^5R_{pc}^6R_{pc}^7$, where $R_{pc}^1$ and $R_{pc}^2$ each independently represent a hydroxy group, an alkyl group, an aryl group, a heterocyclic group, an alkoxy group, or an aryloxy group, $R_{pc}^1$ and $R_{pc}^2$ may be bonded to each other to form a ring, $R_{pc}^3$ to $R_{pc}^7$ each independently represent a hydrogen atom, a hydroxy group, an alkyl group, an aryl group, a heterocyclic group, an alkoxy group, or an aryloxy group, and $R_{pc}^5$ and $R_{pc}^6$ may be bonded to each other to form a ring.

$S_{pc}^1$ represents a sulfa group or a salt thereof.

n represents an integer of 0 to 15, m represents an integer of 1 to 16, and n±m is an integer of 1 to 16.

With regard to details of Formula (PC-1), reference can be made to the description in paragraph Nos. 0057 to 0076 of JP2018-091916A, the contents of which are incorporated herein by reference. In addition, specific examples of the compound represented by Formula (PC-1) include compounds described in paragraph Nos. 0189 to 0195 of JP2018-091916A.

In the present invention, as the pigment derivative, a pigment derivative having excellent visible transparency (hereinafter, also referred to as a transparent pigment derivative) can be contained. The maximum value (εmax) of the molar absorption coefficient of the transparent pigment derivative in a wavelength region of 400 to 700 nm is preferably 3000 $L \cdot mol^{-1} \cdot cm^{-1}$ or less, more preferably 1000 $L \cdot mol^{-1} \cdot cm^{-1}$ or less, and still more preferably 100 $L \cdot mol^{-1} \cdot cm^{-1}$ or less. The lower limit of εmax is, for example, 1 $L \cdot mol^{-1} \cdot cm^{-1}$ or more and may be 10 $L \cdot mol^{-1} \cdot cm^{-1}$ or more.

Specific examples of the pigment derivative include compounds described in JP1981-118462A (JP-S56-118462A), JP1988-264674A (JP-S63-264674A), JP1989-217077A (JP-H01-217077A), JP1991-009961A (JP-H03-009961A), JP1991-026767A (JP-H03-026767A), JP1991-153780A (JP-H03-153780A), JP1991-045662A (JP-H03-045662A), JP1992-285669A (JP-H04-285669A), JP1994-145546A (JP-H06-145546A), JP1994-212088A (JP-H06-212088A), JP1994-240158A (JP-H06-240158A), JP1998-030063A (JP-H10-030063A), JP1998-195326A (JP-H10-195326A), paragraph Nos. 0086 to 0098 of WO2011/024896A, paragraph Nos. 0063 to 0094 of WO2012/102399A, paragraph No. 0082 of WO2017/038252A, paragraph No. 0171 of JP2015-151530A, paragraph Nos. 0162 to 0183 of JP2011-252065A, JP2003-081972A, JP5299151B, JP2015-172732A, JP2014-199308A, JP2014-085562A, JP2014-035351A, JP2008-081565A, and JP2019-109512A.

The content of the pigment derivative is preferably 1 to 30 parts by mass and still more preferably 3 to 20 parts by mass with respect to 100 parts by mass of the aluminum phthalocyanine pigment. The pigment derivative may be used singly or in combination of two or more kinds thereof. In a case where two or more kinds thereof are used in combination, the total amount thereof is preferably within the above-described range.

(Resin)

The colored pixel A preferably contains a resin. Examples of the resin include a (meth)acrylic resin, a (meth)acrylamide resin, an epoxy resin, an ene-thiol resin, a polycarbonate resin, a polyether resin, a polyarylate resin, a polysulfone resin, a polyethersulfone resin, a polyphenylene resin, a polyarylene ether phosphine oxide resin, a polyimide resin, a polyimide resin, a polyolefin resin, a cyclic olefin resin, a polyester resin, a styrene resin, a siloxane resin, a polyimide resin, and a polyurethane resin.

The weight-average molecular weight (Mw) of the resin is preferably 2000 to 2000000. The upper limit is preferably 1000000 or less and more preferably 500000 or less. The lower limit is preferably 3000 or more, more preferably 4000 or more, and still more preferably 5000 or more.

As the resin, it is preferable to use a resin having an acid group. Examples of the acid group include a carboxyl group, a phosphoric acid group, a sulfa group, and a phenolic hydroxy group, and a carboxyl group is preferable. The resin having an acid group can be used, for example, as an alkali-soluble resin.

The resin having an acid group preferably includes a repeating unit having an acid group in the side chain, and more preferably includes 5 to 70 mol % of repeating units having an acid group in the side chain with respect to the total repeating units of the resin. The upper limit of the content of the repeating unit having an acid group in the side chain is preferably 50% by mole or less and more preferably 30% by mole or less. The lower limit of the content of the repeating unit having an acid group in the side chain is preferably 10% by mole or more and more preferably 20% by mole or more.

It is also preferable that the resin having an acid group includes a repeating unit derived from a monomer component including a compound represented by Formula (ED1) and/or a compound represented by Formula (ED2) (hereinafter, these compounds may be referred to as an "ether dimer").

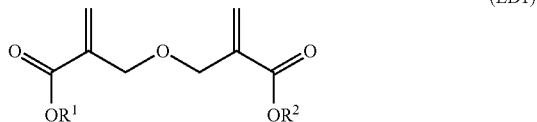

(ED1)

In Formula (ED1), $R^1$ and $R^2$ each independently represent a hydrogen atom or a hydrocarbon group having 1 to 25 carbon atoms, which may have a substituent.

(ED2)

In Formula (ED2), R represents a hydrogen atom or an organic group having 1 to 30 carbon atoms. With regard to details of Formula (ED2), reference can be made to the description in JP2010-168539A, the contents of which are incorporated herein by reference.

With regard to the specific examples of the ether dimer, reference can be made to the description in paragraph No. 0317 of JP2013-029760A, the contents of which are incorporated herein by reference.

With regard to the resin having an acid group, reference can be made to the description in paragraph Nos. 0558 to 0571 of JP2012-208494A (paragraph Nos. 0685 to 0700 of the corresponding US2012/0235099A), the description in paragraph Nos. 0076 to 0099 of JP2012-198408A, and the description of JP2018-105911A, the contents of which are incorporated herein by reference.

The acid value of the resin having an acid group is preferably 30 to 500 mgKOH/g. The lower limit is preferably 50 mgKOH/g or more and more preferably 70 mgKOH/g or more. The upper limit is preferably 400 mgKOH/g or less, more preferably 300 mgKOH/g or less, and still more preferably 200 mgKOH/g or less.

As the resin, a resin having a maleimide structure can also be used. In the present specification, the maleimide structure is a structure derived from a maleimide compound. Examples of the maleimide compound include maleimide and N-substituted maleimide. Examples of the N-substituted maleimide include cyclohexylmaleimide, phenylmaleimide, methylmaleimide, ethylmaleimide, n-butylmaleimide, and laurylmaleimide.

The resin having a maleimide structure is preferably a resin including a repeating unit having a maleimide structure. The maleimide structure may be included in the main chain of the repeating unit, or in the side chain of the repeating unit.

As the resin, it is also preferable to contain a resin i (hereinafter, also referred to as a resin i) including a repeating unit (hereinafter, also referred to as a repeating unit i1-1) derived from a compound represented by Formula (I). The content of the repeating unit i1-1 in total repeating units of the resin i is preferably 5 mol % or more, more preferably 10 mol % or more, and still more preferably 15 mol % or more.

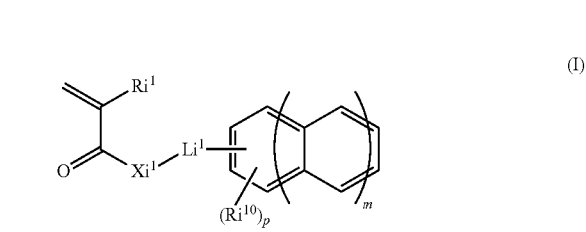

(I)

In the formula, $Xi^1$ represents O or NH, and O is preferable.

$Ri^1$ represents a hydrogen atom or a methyl group.

$Li^1$ represents a divalent linking group. Examples of the divalent linking group include a hydrocarbon group, a heterocyclic group, —NH—, —SO—, —SO$_2$—, —CO—, —O—, —COO—, —OCO—, —S—, and a group formed by a combination of two or more of these groups. Examples of the hydrocarbon group include an alkyl group and an aryl group. The heterocyclic group may be a non-aromatic heterocyclic group or an aromatic heterocyclic group. The heterocyclic group is preferably a 5-membered ring or a 6-membered ring. Examples of the kind of the heteroatom constituting the heterocyclic group include a nitrogen atom, an oxygen atom, and a sulfur atom. The number of heteroatoms constituting the heterocyclic group is preferably 1 to 3. The heterocyclic group may be a single ring or a fused ring. The hydrocarbon group and heterocyclic group may have a substituent. Examples of the substituent include an alkyl group, an aryl group, a hydroxy group, and a halogen atom.

$Ri^{10}$ represents a substituent. Examples of the substituent represented by include the substituent Ti shown below, and the substituent represented by $Ri^{10}$ is preferably a hydrocarbon group and more preferably an alkyl group which may have an aryl group as a substituent.

m represents an integer of 0 to 2, and is preferably 0 or 1 and more preferably 0.

p represents an integer of 0 or more, preferably 0 to 4, more preferably 0 to 3, still more preferably 0 to 2, even more preferably 0 or 1, and particularly preferably 1.

(Substituent Ti)

Examples of a substituent Ti include a halogen atom, a cyano group, a nitro group, a hydrocarbon group, a heterocyclic group, —ORti$^1$, —CORti$^1$, —COORti$^1$, —OCORti$^1$, —NRti$^1$Rti$^2$, —NHCORti$^1$, —CONRti$^1$Rti$^2$, —NHCONRti$^1$Rti$^2$, —NHCOORti$^1$, —SRti$^1$, —SO$_2$Rti$^1$, —SO$_2$ORti$^1$, —NHSO$_2$Rti$^1$, and —SO$_2$NRti$^1$Rti$^2$. Rti$^1$ and Rti$^2$ each independently represent a hydrogen atom, a hydrocarbon group, or a heterocyclic group. Rti$^1$ and Rti$^2$ may be bonded to each other to form a ring.

Examples of the halogen atom include a fluorine atom, a chlorine atom, a bromine atom, and an iodine atom.

Examples of the hydrocarbon group include an alkyl group, an alkenyl group, an alkynyl group, and an aryl group. The number of carbon atoms in the alkyl group is preferably 1 to 30, more preferably 1 to 15, and still more preferably 1 to 8. The alkyl group may be linear, branched, or cyclic, and is preferably linear or branched and more preferably branched.

The number of carbon atoms in the alkenyl group is preferably 2 to 30, more preferably 2 to 12, and particularly preferably 2 to 8. The alkenyl group may be linear, branched, or cyclic, and is preferably linear or branched.

The number of carbon atoms of the alkynyl group is preferably 2 to 30 and more preferably 2 to 25. The alkynyl group may be linear, branched, or cyclic, and is preferably linear or branched.

The number of carbon atoms in the aryl group is preferably 6 to 30, more preferably 6 to 20, and still more preferably 6 to 12.

The heterocyclic group may be a single ring or a fused ring. The heterocyclic group is preferably a single ring or a fused ring having 2 to 4 fused numbers. The number of heteroatoms constituting a ring of the heterocyclic group is preferably 1 to 3. The heteroatom constituting the ring of the heterocyclic group is preferably a nitrogen atom, an oxygen atom, or a sulfur atom. The number of carbon atoms constituting the ring of the heterocyclic group is preferably 3 to 30, more preferably 3 to 18, and more preferably 3 to 12.

The hydrocarbon group and the heterocyclic group may have a substituent or may be unsubstituted. Examples of the substituent include the substituents described in the substituent Ti.

The compound represented by Formula (I) is preferably a compound represented by Formula (III).

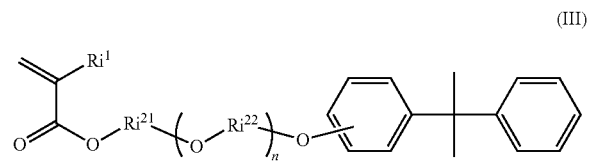

(III)

In the formula, Ri$^1$ represents a hydrogen atom or a methyl group, Ri$^{21}$ and Ri$^{22}$ each independently represent an alkylene group, and n represents an integer of 0 to 15. The number of carbon atoms in the alkylene group represented by Ri$^{21}$ and Ri$^{22}$ is preferably 1 to 10, more preferably 1 to 5, still more preferably 1 to 3, and particularly preferably 2 or 3. n is preferably an integer of 0 or 5, more preferably an integer of 0 to 4, and still more preferably an integer of 0 to 3.

Examples of the compound represented by Formula (I) include ethylene oxide- or propylene oxide-modified (meth)acrylate of para-cumylphenol. Examples of a commercially available product thereof include ARONIX M-110 (manufactured by TOAGOSEI CO., LTD.).

It is preferable that the resin i further includes a repeating unit (hereinafter, also referred to as a repeating unit i1-2) derived from an alkyl (meth)acrylate. In a case where the resin i further has the repeating unit i1-2, the effect of improving solubility of the photosensitive resin composition in a solvent is obtained. The number of carbon atoms in an alkyl moiety of the alkyl (meth)acrylate is preferably 3 to 10, more preferably 3 to 8, and still more preferably 3 to 6. Preferred specific examples of the alkyl (meth)acrylate include n-butyl (meth)acrylate, ethyl (meth)acrylate, and 2-ethylhexyl acrylate. From the reason that it is easy to obtain more excellent solubility in a solvent, n-butyl (meth)acrylate is preferable. The content of the repeating unit i1-2 in total repeating units of the resin i is preferably 5 mol % or more, more preferably 10 mol % or more, and still more preferably 15 mol % or more.

It is also preferable that the resin i further includes a repeating unit having an acid group. According to this aspect, the effect of improving developability of the photosensitive resin composition is obtained. The content of the repeating unit having an acid group in total repeating units of the resin i is preferably 5 mol % or more, more preferably 10 mol % or more, and still more preferably 15 mol % or more. The upper limit is preferably 60 mol % or less and more preferably 50 mol % or less. The resin i including the repeating unit having an acid group is also the alkali-soluble resin.

It is also preferable that the resin i further includes a repeating unit having an ethylenically unsaturated bond-containing group. The content of the repeating unit having an ethylenically unsaturated bond-containing group in total repeating units of the resin i is preferably 5 mol % or more, more preferably 10 mol % or more, and still more preferably 15 mol % or more. The upper limit is preferably 50 mol % or less and more preferably 40 mol % or less.

As the resin, it is also preferable to include a resin (hereinafter, also referred to as a resin Ac) having an aromatic carboxyl group. The resin Ac may include the aromatic carboxyl group in the main chain of the repeating unit, or in the side chain of the repeating unit. From the reason that the effects described above can be easily obtained more remarkably, it is preferable that the aromatic carboxyl group is included in the main chain of the repeating unit. The details are not clear, but it is presumed that the presence of the aromatic carboxyl group near the main chain further improves these properties. In the present specification, the aromatic carboxyl group is a group having a structure in which one or more carboxyl groups are bonded to an aromatic ring. In the aromatic carboxyl group, the number of carboxyl groups bonded to an aromatic ring is preferably 1 to 4 and more preferably 1 or 2.

The resin Ac is preferably a resin including at least one repeating unit selected from a repeating unit represented by Formula (b-1) or a repeating unit represented by Formula (b-10).

In Formula (b-1), Ar$^1$ represents a group including an aromatic carboxyl group, L$^1$ represents —COO— or —CONH—, and L$^2$ represents a divalent linking group.

In Formula (b-10), Ar$^1$ represents a group including an aromatic carboxyl group, L$^1$ represents —COO— or —CONH—, $L^{12}$ represents a trivalent linking group, and $P^{10}$ represents a polymer chain.

In Formula (b-1), examples of the group including an aromatic carboxyl group, represented by $Ar^1$, include a structure derived from an aromatic tricarboxylic acid anhydride and a structure derived from an aromatic tetracarboxylic acid anhydride. Examples of the aromatic tricarboxylic acid anhydride and the aromatic tetracarboxylic acid anhydride include compounds having the following structures.

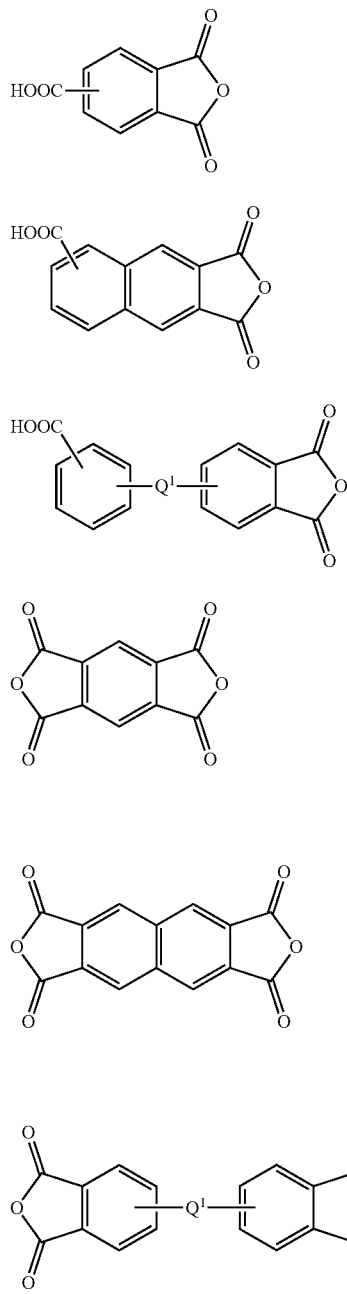

(Ac-1)
(Ac-2)
(Ac-3)
(Ac-4)
(Ac-5)
(Ac-6)

In the formulae, $Q^1$ represents a single bond, —O—, —CO—, —COOCH$_2$CH$_2$OCO—, —SO$_2$—, —C(CF$_3$)$_2$—, a group represented by Formula (Q-1), or a group represented by Formula (Q-2).

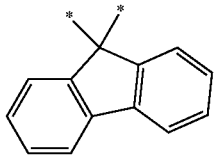

(Q-1)

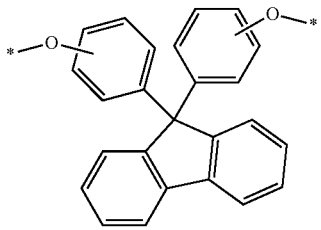

(Q-2)

Specific examples of the group including an aromatic carboxyl group represented by $Ar^1$ include a group represented by Formula (Ar-1), a group represented by Formula (Ar-2), and a group represented by Formula (Ar-3).

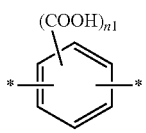

(Ar-1)

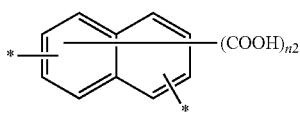

(Ar-2)

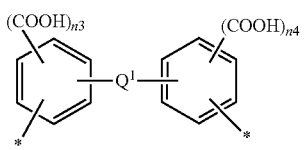

(Ar-3)

In Formula (Ar-1), n1 represents an integer of 1 to 4, and is preferably 1 or 2 and more preferably 2.

In Formula (Ar-2), n2 represents an integer of 1 to 8, and is preferably an integer of 1 or 4, more preferably 1 or 2, and still more preferably 2.

In Formula (Ar-3), n3 and n4 each independently represent an integer of 0 to 4, and are preferably an integer of 0 or 2, more preferably 1 or 2, and still more preferably 1. However, at least one of n3 or n4 is an integer of 1 or more.

In Formula (Ar-3), $Q^1$ represents a single bond, —O—, —CO—, —COOCH$_2$CH$_2$OCO—, —SO$_2$—, —C(CF$_3$)$_2$—, the above-described group represented by Formula (Q-1), or the above-described group represented by Formula (Q-2).

In Formula (b-1), $L^1$ represents —COO— or —CONH—, preferably —COO—.

In Formula (b-1), examples of the divalent linking group represented by $L^2$ include an alkylene group, an arylene group, —O—, —CO—, —COO—, —OCO—, —NH—, —S—, and a group formed by a combination of two or more of these groups. The number of carbon atoms in the alkylene group preferably is 1 to 30, more preferably 1 to 20, and still more preferably 1 to 15. The alkylene group may be linear, branched, or cyclic. The number of carbon atoms in the arylene group is preferably 6 to 30, more preferably 6 to 20, and still more preferably 6 to 10. The alkylene group and the arylene group may have a substituent. Examples of the substituent include a hydroxy group. The divalent linking group represented by $L^2$ is preferably a group represented by —O-$L^{2a}$-O—. Examples of $L^{2a}$ include an alkylene group; an arylene group; a group formed by a combination of an alkylene group and an arylene group; and a group formed by a combination of at least one selected from an alkylene group or an arylene group, and at least one selected from —O—, —CO—, —COO—, —OCO—, —NH—, or —S—. The number of carbon atoms in the alkylene group preferably is 1 to 30, more preferably 1 to 20, and still more preferably 1 to 15. The alkylene group may be linear, branched, or cyclic. The alkylene group and the arylene group may have a substituent. Examples of the substituent include a hydroxy group.

In Formula (b-10), the group including an aromatic carboxyl group, represented by $Ar^{10}$, has the same meaning as $Ar^1$ in Formula (b-1), and the preferred range is also the same.

In Formula (b-10), $L^{11}$ represents —COO— or —CONH—, preferably —COO—.

In Formula (b-10), examples of the trivalent linking group represented by $L^{12}$ include a hydrocarbon group, —O—, —CO—, —COO—, —OCO—, —NH—, —S—, and a group formed by a combination of two or more of these groups. Examples of the hydrocarbon group include an aliphatic hydrocarbon group and an aromatic hydrocarbon group. The number of carbon atoms in the aliphatic hydrocarbon group is preferably 1 to 30, more preferably 1 to 20, and still more preferably 1 to 15. The aliphatic hydrocarbon group may be linear, branched, or cyclic. The number of carbon atoms in the aromatic hydrocarbon group is preferably 6 to 30, more preferably 6 to 20, and still more preferably 6 to 10. The hydrocarbon group may have a substituent. Examples of the substituent include a hydroxy group.

In Formula (b-10), $P^{10}$ represents a polymer chain. It is preferable that the polymer chain represented by $P^{10}$ has at least one repeating unit selected from a poly(meth)acrylic repeating unit, a polyether repeating unit, a polyester repeating unit, or a polyol repeating unit. The weight-average molecular weight of the polymer chain $P^{10}$ is preferably 500 to 20000. The lower limit is preferably 1000 or more. The upper limit is preferably 10000 or less, more preferably 5000 or less, and still more preferably 3000 or less. In a case where the weight-average molecular weight of $P^{10}$ is within the above-described range, dispersibility of the pigment in the composition is good. In a case where the resin having an aromatic carboxyl group is a resin having the repeating unit represented by Formula (b-10), this resin is preferably used as a dispersant.

As the resin, it is also preferable to use a resin (hereinafter, also referred to as a resin OP) having a structure represented by Formula (OP1). This resin is preferably used as a dispersant.

(OP1)

In the formula, $Rp^4$ represents a polyether residue and/or polyester residue having a number-average molecular weight of 400 to 30000 and having an ethylenically unsaturated bond-containing group, and y represents a number of 1 or 2.

The number-average molecular weight of $Rp^4$ is more preferably 400 to 10000, and still more preferably 400 to 3000. In a case where the number-average molecular weight of $Rp^4$ is within the above-described range, the dispersibility of the pigment is good, and such a resin is preferably used as a dispersant.

Examples of the polyether residue and/or polyester residue having an ethylenically unsaturated bond-containing group represented by $Rp^4$ include a polyether residue and/or polyester residue having a styrene group, a (meth)acryloyl group, a cyanoacryloyl group, a vinyl ether group, or the like.

$Rp^4$ is preferably a group represented by Formula (Rp-1).

In the formula, $Rp^{12}$ represents an alkylene group, $Rp^{13}$ represents a trihydric or higher polyhydric alcohol residue, $Rp^{14}$ represents a (meth)acryloyl group or a cyanoacryloyl group, and s represents a number of 2 or more.

$Rp^{12}$ is preferably an alkylene group having 8 or less carbon atoms. In addition, from the viewpoint of pigment dispersibility, s is still more preferably 2 to 5, and particularly preferably 2.

Examples of the trihydric or higher polyhydric alcohol represented by $Rp^{13}$ include glycerin, propyl alcohol, pentaerythritol, and dipentaerythritol. In particular, a trihydric to hexahydric alcohol is preferable.

As the resin OP, a phosphoric acid ester having a single type of $Rp^4$ may be used, or a plurality of types of phosphoric acid esters consisting of different $Rp^4$ may be used. In addition, the resin OP may be only a resin in which y in Formula (OP1) is 1, or may be a mixture of a resin in which y in Formula (OP1) is 1 and a resin in which y in Formula (OP1) is 2. In addition, in a case where $Rp^4$ of the compound represented by Formula (OP1) is a polycaprolactone residue having a number-average molecular weight of 400 to 10000 (more preferably, 400 to 3000), the pigment dispersibility is improved, which is preferable.

As the resin, it is preferable to include a resin as a dispersant. Examples of the dispersant include an acidic dispersant (acidic resin) and a basic dispersant (basic resin). Here, the acidic dispersant (acidic resin) represents a resin in which the amount of the acid group is larger than the amount of the basic group. The acidic dispersant (acidic resin) is preferably a resin in which the amount of the acid group is 70 mol % or more in a case where the total amount of the acid group and the basic group is 100 mol %. The acid group included in the acidic dispersant (acidic resin) is preferably a carboxyl group. The acid value of the acidic dispersant (acidic resin) is preferably 10 to 105 mgKOH/g. In addition, the basic dispersant (basic resin) represents a resin in which the amount of the basic group is larger than the amount of the acid group. The basic dispersant (basic resin) is preferably a resin in which the amount of the basic group is more than 50 mol % in a case where the total amount of the acid group and the basic group is 100 mol %. The basic group included in the basic dispersant is preferably an amino group.

It is also preferable that the resin used as a dispersant is a graft resin. With regard to details of the graft resin, reference can be made to the description in paragraph Nos. 002.5 to 0094 of JP201.2-255128A, the contents of which are incorporated herein by reference.

It is also preferable that the resin used as a dispersant is a polyimine-based dispersant including a nitrogen atom in at least one of the main chain or the side chain. As the polyimine-based dispersant, a resin having a main chain which has a partial structure having a functional group of pKa 14 or less, and a side chain which has 40 to 10000 atoms, in which at least one of the main chain or the side chain has a basic nitrogen atom, is preferable. The basic nitrogen atom is not particularly limited as long as it is a nitrogen atom exhibiting basicity. With regard to the polyimine-based dispersant, reference can be made to the description in paragraph Nos. 0102 to 0166 of JP2012-255128A, the contents of which are incorporated herein by reference.

It is also preferable that the resin used as a dispersant is a resin having a structure in which a plurality of polymer chains are bonded to a core portion. Examples of such a resin include dendrimers (including star polymers). In addition, specific examples of the dendrimer include polymer compounds C-1 to C-31 described in paragraph Nos. 0196 to 0209 of JP2013-043962A.

It is also preferable that the resin used as a dispersant are a resin including a repeating unit having an ethylenically unsaturated bond-containing group in the side chain. The content of the repeating unit having an ethylenically unsaturated bond-containing group in the side chain is preferably 10 mol % or more, more preferably 10 to 80 mol %, and still more preferably 20 to 70 mol % with respect to the total repeating units of the resin. In addition, as the dispersant, a resin described in JP2018-087939A can also be used.

A commercially available product is also available as the dispersant, and specific examples thereof include DISPERBYK series manufactured by BYK Chemie Japan, Solsperse series manufactured by Lubrizol Japan Ltd., Efka series manufactured by BASF, and AJISPER series manufactured by Ajinomoto Fine-Techno Co., Inc. In addition, products described in paragraph No. 0129 of JP2012-137564A and products described in paragraph No. 0235 of JP2017-194662A can also be used as the dispersant.

The content of the resin in the colored pixel A is preferably 10 to 50 mass %. The upper limit is preferably 40 mass % or less and more preferably 30 mass % or less. The lower limit is preferably 15 mass % or more and more preferably 20 mass % or more. The resin may be used singly or in combination of two or more kinds thereof. In a case where two or more kinds thereof are used in combination, the total amount thereof is preferably within the above-described range.

(Other Components)

The colored pixel A may further include materials included in a composition for forming a pixel described later, such as a curable compound, an ultraviolet absorber, and a surfactant, a cured substance derived from these materials, or the like. The colored pixel A can be formed of a composition for forming a pixel, which will be described later.

<<Ultraviolet Absorbing Layer>>
(Yellow Colorant and Ultraviolet Absorber)

The ultraviolet absorbing layer preferably includes at least one selected from a yellow colorant and an ultraviolet absorber. In a case where the ultraviolet absorbing layer includes a yellow colorant and an ultraviolet absorber, respectively, the effect of the present invention is further enhanced, and the function as a yellow colored layer can also be imparted to the ultraviolet absorbing layer, so that it is possible to reduce the concentration of the yellow colorant in the composition for forming a pixel, which is used for forming the colored pixel A, and by that amount, the effect of increasing the concentration of photolithography components (photopolymerization initiator, polymerizable compound, and the like). Therefore, the effect of improving the resolution of the colored pixel A can be expected. In a case where the ultraviolet absorbing layer includes a yellow colorant and does not include an ultraviolet absorber, the effect of the present invention is further enhanced, and the function as a yellow colored layer can also be imparted to the ultraviolet absorbing layer, so that it is possible to reduce the concentration of the yellow colorant in the composition for forming a pixel, which is used for forming the colored pixel A, and by that amount, the effect of increasing the concentration of photolithography components (photopolymerization initiator, polymerizable compound, and the like). Therefore, the effect of improving the resolution of the colored pixel A can be expected. In a case where the ultraviolet absorbing layer includes an ultraviolet absorber and does not include a yellow colorant, the thickness of the ultraviolet absorbing layer can be made thinner.

The yellow colorant used in the ultraviolet absorbing layer may be either a pigment or a dye, but from the reason that it is easy to obtain better light resistance and foreign matter suppressing effect, a pigment is preferable.

The yellow colorant is preferably at least one selected from an azo compound or an isoindoline compound, more preferably an azo compound, and still more preferably an azo compound having a barbituric acid structure.

The yellow colorant preferably has a maximal absorption wavelength in a wavelength range of 450 to 500 nm and more preferably has a maximal absorption wavelength in a wavelength range of 450 to 460 nm.

Specific examples of the yellow colorant include the yellow colorants described in the section of other colorants of the above-described colored pixel A, and at least one selected from C. I. Pigment Yellow 138, C. I. Pigment Yellow 139, C. I. Pigment Yellow 150, C. I. Pigment Yellow 185, C. I. Pigment Yellow 231, or C. I. Pigment Yellow 233 is preferable, at least one selected from C. I. Pigment Yellow 139, C. I. Pigment Yellow 150, C. I. Pigment Yellow 185, C. I. Pigment Yellow 231, or C. I. Pigment Yellow 233 is more preferable, and at least one selected from C. I. Pigment Yellow 139, C. I. Pigment Yellow 185, C. I. Pigment Yellow 231, or C. I. Pigment Yellow 233 is still more preferable.

The ultraviolet absorber used in the ultraviolet absorbing layer is preferably a compound having a maximal absorption wavelength in a wavelength range of 300 to 380 nm and more preferably a compound having a maximal absorption wavelength in a wavelength range of 320 to 380 nm. In addition, the molar absorption coefficient of the ultraviolet absorber at a wavelength of 365 nm is preferably 5000 $L \cdot mol^{-1} \cdot cm^{-1}$ or more, more preferably 10000 $L \cdot mol^{-1} \cdot cm^{-1}$ or more, and still more preferably 30000 $L \cdot mol^{-1} \cdot cm^{-1}$ or more. The upper limit is preferably, for example, 100000 $L \cdot mol^{-1} \cdot cm^{-1}$ or less.

Examples of the ultraviolet absorber include a conjugated diene compound, a methyldibenzoyl compound, a triazine compound, a benzotriazole compound, a benzophenone compound, a salicylate compound, a coumarin compound, an acrylonitrile compound, a benzodithiazole compound, a cinnamic acid compound, $\alpha$-$\beta$ unsaturated ketone, and a carbostyryl compound, and from the reason that the effect of the present invention can be easily obtained more remarkably, a triazine compound, a benzotriazole compound, or a benzophenone compound is preferable.

The conjugated diene compound is preferably a compound represented by Formula (UV-1).

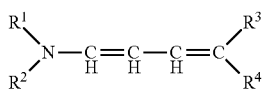
(UV-1)

In Formula (UV-1), $R^1$ and $R^2$ each independently represent a hydrogen atom, an alkyl group having 1 to 20 carbon atoms, or an aryl group having 6 to 20 carbon atoms, and $R^1$ and $R^2$ may be the same or different from each other. However, at least one of $R^1$ or $R^2$ is an alkyl group having 1 to 20 carbon atoms or an aryl group having 6 to 20 carbon atoms. $R^1$ and $R^2$ may form a cyclic amino group together with a nitrogen atom to which $R^1$ and $R^2$ are bonded. Examples of the cyclic amino group include a piperidino group, a morpholino group, a pyrrolidino group, a hexahydroazepino group, and a piperazino group. $R^1$ and $R^2$ each independently preferably an alkyl group having 1 to 20 carbon atoms, more preferably an alkyl group having 1 to 10 carbon atoms, and still more preferably an alkyl group having 1 to 5 carbon atoms.

In Formula (UV-1), $R^3$ and $R^4$ each independently represent an electron withdrawing group. $R^3$ and $R^4$ are each independently preferably an acyl group, a carbamoyl group, an alkyloxycarbonyl group, an aryloxycarbonyl group, a cyano group, a nitro group, an alkylsulfonyl group, an arylsulfonyl group, a sulfonyloxy group, or a sulfamoyl group, and more preferably an acyl group, a carbamoyl group, an alkyloxycarbonyl group, an aryloxycarbonyl group, a cyano group, an alkylsulfonyl group, an arylsulfonyl group, a sulfonyloxy group, or a sulfamoyl group. In addition, $R^3$ and $R^4$ may be bonded to each other to form a cyclic electron withdrawing group. Examples of the cyclic electron withdrawing group formed by bonding $R^3$ and $R^4$ to each other include a 6-membered ring including two carbonyl groups.

At least one of $R^1$, $R^2$, $R^3$, or $R^4$ in Formula (UV-1) may be in a form of a polymer derived from a monomer bonded to a vinyl group through a linking group. It may be a copolymer with another monomer.

The description of the substituent of the ultraviolet absorber represented by Formula (UV-1) can be found in paragraph Nos. 0024 to 0033 of JP2009-265642A, the content of which is incorporated herein by reference. Specific examples of the ultraviolet absorber represented by Formula (UV-1) include compounds having the following structures and compounds described in paragraph Nos. 0034 to 0036 of JP2009-265642A. In addition, examples of a commercially available product of the ultraviolet absorber represented by Formula (UV-1) include UV-503 (manufactured by Daito Chemical Co., Ltd.).

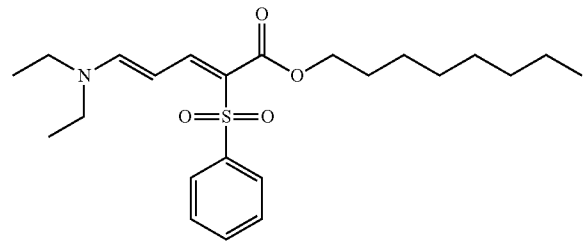 [SMILES: CCCCCCCCOC(=O)/C(=C/C=C/N(CC)CC)S(=O)(=O)c1ccccc1]

The methyldibenzoyl compound is preferably a compound represented by Formula (UV-2).

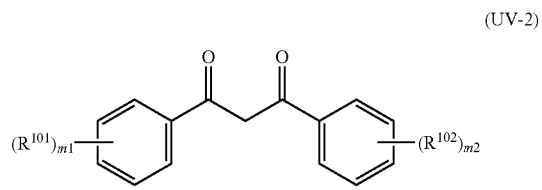
(UV-2)

In Formula (UV-2), $R^{101}$ and $R^{102}$ each independently represent a substituent, and m1 and m2 each independently represent 0 to 4.

Examples of the substituent represented by $R^{101}$ and $R^{102}$ include a halogen atom, a cyano group, a nitro group, an alkyl group, an aryl group, a heteroaryl group, an alkoxy group, an aryloxy group, a heteroaryloxy group, an alkylthio group, an arylthio group, a heteroarylthio group, $-NR^{U1}R^{U2}$, $-COR^{U3}$, $-COOR^{U4}$, $-OCOR^{U5}$, $-NHCOR^{U6}$, $-CONR^{U7}R^{U8}$, $-NHCONR^{U9}R^{U10}$, $-NHCOOR^{U11}$, $-SO_2R^{U12}$, $-SO_2OR^{U13}$, $-NHSO_2R^{U14}$, and $-SO_2NR^{U15}R^{U16}$. $R^{U1}$ to $R^{U16}$ each independently represent a hydrogen atom, an alkyl group having 1 to 8 carbon atoms, or an aryl group.

It is preferable that the substituents represented by $R^{101}$ and $R^{102}$ are each independently an alkyl group or an alkoxy group. The number of carbon atoms in the alkyl group is preferably 1 to 20 and more preferably 1 to 10. Examples of the alkyl group include a linear alkyl group, a branched alkyl group, and a cyclic alkyl group, and a linear alkyl group or a branched alkyl group is preferable and a branched alkyl group is more preferable. The number of carbon atoms in the alkoxy group is preferably 1 to 20 and more preferably 1 to 10. The alkoxy group is preferably linear or branched, and more preferably branched.

In Formula (UV-2), a combination in which one of $R^{101}$ or $R^{102}$ is an alkyl group and the other is an alkoxy group is preferable.

m1 and m2 each independently represent 0 to 4. m1 and m2 are each independently preferably 0 to 2, more preferably 0 or 1, and particularly preferably 1.

Specific examples of the compound represented by Formula (UV-2) include avobenzone.

The triazine compound is preferably a compound represented by Formula (UV-3-1), (UV-3-2), or (UV-3-3).

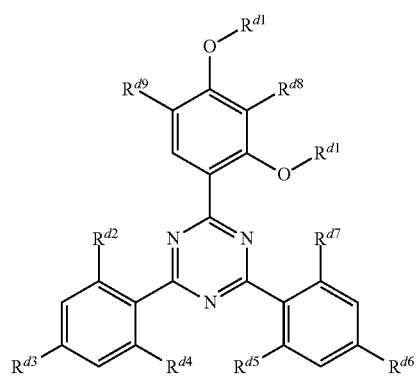
(UV-3-1)

-continued (UV-3-2)

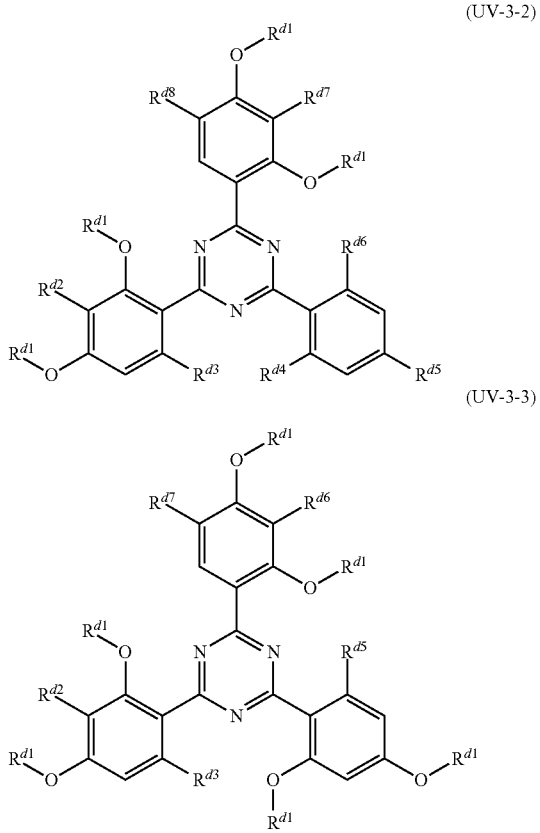

(UV-3-3)

In the formulae, $R^{d1}$'s independently represent a hydrogen atom, an alkyl group having 1 to 15 carbon atoms, an alkenyl group having 3 to 8 carbon atoms, an aryl group having 6 to 18 carbon atoms, an alkylaryl group having 7 to 18 carbon atoms, or an arylalkyl group having 7 to 18 carbon atoms. The alkyl group, alkenyl group, aryl group, alkylaryl group, and arylalkyl group may have a substituent. Examples of the substituent include the groups described in the substituent Ti.

In the formulae, $R^{d2}$ to $R^{d9}$ independently represent a hydrogen atom, a halogen atom, a hydroxy group, an alkyl group having 1 to 15 carbon atoms, an alkenyl group having 3 to 8 carbon atoms, an aryl group having 6 to 18 carbon atoms, an alkylaryl group having 7 to 18 carbon atoms, or an arylalkyl group having 7 to 18 carbon atoms. The alkyl group, alkenyl group, aryl group, alkylaryl group, and arylalkyl group may have a substituent. Examples of the substituent include the groups described in the substituent Ti.

Specific examples of the triazine compound include mono(hydroxyphenyl)triazine compounds such as 2-[4-[(2-hydroxy-3-dodecyloxypropyl)oxy]-2-hydroxyphenyl]-4,6-bis(2,4-dimethylphenyl)-1, 3,5-triazine, 2-[4-[(2-hydroxy-3-tridecyloxypropypl)oxy]-2-hydroxyphenyl]-4,6-bis(2,4-dimethylphenyl)-1, 3,5-triazine, and 2-(2,4-dihydroxyphenyl)-4,6-bis(2,4-dimethylphenyl)-1,3,5-triazine, bis(hydroxyphenyl)triazine compounds such as 2,4-bis(2-hydroxy-4-propyloxyphenyl)-6-(2,4-dimethylphenyl)-1,3,5-triazine, 2,4-bis(2-hydroxy-3-methyl-)4-propyloxyphenyl)-6-(4-methylphenyl)-1,3,5-triazine, and 2,4-bis(2-hydroxy-3-methyl-4-hexyloxyphenyl)-6-(2,4-dimethylphenyl)-1,3,5-triazine; and, tris(hydroxyphenyl)triazine compounds such as 2,4-bis(2-hydroxy-4-butoxyphenyl)-6-(2,4-dibutoxyphenyl)-1,3,5-triazine, 2,4,6-tris(2-hydroxy-4-octyloxyphenyl)-1,3,5-triazine, and 2,4,6-tris[2-hydroxy-4-(3-butoxy-2-hydroxypropyloxy)phenyl]-1,3,5-triazine.

Examples of a commercially available product of the triazine compound include TINUVIN 400, TINUVIN 405, TINUVIN 460, TINUVIN 477, and TINUVIN 479 (all of which are manufactured by BASF).

The benzotriazole compound is preferably a compound represented by Formula (UV-4).

(UV-4)

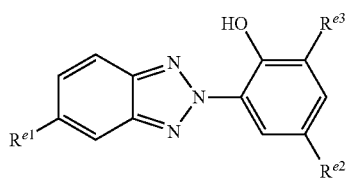

In the formula, $R^{e1}$ to $R^{e3}$ each independently represent a hydrogen atom, a halogen atom, a hydroxy group, an alkyl group having 1 to 9 carbon atoms, an alkoxy group having 1 to 9 carbon atoms, an alkylaryl group having 7 to 18 carbon atoms, or an arylalkyl group having 7 to 18 carbon atoms. The alkyl group, alkylaryl group, and arylalkyl group may have a substituent. Examples of the substituent include the groups described in the substituent Ti, and an alkoxycarbonyl group having 1 to 9 carbon atoms is preferable.

Specific examples of the benzotriazole compound include 2-(2'-hydroxy-3',5'-di-tert-butylphenyl)-5-chlorobenzotriazole, 2-(2'-hydroxy-3'-tert-butyl-5'-methylphenyl)-5-chlorobenzotriazole, 2-(2'-hydroxy-3'-tert-amyl-5'-isobutylphenyl)-5-chlorobenzotriazole, 2-(2'-hydroxy-3'-isobutyl-5'-methylphenyl)-5-chlorobenzotriazole, 2-(2'-hydroxy-3'-isobutyl-5'-propylphenyl)-5-chlorobenzotriazole, 2-(2'-hydroxy-3',5'-di-tert-butylphenyl)benzotriazole, 2-(2'-hydroxy-5'-methylphenyl)benzotriazole, 2-[2'-hydroxy-5'-(1,1,3,3-tetramethyl)phenyl]benzotriazole, 2-(2-hydroxy-5-tert-butylphenyl)-2H-benzotriazole, 3-(2H-benzotriazol-2-yl)-5-(1,1-dimethylethyl)-4-hydroxy, 2-(2H-benzotriazol-2-yl)-4,6-bis(1-methyl-1-phenylethyl)phenol, and 2-(2H-benzotriazol-2-yl)-6-(1-methyl-1-phenylethyl)-4-(1,1,3,3-tetramethylbutyl)phenol. Examples of a commercially available product thereof include TINUVIN PS, TINUVIN 99-2, TINUVIN 109, TINUVIN 326, TINUVIN 328, TINUVIN 384-2, TINUVIN 900, TINUVIN 928, TINUVIN 171, and TINUVIN 1130 (all of which are manufactured by BASF), and ADK STAB LA-31RG (manufactured by ADEKA Corporation). As the benzotriazole compound, MYUA series manufactured by Miyoshi Oil & Fat Co., Ltd. may be used.

Examples of the benzophenone compound include 2,2'-dihydroxy-4-methoxybenzophenone, 2,2'-dihydroxy-4,4'-dimethoxybenzophenone, 2,2',4,4'-tetrahydroxybenzophenone, 2-hydroxy-4-methoxybenzophenone, 2,4-dihydroxybenzophenone, and 2-hydroxy-4-octoxybenzophenone. Examples of a commercially available product of the benzophenone compound include Uvinul A, Uvinul 3049, and Uvinul 3050 (all of which are manufactured by BASF), and Sumisorb 130 (manufactured by Sumika Chemtex Co., Ltd.).

Examples of the salicylate compound include phenyl salicylate, p-octylphenyl salicylate, and p-t-butylphenyl salicylate.

Examples of the coumarin compound include coumarin-4,4-hydroxycoumarin, and 7-hydroxycoumarin.

Examples of the acrylonitrile compound include ethyl 2-cyano-3,3-diphenylacrylate and 2-ethylhexyl 2-cyano-3,3-diphenylacrylate.

The total content of the yellow colorant and the ultraviolet absorber in the ultraviolet absorbing layer is preferably 10 to 80 mass %. The upper limit is preferably 75 mass % or less and more preferably 70 mass % or less. The lower limit is preferably 30 mass % or more and more preferably 40 mass % or more. In addition, in a case where the ultraviolet absorbing layer includes the yellow colorant and the ultraviolet absorber, the mass ratio of the yellow colorant and the ultraviolet absorber is preferably yellow colorant:ultraviolet absorber=20:80~80:20, more preferably 40:60 to 60:40, and still more preferably 60:40 to 80:20. The ultraviolet absorber and yellow colorant may be used singly or in combination of two or more kinds thereof. In a case of using two or more kinds thereof, the total amount thereof is preferably within the above-described range.

(Colorant Other than Yellow Colorant)

The ultraviolet absorbing layer preferably includes substantially no colorant other than the yellow colorant. According to this aspect, the generation of foreign matters can be effectively suppressed without affecting the hue of the colored pixel A of the color filter. The case where the ultraviolet absorbing layer includes substantially no colorant other than the yellow colorant means that the content of colorants other than the yellow colorant is 1 part by mass or less with respect to 100 parts by mass of the yellow colorant, preferably 0.5 parts by mass or less, more preferably 0.1 parts by mass or less, and particularly preferably 0 parts by mass.

(Resin)

The ultraviolet absorbing layer preferably contains a resin. Examples of the resin include the resins described in the section of the resin of the colored pixel A. The content of the resin in the ultraviolet absorbing layer is preferably 5 to 40 mass %. The upper limit is preferably 30 mass % or less and more preferably 25 mass % or less. The lower limit is preferably 7 mass % or more and more preferably 10 mass % or more. The resin may be used singly or in combination of two or more kinds thereof. In a case of using two or more kinds thereof, the total amount thereof is preferably within the above-described range.

(Other Components)

The ultraviolet absorbing layer may further include materials included in a composition for forming a pixel described later, such as a curable compound and a surfactant, a cured substance derived from these materials, or the like. The ultraviolet absorbing layer can be formed of a composition for forming an ultraviolet absorbing layer, which will be described later.

<Composition for Forming Pixel>

Next, a composition (composition for forming a pixel) which can be preferably used for forming the colored pixel A in the color filter will be described.

(Aluminum Phthalocyanine Pigment)

The composition for forming a pixel preferably includes an aluminum phthalocyanine pigment. The preferred aspect of the aluminum phthalocyanine pigment is as described above. The content of the aluminum phthalocyanine pigment in the total solid content of the composition for forming a pixel is preferably 5 to 70 mass %. The upper limit is preferably 65 mass % or less and more preferably 60 mass % or less. The lower limit is preferably 10 mass % or more and more preferably 15 mass % or more. The aluminum phthalocyanine pigment may be used singly or in combination of two or more kinds thereof. In a case where two or more kinds thereof are used in combination, the total amount thereof is preferably within the above-described range.

(Other Colorants)

The composition for forming a pixel can further contain a colorant other than the aluminum phthalocyanine pigment (hereinafter, also referred to as other colorants). Examples of the other colorants include those described above. The total content of the aluminum phthalocyanine pigment and other colorants in the total solid content of the composition for forming a pixel is preferably 25 to 80 mass %. The upper limit is preferably 75 mass % or less and more preferably 70 mass % or less. The lower limit is preferably 30 mass % or more and more preferably 40 mass % or more. In addition, the proportion of the aluminum phthalocyanine pigment in the total of 100 parts by mass of the aluminum phthalocyanine pigment and the other colorants is preferably 50 parts by mass or more, more preferably 60 parts by mass or more, and still more preferably 70 parts by mass or more. In addition, the content of the other colorants in the total solid content of the composition for forming a pixel is preferably 50 mass % or less, more preferably 40 mass % or less, and still more preferably 30 mass % or less. The other colorants may be used singly or in combination of two or more kinds thereof. In a case where two or more kinds thereof are used in combination, the total amount thereof is preferably within the above-described range.

(Pigment Derivative)

The composition for forming a pixel can contain a pigment derivative. Examples of the pigment derivative include those described above. The content of the pigment derivative is preferably 1 to 30 parts by mass and still more preferably 3 to 20 parts by mass with respect to 100 parts by mass of the aluminum phthalocyanine pigment. The pigment derivative may be used singly or in combination of two or more kinds thereof. In a case where two or more kinds thereof are used in combination, the total amount thereof is preferably within the above-described range.

(Resin)

The composition for forming a pixel can contain a resin. The resin is blended in, for example, an application for dispersing particles such as a pigment in a composition or an application as a binder. Mainly, a resin which is used for dispersing particles such as a pigment is also referred to as a dispersant. However, such applications of the resin are only exemplary, and the resin can also be used for other purposes in addition to such applications. Examples of the resin include those described above. The content of the resin in the total solid content of the composition for forming a pixel is preferably 10 to 50 mass %. The upper limit is preferably 40 mass % or less and more preferably 30 mass % or less. The lower limit is preferably 15 mass % or more and more preferably 20 mass % or more. The resin may be used singly or in combination of two or more kinds thereof. In a case where two or more kinds thereof are used in combination, the total amount thereof is preferably within the above-described range.

(Curable Compound)

The composition for forming a pixel preferably further includes a curable compound. According to this aspect, the light resistance and the like of the color filter can be improved more effectively. As the curable compound, a known compound which is cross-linkable by a radical, an acid, or heat can be used. Examples of the curable compound include a compound having an ethylenically unsaturated bonding group and a compound having an epoxy group, and a compound having an ethylenically unsaturated bonding group is preferable. Examples of the ethylenically unsaturated bonding group include a vinyl group, a (meth)allyl group, and a (meth)acryloyl group. The compound having an ethylenically unsaturated bonding group is preferably a polymerizable compound, and more preferably a radically polymerizable compound.

In a case where the composition for forming a pixel contains a curable compound, the content of the curable compound in the total solid content of the composition for forming a pixel is preferably 1 to 60 mass %. The lower limit is, for example, more preferably 5 mass % or more and still more preferably 10 mass % or more. The upper limit is, for example, preferably 50 mass % or less and still more preferably 40 mass % or less. The curable compound may be used singly or in combination of two or more kinds thereof. In a case where two or more kinds thereof are used in combination, the total amount thereof is preferably within the above-described range.

Any chemical forms of a monomer, a prepolymer, an oligomer, or the like may be used as the compound having an ethylenically unsaturated bonding group, but a monomer is preferable. The molecular weight of the compound having an ethylenically unsaturated bonding group is preferably 100 to 3000. The upper limit is more preferably 2000 or less and still more preferably 1500 or less. The lower limit is more preferably 150 or more and still more preferably 250 or more.

The compound having an ethylenically unsaturated bonding group is preferably a compound including 3 or more ethylenically unsaturated bonding groups, more preferably a compound including 3 to 15 ethylenically unsaturated bonding groups, and still more preferably a compound having 3 to 6 ethylenically unsaturated bonding groups. In addition, the compound having an ethylenically unsaturated bonding group is preferably a trifunctional to pentadecafunctional (meth)acrylate compound and more preferably a trifunctional to hexafunctional (meth)acrylate compound. Specific examples of the compound having an ethylenically unsaturated bonding group include the compounds described in paragraph Nos. 0095 to 0108 of JP2009-288705A, paragraph No. 0227 of JP2013-029760A, paragraph Nos. 0254 to 0257 of JP2008-292970A, paragraph Nos. 0034 to 0038 of W2013-253224A, paragraph No. 0477 of JP2012-208494A, JP2017-048367A, JP6057891B, JP6031807B, and JP2017-194662A, the contents of which are incorporated herein by reference.

As the compound having an ethylenically unsaturated bonding group, dipentaerythritol triacrylate (as a commercially available product, KAYARAD D-330 manufactured by Nippon Kayaku Co., Ltd.), dipentaerythritol tetraacrylate (as a commercially available product, KAYARAD D-320 manufactured by Nippon Kayaku. Co., Ltd.), dipentaerythritol penta(meth)acrylate (as a commercially available product, KAYARAD D-310 manufactured by Nippon Kayaku Co., Ltd.), dipentaerythritol hexa(meth)acrylate (as a commercially available product, KAYARAD DPHA manufactured by Nippon Kayaku Co., Ltd., NK ESTER A-DPH-12E manufactured by Shin-Nakamura Chemical Co., Ltd.), or a compound having a structure in which these (meth)acryloyl groups are bonded through an ethylene glycol and/or a propylene glycol residue (for example, SR454 and SR499 which are commercially available products from Sartomer) is preferable. An oligomer type of these compounds can be used. In addition, as the compound having an ethylenically unsaturated bonding group, NK ESTER A-TMMT (manufactured by Shin-Nakamura Chemical Co., Ltd.) and KAYARAD RP-1040 and DPCA-20 (manufactured by Nippon Kayaku Co., Ltd.) can also be used. In addition, as the compound having an ethylenically unsaturated bonding group, it is also preferable to use a trifunctional (meth) acrylate compound such as trimethylolpropane tri(meth) acrylate, trimethylolpropane propyleneoxide-modified tri (meth)acrylate, trimethylolpropane ethyleneoxide-modified tri(meth)acrylate, isocyanuric acid ethyleneoxide-modified tri(meth)acrylate, and pentaerythritol tri(meth)acrylate. Examples of a commercially available product of the trifunctional (meth)acrylate compound include ARONIX M-309, M-310, M-321, M-350, M-360, M-313, M-315, M-306, M-305, M-303, M-452, and M-450 (manufactured by TOAGOSEI CO., LTD.), NK ESTER A9300, A-GLY-9E, A-GLY-20E, A-TMM-3, A-TMM-3L, A-TMM-3LM-N, A-TMPT, and TMPT (manufactured by Shin-Nakamura Chemical Co., Ltd), and KAYARAD GPO-303, TMPTA, THE-330, TPA-330, and PET-30 (manufactured by Nippon Kayaku Co., Ltd).

As the compound having an ethylenically unsaturated bonding group, a compound having an acid group can also be used. Examples of the acid group include a carboxyl group, a sulfo group, and a phosphoric acid group, and a carboxyl group is preferable. Examples of a commercially available product of the compound having an acid group include ARONIX M-510, M-520, and ARONIX TO-2349 (manufactured by TOAGOSEI CO., LTD). In a case where the compound having an ethylenically unsaturated bonding group further has an acid group, the acid value of the compound having an ethylenically unsaturated bonding group is preferably 0.1 to 40 mgKOH/g and more preferably 5 to 30 mgKOH/g.

The compound having an ethylenically unsaturated bonding group is also preferably a compound having a caprolactone structure. Examples of the compound having a caprolactone structure include DPCA-20, DPCA-30, DPCA-60, and DPCA-120, each of which is commercially available as KAYARAD DPCA series from Nippon Kayaku Co., Ltd.

As the compound having an ethylenically unsaturated bonding group, a compound having an ethylenically unsaturated bonding group and an alkyleneoxy group can also be used. The compound having an ethylenically unsaturated bonding group and an alkyleneoxy group is preferably a compound having an ethylenically unsaturated bonding group and an ethyleneoxy group and/or a propyleneoxy group, more preferably a compound having an ethylenically unsaturated bonding group and an ethyleneoxy group, and still more preferably a trifunctional to hexafunctional (meth) acrylate compound having 4 to 20 ethyleneoxy groups. Examples of a commercially available product of the compound having an ethylenically unsaturated bonding group and an alkyleneoxy group include SR-494 manufactured by Sartomer, which is a tetrafunctional (meth)acrylate having four ethyleneoxy groups, and KAYARAD TPA-330 manufactured by Nippon Kayaku Co., Ltd., which is a trifunctional (meth)acrylate having three isobutyleneoxy groups.

The urethane acrylates described in JP1973-041708B (JP-S48-041708B), JP1976-037193A (JP-S51-037193A), JP1990-032293B (JP-H02-032293B), or JP1990-016765B (JP-H02-016765B), or the urethane compounds having an ethylene oxide skeleton described in JP1983-049860B (JP-S58-049860B), JP1981-017654B (JP-S56-017654B), JP1987-039417B (JP-S62-039417B), or JP1987-039418B (JP-S62-039418B) are also suitable as the compound having an ethylenically unsaturated bonding group. In addition, the polymerizable compounds having an amino structure or a sulfide structure in the molecule, described in JP1988-

277653A (JP-S63-277653A), JP1988-260909A (JP-S63-260909A), or JP1989-105238A (JP-H01-105238A), are also preferably used. In addition, as the polymerizable compound, commercially available products such as LA-7200 (manufactured by Shin-Nakamura Chemical Co., Ltd.), DPHA-40H (manufactured by Nippon Kayaku Co., Ltd.), and UA-306H, UA-306T, UA-306I, AH-600, T-600, AI-600, and LINC-202UA (manufactured by KYOEISHA CHEMICAL Co., Ltd.) can also be used.

In a case where the composition for forming a pixel contains the compound having an ethylenically unsaturated bonding group as the curable compound, the content of the compound having an ethylenically unsaturated bonding group in the total solid content of the composition for forming a pixel is preferably 1 to 60 mass %. The lower limit is, for example, more preferably 5 mass % or more and still more preferably 10 mass % or more. The upper limit is, for example, preferably 50 mass % or less and still more preferably 40 mass % or less. The compound having an ethylenically unsaturated bonding group may be used singly or in combination of two or more kinds thereof. In a case where two or more kinds thereof are used in combination, the total amount thereof is preferably within the above-described range.

The compound having an epoxy group (hereinafter, also referred to as an epoxy compound) is preferably a compound having 1 to 100 epoxy groups in one molecule. The lower limit of the epoxy group is more preferably 2 or more. The upper limit of the number of epoxy groups may be, for example, 10 or less or 5 or less.

In the epoxy compound, the epoxy equivalent molecular weight of epoxy compound/number of epoxy groups) is preferably 500 g/equivalent or less, more preferably 100 to 400 g/equivalent, and still more preferably 100 to 300 g/equivalent.

The epoxy compound may be a low molecular weight compound (for example, molecular weight: lower than 1000) or a high molecular weight compound (macromolecule; for example, molecular weight: 1000 or higher, and in the case of a polymer, weight-average molecular weight: 1000 or higher). The weight-average molecular weight of the epoxy compound is preferably 200 to 100000 and more preferably 500 to 50000. The upper limit of the weight-average molecular weight is still more preferably 10000 or less, even more preferably 5000 or less, and still even more preferably 3000 or less.

As the epoxy compound, the compounds described in paragraph Nos. 0034 to 0036 of JP2013-011869A, paragraph Nos. 0147 to 0156 of JP2014-043556A, and paragraph Nos. 0085 to 0092 of JP2014-089408A can also be used. The contents of the publications are incorporated herein by reference.

In a case where the composition for forming a pixel contains an epoxy compound as the curable compound, the content of the epoxy compound in the total solid content of the composition for forming a pixel is preferably 1 to 60 mass %. The lower limit is more preferably 2 mass % or more and still more preferably 3 mass % or more. The upper limit is, for example, preferably 50 mass % or less and still more preferably 40 mass % or less. The epoxy compound may be used singly or in combination of two or more kinds thereof. In a case where two or more kinds thereof are used in combination, the total amount thereof is preferably within the above-described range.

(Photopolymerization Initiator)

The composition for forming a pixel preferably includes a photopolymerization initiator. The photopolymerization initiator is not particularly limited, and can be appropriately selected from known photopolymerization initiators. For example, a compound having photosensitivity to light in a range from an ultraviolet ray range to a visible range is preferable. The photopolymerization initiator is preferably a photoradical polymerization initiator.

Examples of the photopolymerization initiator include a halogenated hydrocarbon derivative (for example, a compound having a triazine skeleton or a compound having an oxadiazole skeleton), an acylphosphine compound, a hexaarylbiimidazole, an oxime compound, an organic peroxide, a thio compound, a ketone compound, an aromatic onium salt, an α-hydroxyketone compound, and an α-aminoketone compound. From the viewpoint of exposure sensitivity, as the photopolymerization initiator, a trihalomethyltriazine compound, a benzyldimethylketal compound, an α-hydroxyketone compound, an α-aminoketone compound, an acylphosphine compound, a phosphine oxide compound, a metallocene compound, an oxime compound, a triarylimidazole dimer, an onium compound, a benzothiazole compound, a benzophenone compound, an acetophenone compound, a cyclopentadiene-benzene-iron complex, a halomethyl oxadiazole compound, or a 3-aryl-substituted coumarin compound is preferable, a compound selected from an oxime compound, an α-hydroxyketone compound, an α-aminoketone compound, or an acylphosphine compound is more preferable, and an oxime compound is still more preferable. As the photopolymerization initiator, compounds described in paragraphs 0065 to 0111 of JP2014-130173A or in JP6301489B, peroxide-based photopolymerization initiators described in MATERIAL STAGE, p. 37 to 60, vol. 19, No. 3, 2019, photopolymerization initiators described in WO2018/221177A, photopolymerization initiators described in WO2018/110179A, photopolymerization initiators described in JP2019-043864A, and photopolymerization initiators described in JP2019-044030A, the contents of which are incorporated herein by reference.

Examples of a commercially available product of the α-hydroxyketone compound include Omnirad 184, Omnirad 1173, Omnirad 2959, and Omnirad 127 (all of which are manufactured by IGM Resins B.V.), Irgacure 184, Irgacure 1173, Irgacure 2959, and Irgacure 127 (all of which are manufactured by BASF). Examples of a commercially available product of the α-aminoketone compound include Omnirad 907, Omnirad 369. Omnirad 369E, and Omnirad 379EG (all of which are manufactured by IGM Resins B.V), Irgacure 907, Irgacure 369, Irgacure 369E, and Irgacure 379EG (all of which are manufactured by BASF). Examples of a commercially available product of the acylphosphine compound include Omnirad 819 and Omnirad TPO (both of which are manufactured by IGM Resins B.V.), Irgacure 819 and Irgacure TPO (both of which are manufactured by BASF).

Examples of the oxime compound include the compounds described in JP2001-233842A, the compounds described in JP2000-080068A, the compounds described in JP2006-342166A, the compounds described in J. C. S. Perkin II (1979, pp. 1653-1660), the compounds described in J. C. S. Perkin II (1979, pp. 156-162), the compounds described in Journal of Photopolymer Science and Technology (1995, pp. 202-232), the compounds described in JP2000-066385A, the compounds described in JP2004-534797A, the compounds described in JP2006-342166A, the compounds described in JP2017-019766A, the compounds described in JP6065596B, the compounds described in WO2015/152153A, the compounds described in WO2017/051680A, the compounds described in JP2017-198865A, the compounds described in paragraph Nos. 0025 to 0038 of WO2017/164127A, and the compounds described in WO2013/167515A. Specific examples of the oxime compound include 3-benzoyloxyiminobutane-2-one, 3-acetoxyiminobutane-2-one, 3-propionyloxyiminobutane-2-one, 2-acetoxyiminopentane-3-one, 2-acetoxyimino-1-phenylpropane-1-one, 2-benzoyloxyimino-1-phenylpropane-1-one, 3-(4-toluene sulfonyoxy)iminobutane-2-one, and 2-ethoxycarbonyloxyimino-1-phenylpropane-1-one. Examples of a commercially available product thereof include Irgacure OXE01, Irgacure OXE02, Irgacure OXE03, and Irgacure OXE04 (all of which are manufactured by BASF), TR-PBG-304 (manufactured by TRONLY), and ADEKA OPTOMER N-1919 (manufactured by ADEKA Corporation; photopolymerization initiator 2 described in JP2012-014052A). In addition, as the oxime compound, it is also preferable to use a compound having no colorability or a compound having high transparency and being resistant to discoloration. Examples of a commercially available product include ADEKA ARKLS NCI-730, NCI-831, and NCI-930 (all of which are manufactured by ADEKA Corporation). In addition, with regard to the oxime compound, reference can be made to the description in paragraph Nos. 0091 to 0105 of WO2019/039172A, the contents of which are incorporated herein by reference.

An oxime compound having a fluorine atom can also be used as the polymerization initiator. Specific examples of the oxime compound having a fluorine atom include the compounds described in JP2010-262028A, the compounds 24, and 36 to 40 described in JP2014-500852A, and the compound (C-3) described in JP2013-164471A.

As the photopolymerization initiator, an oxime compound in which a substituent having a hydroxy group is bonded to a carbazole skeleton can also be used. Examples of such a photopolymerization initiator include compounds described in WO2019/088055A.

Specific examples of the oxime compound which are preferably used in the present invention are shown below, but the present invention is not limited thereto.

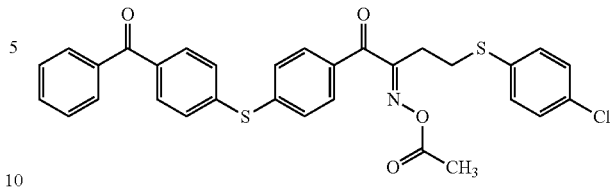

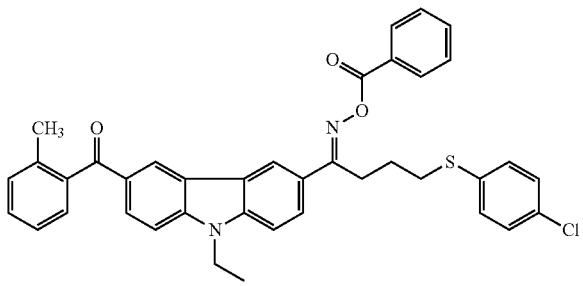

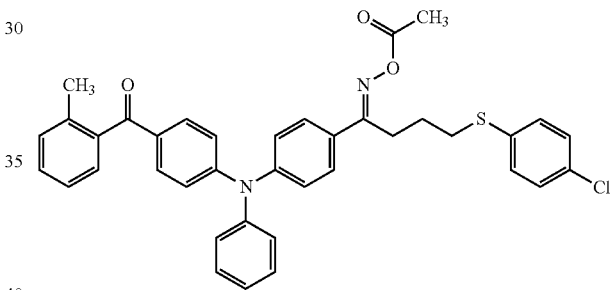

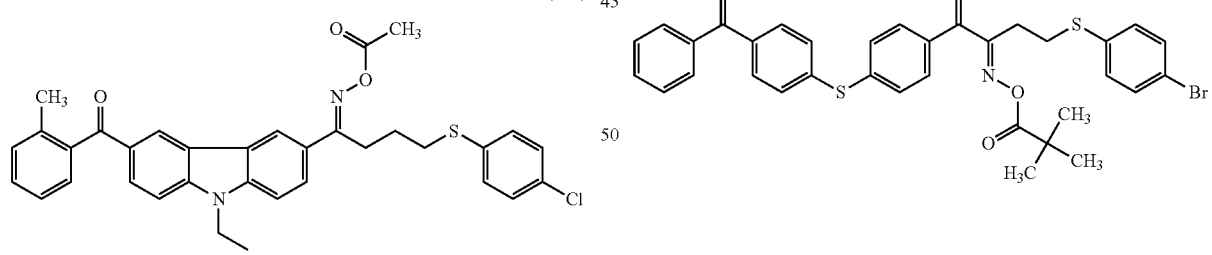

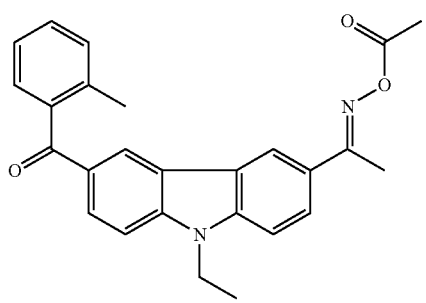
(C-8)

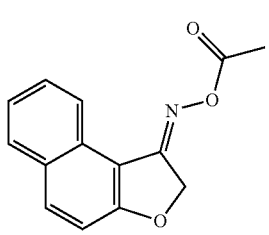
(C-9)

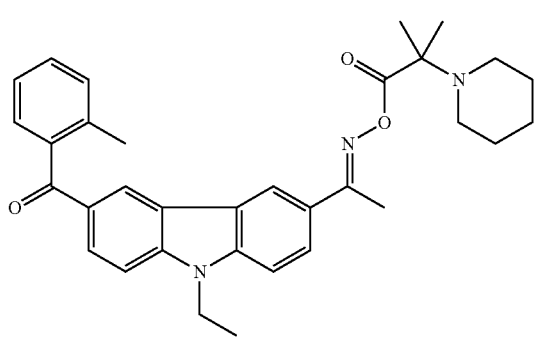
(C-10)

(C-11)

(C-12)

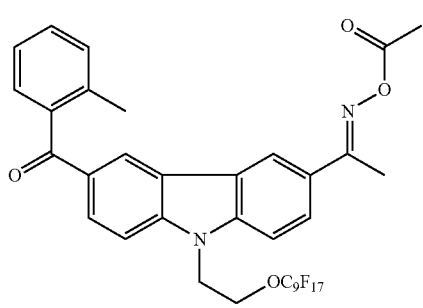

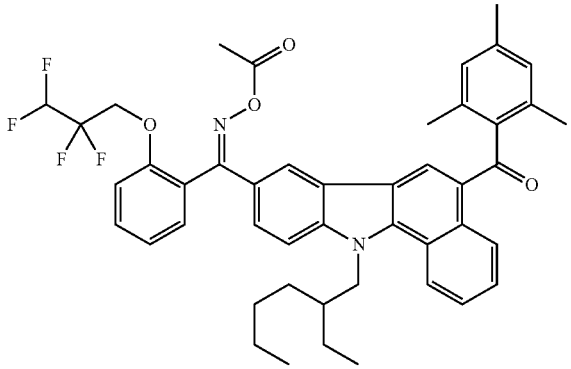
(C-13)

(C-14)

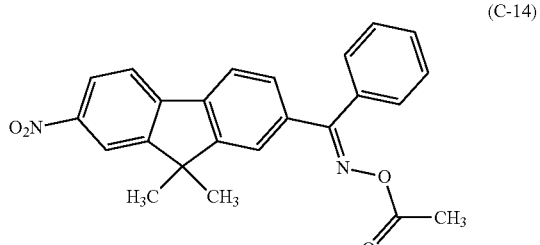

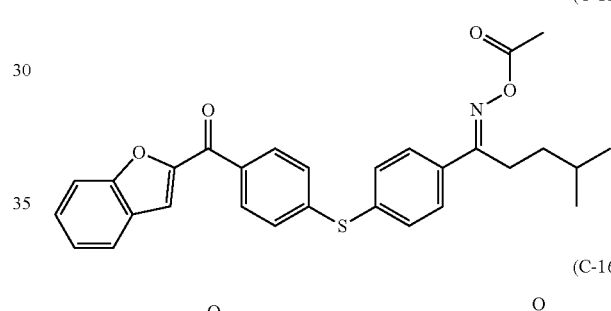
(C-15)

(C-16)

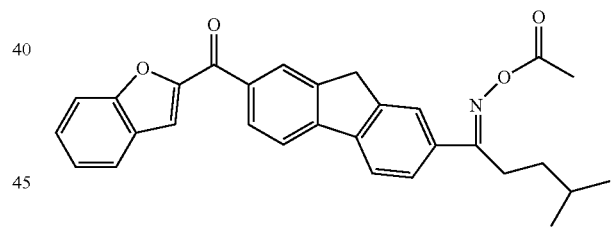

The content of the photopolymerization initiator in the total solid content of the composition for forming a pixel is preferably 0.1 to 30 mass %. The lower limit is preferably 0.5 mass % or more and more preferably 1 mass % or more. The upper limit is preferably 20 mass % or less and more preferably 15 mass % or less. The photopolymerization initiator may be used singly or in combination of two or more kinds thereof. In a case where two or more kinds thereof are used in combination, the total amount thereof is preferably within the above-described range.

(Organic Solvent)

The composition for forming a pixel preferably contains an organic solvent. Basically, the organic solvent is not particularly limited as long as it satisfies the solubility of the respective components and the application properties of the composition for forming a pixel. Examples of the organic solvent include an ester-based solvent, a ketone-based solvent, an alcohol-based solvent, an amide-based solvent, an ether-based solvent, and a hydrocarbon-based solvent. The details of the organic solvent can be found in paragraph No. 0223 of WO2015/166779A, the content of which is incorporated herein by reference. In addition, an ester-based solvent in which a cyclic alkyl group is substituted or a ketone-based solvent in which a cyclic alkyl group is substituted can also be preferably used. Specific examples of the organic solvent include polyethylene glycol monomethyl ether, dichloromethane, methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, cyclohexyl acetate, cyclopentanone, ethyl carbitol acetate, butyl carbitol acetate, propylene glycol monomethyl ether, propylene glycol monomethyl ether acetate, 3-methoxy-N,N-dimethylpropanamide, and 3-butoxy-N,N-dimethylpropanamide. In this case, it may be preferable that the content of aromatic hydrocarbons (such as benzene, toluene, xylene, and ethylbenzene) as the organic solvent is low (for example, 50 parts per million (ppm) by mass or less, 10 ppm by mass or less, or 1 ppm by mass or less with respect to the total amount of the organic solvent) in consideration of environmental aspects and the like.

The content of the organic solvent in the composition for forming a pixel is preferably 10 to 95 mass %, more preferably 20 to 90 mass %, and still more preferably 30 to 90 mass %.

(Surfactant)

The composition for forming a pixel can contain a surfactant. As the surfactant, various surfactants such as a fluorine-based surfactant, a nonionic surfactant, a cationic surfactant, an anionic surfactant, and a silicon-based surfactant can be used. Examples of the surfactant include surfactants described in paragraph Nos. 0238 to 0245 of WO2015/166779A, the contents of which are incorporated herein by reference.

It is preferable that the surfactant is a fluorine-based surfactant. By containing a fluorine-based surfactant in the coloring composition, liquid characteristics (particularly, fluidity) are further improved, and liquid saving properties can be further improved. In addition, it is possible to form a film with a small thickness unevenness.

The fluorine content in the fluorine-based surfactant is suitably 3 to 40 mass %, and more preferably 5 to 30 mass % and particularly preferably 7 to 25 mass %. The fluorine-based surfactant in which the fluorine content is within the above-described range is effective in terms of the evenness of the thickness of the coating film or liquid saving properties and the solubility of the surfactant in the coloring composition is also good.

Examples of the fluorine-based surfactant include surfactants described in paragraph Nos. 0060 to 0064 of JP2014-041318A (paragraph Nos 0060 to 0064 of the corresponding WO2014/017669A) and the like, and surfactants described in paragraph Nos 0117 to 0132 of JP2011-132503A, the contents of which are incorporated herein by reference. Examples of a commercially available product of the fluorine-based surfactant include: MEGAFACE F171, F172, F173, F176, F177, F141, F142, F143, F144, R30, F437, F475, F479, F482, F554, F780, EXP, and MFS-330 (all of which are manufactured by DIC Corporation); FLUORAD FC430, FC431, and FC171 (all of which are manufactured by Sumitomo 3M Ltd.); SURFLON S-382, SC-101, SC-103, SC-104, SC-105, SC-1068, SC-381, SC-383, S-393, and KH-40 (all of which are manufactured by Asahi Glass Co., Ltd.); and POLYFOX PF636, PF656, PF6320, PF6520, and PF7002 (all of which are manufactured by OMNOVA Solutions Inc.).

A block polymer can also be used as the fluorine-based surfactant. As the fluorine-based surfactant, a fluorine-containing polymer compound including a repeating unit derived from a (meth)acrylate compound having a fluorine atom and a repeating unit derived from a (meth)acrylate compound having 2 or more (preferably 5 or more) alkyleneoxy groups (preferably ethyleneoxy groups or propyleneoxy groups) can also be preferably used. In addition, fluorine-containing surfactants described in paragraph Nos. 0016 to 0037 of JP2010-032698A, or the following compounds are also exemplified as the fluorine-based surfactant used in the present invention.

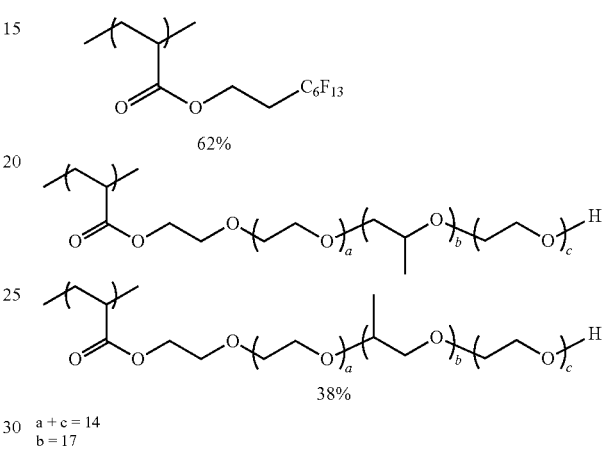

$a + c = 14$
$b = 17$

The weight-average molecular weight of the above-described compound is preferably 3000 to 50000, and is, for example, 14000. In the compound, "%" representing the proportion of a repeating unit is mol %.

The content of the surfactant in the total solid content of the composition for forming a pixel is preferably 0.001 to 5.0 mass % and more preferably 0.005 to 3.0 mass %. The surfactant may be used singly or in combination of two or more kinds thereof. In a case of using two or more kinds thereof, the total content thereof is preferably within the above-described range.

(Silane Coupling Agent)

The composition for forming a pixel can contain a silane coupling agent. According to this aspect, adhesiveness of a film to be obtained with a support can be further improved. In the present invention, the silane coupling agent means a silane compound having a hydrolyzable group and other functional groups. In addition, the hydrolyzable group refers to a substituent directly linked to a silicon atom and capable of forming a siloxane bond due to at least one of a hydrolysis reaction or a condensation reaction. Examples of the hydrolyzable group include a halogen atom, an alkoxy group, and an acyloxy group, and an alkoxy group is preferable. That is, it is preferable that the silane coupling agent is a compound having an alkoxysilyl group. Examples of the functional group other than the hydrolyzable group include a vinyl group, a (meth)allyl group, a (meth)acryloyl group, a mercapto group, an epoxy group, an oxetanyl group, an amino group, a ureido group, a sulfide group, an isocyanate group, and a phenyl group, and an amino group, a (meth)acryloyl group, or an epoxy group is preferable. Specific examples of the silane coupling agent include N-β-aminoethyl-γ-aminopropyl methyldimethoxysilane (trade name: KBM-602, manufactured by Shin-Etsu Chemical Co., Ltd.), N-β-aminoethyl-γ-aminopropyl trimethoxysilane (trade name:

KBM-603, manufactured by Shin-Etsu Chemical Co., Ltd.), N-β-aminoethyl-γ-aminopropyl triethoxysilane (trade name: KBE-602, manufactured by Shin-Etsu Chemical Co., Ltd.), γ-aminopropyl trimethoxysilane (trade name: KBM-903, manufactured by Shin-Etsu Chemical Co., Ltd.), γ-aminopropyl triethoxysilane (trade name: KBE-903, manufactured by Shin-Etsu Chemical Co., Ltd.), 3-methacryloxypropyl trimethoxysilane (trade name: KBM-502, manufactured by Shin-Etsu Chemical Co., Ltd.), and 3-methacryloxypropyl trimethoxysilane (trade name: KBM-503, manufactured by Shin-Etsu Chemical Co., Ltd.). In addition, specific examples of the silane coupling agent include the compounds described in paragraph Nos. 0018 to 0036 of JP2009-288703A and the compounds described in paragraph Nos. 0056 to 0066 of JP2009-242604A, the contents of which are incorporated herein by reference.

The content of the silane coupling agent in the total solid content of the composition for forming a pixel is preferably 0.1 to 5 mass %. The upper limit is preferably 3 mass % or less and more preferably 2 mass % or less. The lower limit is preferably 0.5 mass % or more and more preferably 1 mass % or more. The silane coupling agent may be used singly or in combination of two or more kinds thereof. In a case of using two or more kinds thereof, the total amount thereof is preferably within the above-described range.

(Polymerization Inhibitor)

The composition for forming a pixel can contain a polymerization inhibitor. Examples of the polymerization inhibitor include hydroquinone, p-methoxyphenol, di-tert-butyl-p-cresol, pyrogallol tert-butyl catechol, benzoquinone, 4,4'-thiobis(3-methyl-6-tert-butylphenol), 2,2'-methylenebis(4-methyl-6-t-butylphenol), and N-nitrosophenylhydroxylamine salt (an ammonium salt, a cerous salt, or the like). Among these, p-methoxyphenol is preferable. The content of the polymerization inhibitor in the total solid content of the composition for forming a pixel is preferably 0.0001 to 5 mass %. The polymerization inhibitor may be used singly or in combination of two or more kinds thereof. In a case of using two or more kinds thereof, the total amount thereof is preferably within the above-described range.

(Ultraviolet Absorber)

The composition for forming a pixel can contain an ultraviolet absorber. Examples of the ultraviolet absorber include the materials described in the section of the ultraviolet absorbing layer. In a case where the composition for forming a pixel contains an ultraviolet absorber, the content of the ultraviolet absorber in the total solid content of the composition for forming a pixel is preferably 0.01 to 10 mass % and more preferably 0.01 to 5 mass %. The ultraviolet absorber may be used singly or in combination of two or more kinds thereof. In a case of using two or more kinds thereof, the total amount thereof is preferably within the above-described range.

(Other Additives)

Optionally, the composition for forming a pixel may further contain a sensitizer, a curing accelerator, a filler, a thermal curing accelerator, a plasticizer, and other auxiliary agents (for example, conductive particles, an antifoaming agent, a flame retardant, a leveling agent, a peeling accelerator, an aromatic chemical, a surface tension adjuster, or a chain transfer agent). By appropriately containing these components, properties such as film properties can be adjusted. The details of the components can be found in, for example, paragraph No. 0183 of JP2012-003225A (corresponding to paragraph No. 0237 of US2013/0034812A) and paragraph Nos. 0101 to 0104 and 0107 to 0109 of JP2008-250074A, the contents of which are incorporated herein by reference. In addition, optionally, the coloring composition of the present invention may contain a potential antioxidant. Examples of the potential antioxidant include a compound in which a site functioning as an antioxidant is protected by a protecting group, and the protecting group is eliminated by heating the compound at 100° C. to 250° C. or heating the compound at 80° C. to 200° C. in the presence of an acid or base catalyst so that the compound functions as an antioxidant. Examples of the potential antioxidant include compounds described in WO2014/021023A, WO2017/030005A, and JP2017-008219A. Examples of a commercially available product of the potential antioxidant include ADEKA ARKLS GPA-5001 (manufactured by ADEKA Corporation).

<Composition for Forming Ultraviolet Absorbing Layer>

Next, a composition (composition for forming an ultraviolet absorbing layer) which can be preferably used for forming the ultraviolet absorbing layer in the color filter will be described.

(Yellow Colorant and Ultraviolet Absorber)

The composition for forming an ultraviolet absorbing layer preferably includes at least one selected from a yellow colorant and an ultraviolet absorber. The preferred aspect of the yellow colorant and ultraviolet absorber is as described above.

The total content of the yellow colorant and the ultraviolet absorber in the total solid content of the composition for forming an ultraviolet absorbing layer is preferably 10 to 80 mass %. The upper limit is preferably 75 mass % or less and more preferably 70 mass % or less. The lower limit is preferably 30 mass % or more and more preferably 40 mass % or more. In addition, in a case where the composition for forming an ultraviolet absorbing layer includes the yellow colorant and the ultraviolet absorber, the mass ratio of the yellow colorant and the ultraviolet absorber is preferably yellow colorant:ultraviolet absorber=20:80~80:20, more preferably 40:60 to 60:40, and still more preferably 60:40 to 80:20. The ultraviolet absorber and yellow colorant may be used singly or in combination of two or more kinds thereof. In a case of using two or more kinds thereof, the total amount thereof is preferably within the above-described range.

(Colorant Other than Yellow Colorant)

The composition for forming an ultraviolet absorbing layer preferably includes substantially no colorant other than the yellow colorant. According to this aspect, the generation of foreign matters can be effectively suppressed without affecting the hue of the colored pixel A of the color filter. The case where the composition for forming an ultraviolet absorbing layer includes substantially no colorant other than the yellow colorant means that the content of colorants other than the yellow colorant is 1 part by mass or less with respect to 100 parts by mass of the yellow colorant, preferably 0.5 parts by mass or less, more preferably 0.1 parts by mass or less, and particularly preferably 0 parts by mass.

(Resin)

The composition for forming an ultraviolet absorbing layer preferably contains a resin. Examples of the resin include the resins described in the section of the resin of the colored pixel A. The content of the resin in the total solid content of the composition for forming an ultraviolet absorbing layer is preferably 5 to 40 mass %. The upper limit is preferably 30 mass % or less and more preferably 25 mass % or less. The lower limit is preferably 7 mass % or more and more preferably 10 mass % or more. The resin may be used singly or in combination of two or more kinds thereof.

In a case of using two or more kinds thereof, the total amount thereof is preferably within the above-described range.

(Curable Compound)

The composition for forming an ultraviolet absorbing layer can contain a curable compound. According to this aspect, the light resistance and the like of the color filter can be improved more effectively. Examples of the details of the curable compound include materials described in the section of the composition for forming a pixel. In a case where the composition for forming an ultraviolet absorbing layer contains a curable compound, the content of the curable compound in the total solid content of the composition for forming an ultraviolet absorbing layer is preferably 1 to 60 mass %. The lower limit is, for example, more preferably 5 mass % or more and still more preferably 10 mass % or more. The upper limit is, for example, preferably 50 mass % or less and still more preferably 40 mass % or less. The curable compound may be used singly or in combination of two or more kinds thereof. In a case where two or more kinds thereof are used in combination, the total amount thereof is preferably within the above-described range.

(Photopolymerization Initiator)

The composition for forming an ultraviolet absorbing layer can contain a photopolymerization initiator. Examples of the details of the photopolymerization initiator include materials described in the section of the composition for forming a pixel. In a case where the composition for forming an ultraviolet absorbing layer contains a photopolymerization initiator, the content of the photopolymerization initiator in the total solid content of the composition for forming an ultraviolet absorbing layer is preferably 0.1 to 30 mass %. The lower limit is preferably 0.5 mass % or more and more preferably 1 mass % or more. The upper limit is preferably 20 mass % or less and more preferably 15 mass % or less. The photopolymerization initiator may be used singly or in combination of two or more kinds thereof. In a case where two or more kinds thereof are used in combination, the total amount thereof is preferably within the above-described range.

(Organic Solvent)

The composition for forming an ultraviolet absorbing layer can contain an organic solvent. Examples of the details of the organic solvent include materials described in the section of the composition for forming a pixel. The content of the organic solvent in the composition for forming an ultraviolet absorbing layer is preferably 10 to 95 mass %, more preferably 20 to 90 mass %, and still more preferably 30 to 90 mass %.

(Surfactant)

The composition for forming an ultraviolet absorbing layer can contain a surfactant. Examples of the details of the surfactant include materials described in the section of the composition for forming a pixel. In a case where the composition for forming an ultraviolet absorbing layer contains a surfactant, the content of the surfactant in the total solid content of the composition for forming an ultraviolet absorbing layer is preferably 0.001 mass % to 5.0 mass % and more preferably 0.005 mass % to 3.0 mass %. The surfactant may be used singly or in combination of two or more kinds thereof. In a case of using two or more kinds thereof, the total amount thereof is preferably within the above-described range.

(Silane Coupling Agent)

The composition for forming an ultraviolet absorbing layer can contain a silane coupling agent. Examples of the details of the silane coupling agent include materials described in the section of the composition for forming a pixel. In a case where the composition for forming an ultraviolet absorbing layer contains a silane coupling agent, the content of the silane coupling agent in the total solid content of the composition for forming an ultraviolet absorbing layer is preferably 0.1 to 5 mass %. The upper limit is preferably 3 mass % or less and more preferably 2 mass % or less. The lower limit is preferably 0.5 mass % or more and more preferably 1 mass % or more. The silane coupling agent may be used, singly or in combination of two or more kinds thereof. In a case of using two or more kinds thereof, the total amount thereof is preferably within the above-described range.

(Polymerization Inhibitor)

The composition for forming an ultraviolet absorbing layer can contain a polymerization inhibitor. Examples of the details of the polymerization inhibitor include materials described in the section of the composition for forming a pixel. In a case where the composition for forming an ultraviolet absorbing layer contains a polymerization inhibitor, the content of the polymerization inhibitor in the total solid content of the composition for forming an ultraviolet absorbing layer is preferably 0.0001 to 5 mass %. The polymerization inhibitor may be used singly or in combination of two or more kinds thereof. In a case of using two or more kinds thereof, the total amount thereof is preferably within the above-described range.

(Other Additives)

Optionally, the composition for forming an ultraviolet absorbing layer can contain the materials described in the section of the composition for forming a pixel.

<Storage Container for Composition>

A storage container for each of the above-described compositions is not particularly limited, and a known storage container can be used. In addition, as the storage container, it is also preferable to use a multilayer bottle having an interior wall constituted with six layers from six kinds of resins or a bottle having a 7-layer structure from 6 kinds of resins for the purpose of suppressing infiltration of impurities into raw materials or compositions. Examples of such a container include the containers described in JP2015-123351A. In addition, for the purpose of preventing metal elution from the container interior wall, improving storage stability of the composition, and suppressing the alteration of components, it is also preferable that the container interior wall is formed of glass, stainless steel, or the like.

<Method for Preparing Composition>

Each of the above-described compositions can be prepared by mixing the above-described components with each other. During the preparation of the composition, all the components may be dissolved or dispersed in a solvent at the same time to prepare the composition. Optionally, two or more solutions or dispersion liquids to which the respective components are appropriately blended may be prepared, and the solutions or dispersion liquid may be mixed with each other during use (during application) to prepare the composition.

In addition, in the preparation of the composition, a process of dispersing the pigment is also preferably included. In the process for dispersing the pigment, examples of a mechanical force which is used for dispersing the pigment include compression, pressing, impact, shear, and cavitation. Specific examples of these processes include a beads mill, a sand mill, a roll mill, a ball mill, a paint shaker, a microfluidizer, a high-speed impeller, a sand grinder, a flow jet mixer, high-pressure wet atomization, and ultrasonic dispersion. In addition, in the pulverization of the pigment in a sand mill (beads mill), it is preferable to perform a treatment under the condition for increasing a pulverization efficiency by using beads having small diameters; increasing the filling rate of the beads; or the like. Incidentally, it is preferable to remove coarse particles by filtration, centrifugation, or the like after the pulverization treatment. In addition, as the process and the dispersing machine for dispersing the pigment, the process and the dispersing machine described in "Dispersion Technology Comprehension, published by Johokiko Co., Ltd., Jul. 15, 2005", "Actual comprehensive data collection on dispersion technology and industrial application centered on suspension (solid/liquid dispersion system), published by Publication Department, Management Development Center, Oct. 10, 1978", and paragraph No. 0022 of JP2015-157893A can be suitably used. In addition, in the process for dispersing the pigment, a refining treatment of particles in a salt milling step may be performed. With regard to the materials, equipment, treatment conditions, and the like used in the salt milling step, reference can be made to, for example, the description in JP2015-194521A and JP2012-046629A.

During the preparation of the composition, it is preferable that the composition is filtered through a filter, for example, in order to remove foreign matters or to reduce defects. As the filter, any filters that have been used in the related art for filtration use and the like may be used without particular limitation. Examples of a material of the filter include: a fluororesin such as polytetrafluoroethylene (PTFE); a polyamide resin such as nylon (for example, nylon-6 or nylon-6,6); and a polyolefin resin (including a polyolefin resin having a high density and an ultrahigh molecular weight) such as polyethylene or polypropylene (PP). Among these materials, polypropylene (including a high-density polypropylene) and nylon are preferable.

The pore size of the filter is preferably 0.01 to 7.0 µm, more preferably 0.01 to 3.0 µm, and still more preferably 0.05 to 0.5 µm. In a case where the pore size of the filter is within the above-described range, fine foreign matters can be reliably removed. With regard to the pore size value of the filter, reference can be made to a nominal value of filter manufacturers. As the filter, various filters provided by Nihon Pall Corporation (DFA4201NIEY and the like), Toyo Roshi Kaisha., Ltd., Nihon Entegris K.K. (formerly Nippon Microlith Co., Ltd.), Kitz Micro Filter Corporation, and the like can be used.

In addition, it is preferable that a fibrous filter material is used as the filter. Examples of the fibrous filter material include a polypropylene fiber, a nylon fiber, and a glass fiber. Examples of a commercially available product include SBP type series (SBP008 and the like), TPR type series (TPR002, TPR005, and the like), or SHPX type series (SHPX003 and the like), all manufactured by Roki Techno Co., Ltd.

In a case of using a filter, different filters (for example, a first filter, a second filter, and the like) may be combined. In this case, the filtration with each of the filters may be performed once or may be performed twice or more times. In addition, filters having different pore sizes within the above-described range may be combined. In addition, the filtration through the first filter may be performed with only a dispersion liquid, the other components may be mixed therewith, and then the filtration through the second filter may be performed.

<Method for Manufacturing Color Filter>

The color filter according to the embodiment of the present invention can be manufactured by forming the colored pixel A using the above-described composition for forming a pixel, and forming the ultraviolet absorbing layer on the colored pixel A using the above-described composition for forming an ultraviolet absorbing layer.

<<Forming Step of Colored Pixel A>>

A forming step of the colored pixel A preferably includes a step of applying the composition for forming a pixel to a support to form a composition layer for forming a pixel, and a step of forming a pattern on the composition layer for forming a pixel by a photolithography method or a dry etching method. It is preferable that the pattern forming method by a photolithography method includes a step (exposure step) of exposing the composition layer for forming a pixel in a patterned manner, and a step (development step) of forming a pattern by removing a non-exposed portion of the composition layer for forming a pixel by development. It is preferable that the pattern forming method by a dry etching method includes a step of curing the composition layer for forming a pixel to form a cured composition layer, a step of forming a patterned photoresist layer on the cured composition layer, and a step of dry-etching the cured composition layer with etching gas by using the patterned photoresist layer as a mask. Hereinafter, the respective steps will be described.

(Step of Forming Composition Layer for Forming Pixel)

In the step of forming a composition layer for forming a pixel, it is preferable to form the composition layer for forming a pixel on a support. The support is not particularly limited, and can be appropriately selected depending on applications. A substrate (silicon wafer, silicon carbide wafer, silicon nitride wafer, sapphire water, and glass wafer) used in various electronic devices such as a solid-state imaging element can be used. In addition, as necessary, an undercoat layer may be provided on these substrates so as to improve adhesiveness to an upper layer, prevent the diffusion of substances, or planarize the surface. The undercoat layer may be formed of a composition obtained by removing a colorant from the composition for forming a pixel described in the present specification, a composition including the resin, polymerizable compound, surfactant, and the like described in the present specification, or the like.

As a method for applying the composition layer for forming a pixel, various coating methods such as slit coating, an ink jet method, spin coating, cast coating, roll coating, and a screen printing method can be used.

The composition layer for forming a pixel may be dried (pre-baked). In a case where a pattern is formed through a low-temperature process, pre-baking is not necessarily performed. In a case of performing the pre-baking, the pre-baking temperature is preferably 150° C. or lower, more preferably 120° C. or lower, and still more preferably 110° C. or lower. The lower limit may be set to, for example, 50° C. or higher, or to 80° C. or higher. The pre-baking time is preferably 10 seconds to 300 seconds, more preferably 40 to 250 seconds, and still more preferably 80 to 220 seconds. Drying can be performed using a hot plate, an oven, or the like.

(Case where Pattern is Formed Using Photolithography Method)

[Exposure Step]

Next, the composition layer for forming a pixel is exposed in a patterned manner (exposure step). For example, the composition layer for forming a pixel can be subjected to exposure in a patterned manner by performing exposure using a stepper exposure machine or a scanner exposure machine through a mask having a predetermined mask pattern. Thus, the exposed portion can be cured.

Examples of the radiation (light) which can be used during the exposure include g-rays and i-rays. In addition, light (preferably light having a wavelength of 180 to 300 nm) having a wavelength of 300 nm or less can be used. Examples of the light having a wavelength of 300 nm or less include KrF-rays (wavelength: 248 nm) and ArF-rays (wavelength: 193 nm), and KrF-rays (wavelength: 248 nm) are preferable. In addition, a long-wave light source of 300 nm or more can be used. In addition, in a case of exposure, the photosensitive composition layer may be irradiated with light continuously to expose the photosensitive composition layer, or the photosensitive composition layer may be irradiated with light in a puke to expose the photosensitive composition layer (pulse exposure).

The irradiation amount (exposure amount) is, for example, preferably 0.03 to 2.5 J/cm$^2$ and more preferably 0.05 to 1.0 J/cm$^2$. The oxygen concentration during the exposure can be appropriately selected, and the exposure may also be performed, for example, in a low-oxygen atmosphere having an oxygen concentration of 19% by volume or less (for example, 15% by volume, 5% by volume, and substantially oxygen-free) or in a high-oxygen atmosphere having an oxygen concentration of more than 21% by volume (for example, 22% by volume, 30% by volume, and 50% by volume), in addition to an atmospheric air. In addition, the exposure illuminance can be appropriately set, and can be usually selected from a range of 1000 W/m$^2$ to 100000 W/m$^2$ (for example, 5000 W/m$^2$, 15000 W/m$^2$, or 35000 W/m$^2$). Appropriate conditions of each of the oxygen concentration and the exposure illuminance may be combined, and for example, a combination of the oxygen concentration of 10% by volume and the illuminance of 10000 W/m$^2$, a combination of the oxygen concentration of 35% by volume and the illuminance of 20000 W/m$^2$, or the like is available.

[Development Step]

Next, a non-exposed portion is removed by development to form a pattern. The non-exposed portion can be removed by development using a developer. Thus, the composition layer for forming a pixel of the non-exposed portion in the exposure step is eluted into the developer, and as a result, only a photocured portion remains. The temperature of the developer is preferably, for example, 20° C. to 30° C. The development time is preferably 20 to 180 seconds. In addition, in order to improve residue removing properties, a step of removing the developer by shaking off per 60 seconds and supplying a fresh developer may be repeated multiple times.

Examples of the developer include an organic solvent and an alkali developer, and an alkali developer is preferably used. As the alkali developer, an alkaline solution (alkali developer) in which an alkali agent is diluted with pure water is preferable. Examples of the alkali agent include: an organic alkaline compound such as ammonia, ethylamine, diethylamine, dimethylethanolamine, diglycolamine, diethanolamine, hydroxyamine, ethylenediamine, tetramethylammonium hydroxide, tetraethyl ammonium hydroxide, tetrapropylammonium hydroxide, tetrabutylammonium hydroxide, ethyltrimethylammonium hydroxide, benzyltrimethylammonium hydroxide, dimethyl bis(2-hydroxyethyl)ammonium hydroxide, choline, pyrrole, piperidine, and 1,8-diazabicyclo[5.4.0]-7-undecene; and an inorganic alkaline compound such as sodium hydroxide, potassium hydroxide, sodium carbonate, sodium hydrogen carbonate, sodium silicate, and sodium metasilicate. In consideration of environmental aspects and safety aspects, the alkali agent is preferably a compound having a high molecular weight. The concentration of the alkali agent in the aqueous alkaline solution is preferably 0.001 to 10 mass % and more preferably 0.01 to 1 mass %. In addition, the developer may further contain a surfactant. From the viewpoint of transportation, storage, and the like, the developer may be first produced as a concentrated liquid and then diluted to a concentration required upon the use. The dilution ratio is not particularly limited, and can be set to, for example, a range of 1.5 to 100 times. In addition, it is also preferable to wash (rinse) with pure water after development.

After the development, the film can also be dried and then heated (post-baking). Post-baking is a heating treatment which is performed after development to completely cure the film. In a case where post-baking is performed, for example, the post-baking temperature is preferably 100° C. to 240° C. From the viewpoint of curing the film, the post-baking temperature is more preferably 200° C. to 230° C. The Young's modulus of the film after post-baking is preferably 0.5 to 20 GPa and more preferably 2.5 to 15 GPa. The post-baking can be performed continuously or batch-wise by using a heating unit such as a hot plate, a convection oven (hot air circulation dryer), and a high-frequency heater so that the film after development satisfies the conditions.

(Case where Pattern is Formed Using Dry Etching Method)

The formation of a pattern using a dry etching method can be performed using a method including: applying the composition for forming a pixel to a support or the like to form a composition layer for forming a pixel; curing the formed composition layer for forming a pixel to form a cured composition layer; forming a patterned photoresist layer on the cured composition layer; and dry-etching the cured composition layer with etching gas by using the patterned photoresist layer as a mask. As the photoresist layer, it is preferable to apply a positive or negative radiation-sensitive composition to the cured composition layer and dry the composition to form a photoresist layer. As the radiation-sensitive composition used for forming the photoresist layer, the positive type resist compositions described in JP2009-237173A or JP2010-134283A are suitably used. In the formation of the photoresist layer, the exposure step of the radiation-sensitive composition is preferably carried out by KrF ray, ArF ray, i-ray, X-ray, or the like, and more preferably carried out by KrF ray, ArF ray, X-ray, or the like, and still more preferably carried out by KrF ray.

<<Forming Step of Ultraviolet Absorbing Layer>>

Next, a forming step of the ultraviolet absorbing layer will be described. In the ultraviolet absorbing layer, it is preferable to include a step of applying the composition for forming an ultraviolet absorbing layer to the colored pixel A to form a composition layer for an ultraviolet absorbing layer. Further, it is also preferable to include a step of forming a pattern on the composition layer for an ultraviolet absorbing layer by a photolithography method.

As a method for applying the composition for forming an ultraviolet absorbing layer, various coating methods such as slit coating, an ink jet method, spin coating, cast coating, roll coating, and a screen printing method can be used. The details of the pattern forming method by a photolithography method are the same as those described above.

In this way, it is possible to manufacture a color filter in which the ultraviolet absorbing layer is formed on the colored pixel A.

In addition, in a case of further forming another pixel different from the colored pixel A, it is preferable to form the another pixel after forming the ultraviolet absorbing layer on the colored pixel A. However, after forming the colored pixel A, another pixel different from the colored pixel A may be formed adjacent to the support, and then the composition for forming an ultraviolet absorbing layer may be applied to the colored pixel A to form the ultraviolet absorbing layer.

<Solid-State Imaging Element>

The solid-state imaging element according to an embodiment of the present invention includes the above-described color filter according to the embodiment of the present invention. The configuration of the solid-state imaging element is not particularly limited as long as the solid-state imaging element is configured so as to function as a solid-state imaging element. Examples of the configuration include the following configurations.

The solid-state imaging element is configured to have a plurality of photodiodes constituting a light receiving area of the solid-state imaging element (a charge coupled device (CCD) image sensor, a complementary metal-oxide semiconductor (CMOS) image sensor, or the like), and a transfer electrode formed of polysilicon or the like on a substrate; have a light-shielding film having openings only over the light receiving section of the photodiodes on the photodiodes and the transfer electrodes; have a device-protective film formed of silicon nitride or the like, which is formed to coat the entire surface of the light-shielding film and the light receiving section of the photodiodes, on the light-shielding film; and have a color filter on the device-protective film. Further, the solid-state imaging element may also be configured, for example, such that it has a light collecting unit (for example, a microlens, which is the same hereinafter) on a device-protective film under a color filter (a side closer to the substrate), or has a light collecting unit on a color filter. In addition, the color filter may have a structure in which each colored pixel is embedded in a space partitioned in, for example, a lattice form by a partition wall. In this case, it is preferable that the partition wall has a lower refractive index than each colored pixel. Examples of an imaging device having such a structure include the devices described in JP2012-227478A, JP2014-179577A, WO2018/04.3654A, and US2018/00410656A. An imaging device including the solid-state imaging element according to the embodiment of the present invention can also be used as a vehicle camera or a surveillance camera, in addition to a digital camera or electronic apparatus (mobile phones or the like) having an imaging function.

<Image Display Device>

The image display device according to an embodiment of the present invention includes the above-described color filter according to the embodiment of the present invention. Examples of the image display device include a liquid crystal display device or an organic electroluminescent display device. The definitions of image display devices or the details of the respective image display devices are described in, for example, "Electronic Display Device (Akio Sasaki, Kogyo Chosakai Publishing Co., Ltd., published in 1990)", "Display Device (Sumiaki Ibuki, Sangyo Tosho Co., Ltd.)", and the like. In addition, the liquid crystal display device is described in, for example, "Liquid Crystal Display Technology for Next Generation (edited by Tatsuo Uchida, Kogyo Chosakai Publishing Co., Ltd., published in 1994)". The liquid crystal display device to which the present invention can be applied is not particularly limited, and can be applied to, for example, liquid crystal display devices employing various systems described in the "Liquid Crystal Display Technology for Next Generation".

EXAMPLES

Hereinafter, the present invention will be described in more detail with reference to Examples. The materials, the amounts of materials to be used, the proportions, the treatment details, the treatment procedure, or the like shown in the examples below may be modified appropriately as long as the modifications do not depart from the spirit of the present invention. Therefore, the scope of the present invention is not limited to the specific examples shown below.

<Evaluation of Pigment and Pigment Derivative>

(Identification of Phthalocyanine)

Phtalocyanine was identified by matching of a molecular ion peak of the mass spectrum obtained by using a time-of-flight mass spectrometer (autoflex III (TOF-MS), manufactured by Balker Corporation) with the mass number obtained by calculation, and matching of a ratio of carbon, hydrogen, and nitrogen obtained by using an elemental analysis apparatus (2400CHN elemental analysis apparatus, manufactured by PerkinElmer Co., Ltd.) with the theoretical value.

(Average Value of Number of Substitutions of Halogen Atoms in Pigment and Pigment Derivative)

As the average value of the number of substitutions of halogen atoms, the pigment was burned by an oxygen flask combustion method, and the liquid obtained by absorbing the combustible in water was analyzed by an ion chromatograph (ICS-2000 ion chromatography, manufactured by Dionex) to quantify the amount of halogen and convert the amount to the average value of the number of substitutions of halogen atoms.

(Halogen Distribution Width of Pigment and Pigment Derivative)

As the halogen distribution width, in the mass spectrum obtained by using a time-of-flight mass spectrometer (autoflex III (TOF-MS), manufactured by Bruker Corporation), the signal intensity (each peak value) of molecular ion peaks corresponding to each component and the integrated value (all peak values) of each peak value were calculated, and the number of peaks in which the ratio of each peak value to all peak values was 1% or more was counted and defined as the halogen distribution width.

(Volume Average Primary Particle Diameter of Pigment and Pigment Derivative)

The volume average primary particle diameter of the pigment and the pigment derivative was calculated by a transmission electron microscope (TEM) "H-7650" manufactured by Hitachi High-Tech Corporation and the following expression. First, particles of the pigment or the pigment derivative was imaged by TEM. From the obtained images, an image of 100 arbitrary particles was selected, and the average value of a minor axis diameter and a major axis diameter of the primary particle was defined as a particle diameter (d) of the particles. Next, for each pigment or pigment derivative, the volume of each particle was determined by regarding the pigment or the pigment derivative as a sphere having the particle diameter (d) previously determined. This work was performed on 100 pigment or pigment derivative particles, and the volume average primary particle diameter thereof was calculated by Expression (1).

$$MV = \Sigma(V \cdot d)/\Sigma(V) \tag{1}$$

(X-Ray Diffraction Pattern by CuKα Ray)

The X-ray diffraction pattern by CuKα ray was measured in a range of black angle $2\theta=3°$ to $35°$ with a desktop X-ray diffractometer manufactured by Rigaku Corporation at an X-ray sampling interval of $0.02°$.

<Evaluation of Resin>

(Weight-Average Molecular Weight (Mw))

The weight-average molecular weight (Mw) of a resin was measured by gel permeation chromatography (GPC) equipped with a differential refractometer (RI) detector. As an apparatus, HLC-8220GPC (manufactured by Tosoh Corporation) was used while connecting two separation columns in series, for both fillers, "TSK-GEL SUPER HZM-N" was used by connecting them in two series, and the measurement was performed at an oven temperature of 40° C., using tetrahydrofuran as an eluent, and a flow rate of 0.35 ml/min. A sample was dissolved in a solvent consisting of 1 mass % of the above-described eluent and injected in 20 μL. All molecular weights are values in terms of polystyrene.
(Acid Value of Resin)

The acid value of a resin is a value expressed in terms of solid contents of an acid value (mgKOH/g) measured according to a potentiometric titration method of JIS K 0070.

<Production of Aluminum Phthalocyanine Pigment>

Production Example 1-1

(Production of Aluminum Phthalocyanine Pigment (P-1))

In a reaction container, 225 parts by mass of phthalodinitrile and 78 parts by mass of aluminum chloride anhydride were mixed and stirred with 1250 parts by mass of n-amyl alcohol. 266 parts by mass of 1,8-Diazabicyclo[5.4.0]undec-7-ene (DBU) was added thereto, and the mixture was heated and refluxed at 136° C. for 5 hours. The reaction product cooled to 30° C. with stirring was poured into a mixed solvent consisting of 5000 parts by mass of methanol and 10000 parts by mass of water with stirring to obtain a blue slurry. This slurry was filtered, washed with a mixed solvent consisting of 2000 parts by mass of methanol and 4000 parts by mass of water, and dried to obtain chloroaluminum phthalocyanine represented by Formula (4).

In a case where an elemental analysis of the obtained chloroaluminum phthalocyanine was performed, compared to measured values (C) 66.85%, (H) 2.81%, and (N) 19.49%, the calculated values were (C) 66.9%, (H) 2.9%, and (N) 19.2%, and it was identified as the target compound.

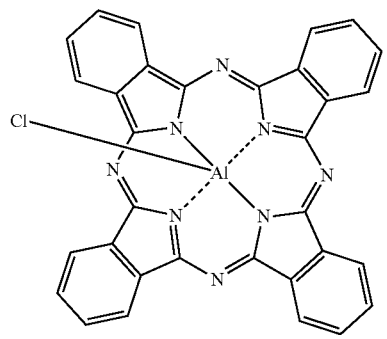

(4)

Next, in a reaction container, 100 parts by mass of the above-described chloroaluminum phthalocyanine was added to 1500 parts by mass of concentrated sulfuric acid in an ice bath. Thereafter, 199 parts by mass of 1,3-dibromo-5,5-dimethylhydantoin was gradually added thereto, and the mixture was stirred at 25° C. for 6 hours. Subsequently, this sulfuric acid solution was injected into 9000 parts by mass of cold water at 3° C. the formed precipitate was filtered, washed with water, 1% sodium hydroxide aqueous solution, and then water, and dried to obtain an aluminum phthalocyanine pigment (P-1) represented by the following formula. In a case where the number of substitutions of bromine in the obtained aluminum phthalocyanine pigment (P-1) was cal-culated, the average number was 8.4, a peak corresponding to the same molecular weight was confirmed from the mass spectrum, and it was identified as the target compound. In addition, the halogen distribution width was 8. The volume average primary particle diameter of the obtained aluminum phthalocyanine pigment (P-1) was 43 nm.

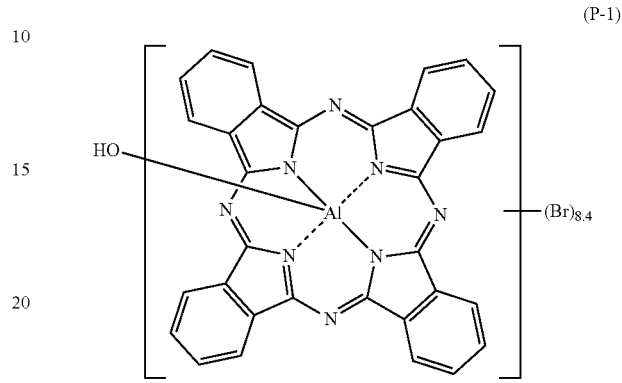

(P-1)

Production Example 1-2

(Production of Aluminum Phthalocyanine Pigment (P-2))

An aluminum phthalocyanine pigment (P-2) represented by the following formula was produced in the same manner as in Production Example 1-1, except that, in the production of the aluminum phthalocyanine pigment (P-1) described above, 199 parts by mass of 1,3-dibromo-5,5-dimethylhydantoin was changed to 108 parts by mass of trichloroisocyanuric acid. In a case where the number of substitutions of chlorine in the obtained aluminum phthalocyanine pigment (P-2) was calculated, the average number was 7.8, a peak corresponding to the same molecular weight was confirmed from the mass spectrum, and it was identified as the target compound. In addition, the halogen distribution width was 7. The volume average primary particle diameter of the obtained aluminum phthalocyanine pigment (P-2) was 41 nm.

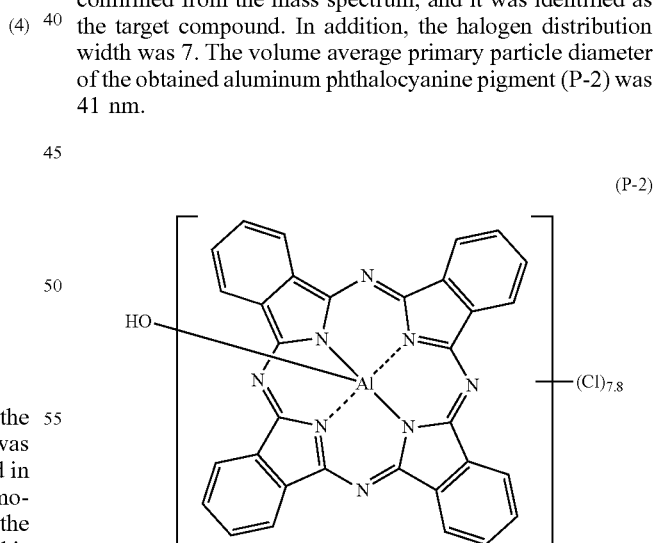

(P-2)

Production Example 1-3

(Production of Aluminum Phthalocyanine Pigment (P-3))

To a reaction container, 1000 parts by mass of 1-methyl-2-pyrrolidinone, 100 parts by mass of the aluminum phthalocyanine pigment (P-1) obtained in Production Example 1-1, and 31 parts by mass of diphenyl phosphate were added. After reacting at 85° C. for 3 hours, the solution was injected into 8000 parts by mass of water. The reaction product was filtered, washed with 16000 parts by mass of water, and dried under reduced pressure at 60° C. for 24 hours to obtain a blue product.

Next, 600 parts by mass of propylene glycol monomethyl ether acetate was added to the above-described blue product, and the mixture was heated at 120° C. for 2 hours. The product was filtered and dried under reduced pressure at 60° C. for 24 hours to obtain an aluminum phthalocyanine pigment (P-3) represented by the following formula.

In a case where the number of substitutions of bromine in the obtained aluminum phthalocyanine pigment (P-3) was calculated, the average number was 8.3, a peak corresponding to the same molecular weight was confirmed from the mass spectrum, and it was identified as the target compound. In addition, the halogen distribution width was 8. The volume average primary particle diameter of the obtained aluminum phthalocyanine pigment (P-3) was 32 nm. In addition, in a case where the X-ray diffraction pattern by CuKα ray was measured, peaks were found at black angles 2θ=9.3°, 14.5°, 15.7°, 18.3°, 23.5°, and 24.1°.

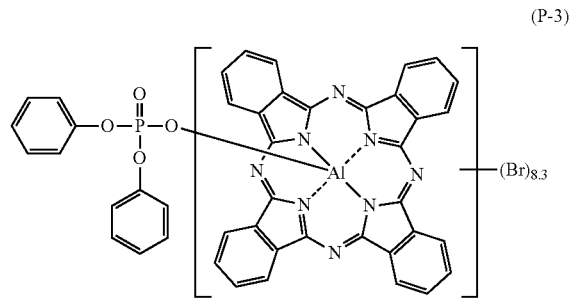

Production Example 1-4

(Production of Aluminum Phthalocyanine Pigment (P-4))

The same operation as in Production Example 1-3 was carried out to obtain an aluminum phthalocyanine pigment (P-4) represented by the following formula, except that, in the production of the aluminum phthalocyanine pigment (P-3) described above, 31 parts by mass of diphenyl phosphate was changed to 23.4 parts by mass of oxynias acid.

In a case where the number of substitutions of bromine in the obtained aluminum phthalocyanine pigment (P-4) was calculated, the average number was 8.4, a peak corresponding to the same molecular weight was confirmed from the mass spectrum, and it was identified as the target compound. In addition, the halogen distribution width was 8. The volume average primary particle diameter of the obtained aluminum phthalocyanine pigment (P-4) was 46 nm.

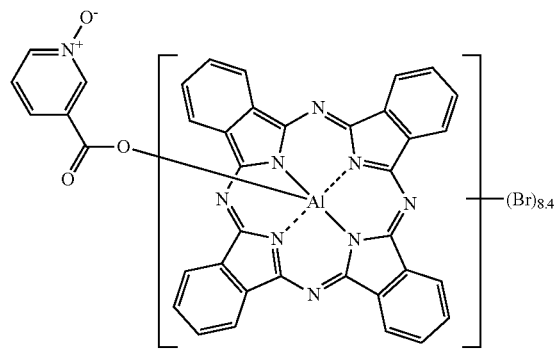

Production Example 1-5

(Production of Aluminum Phthalocyanine Pigment (P-5))

The same operation as in Production Example 1-3 was carried out to obtain an aluminum phthalocyanine pigment (P-5) represented by the following formula, except that, in the production of the aluminum phthalocyanine pigment (P-3) described above, 31 parts by mass of diphenyl phosphate was changed to 29.0 parts by mass of p-toluenesulfonic acid.

In a case where the number of substitutions of bromine in the obtained aluminum phthalocyanine pigment (P-5) was calculated, the average number was 8.2, a peak corresponding to the same molecular weight was confirmed from the mass spectrum, and it was identified as the target compound. In addition, the halogen distribution width was 8. The volume average primary particle diameter of the obtained aluminum phthalocyanine pigment (P-5) was 43 nm.

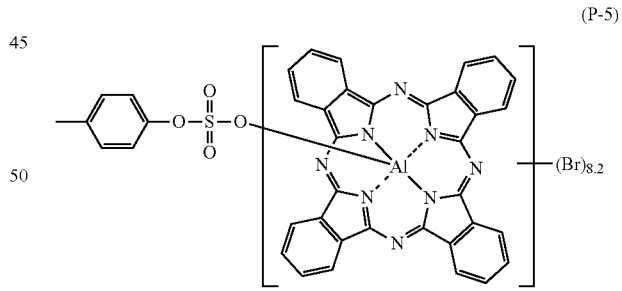

Production Example 1-6

(Production of Aluminum Phthalocyanine Pigment (P-6))

The same operation as in Production Example 1-3 was carried out to obtain an aluminum phthalocyanine pigment (P-6) represented by the following formula, except that, in the production of the aluminum phthalocyanine pigment (P-3) described above, the aluminum phthalocyanine pigment (P-1) was changed to the aluminum phthalocyanine pigment (P-2) and 31 parts by mass of diphenyl phosphate was changed to 45.5 parts by mass of diphenyl phosphate.

In a case where the number of substitutions of chlorine in the obtained aluminum phthalocyanine pigment (P-6) was calculated, the average number was 7.8, a peak corresponding to the same molecular weight was confirmed from the mass spectrum, and it was identified as the target compound. In addition, the halogen distribution width was 7. The volume average primary particle diameter of the obtained aluminum phthalocyanine pigment (P-6) was 45 nm.

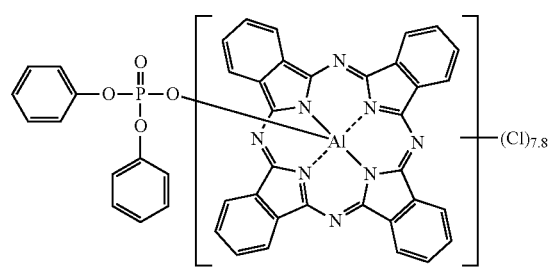

(P-6)

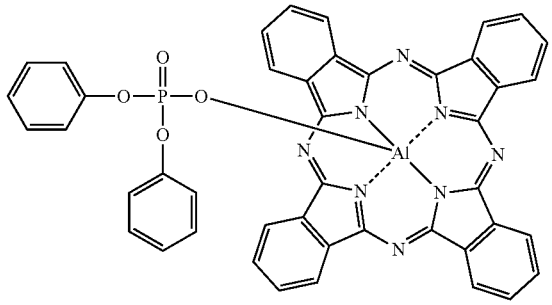

(P-7)

Production Example 1-8

(Production of Aluminum Phthalocyanine Pigment (P-8))

200 parts by mass of pyridine, 800 parts by mass of xylene, and 54.6 parts by mass of phenylphosphonic acid were added to 100 parts by mass of chloroaluminum phthalocyanine represented by Formula (4), and a heat refluxing was continued for 8 hours. The mixture was filtered, washed with methanol, and dried to obtain an aluminum phthalocyanine pigment (P-8) represented by the following formula. The volume average primary particle diameter of the obtained aluminum phthalocyanine pigment (P-8) was 37 nm.

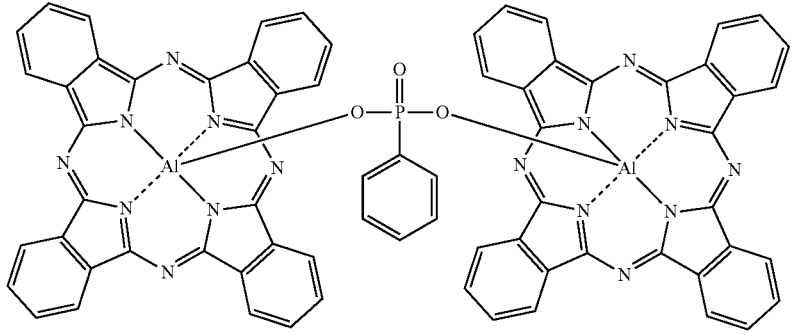

(P-8)

Production Example 1-7

(Production of Aluminum Phthalocyanine Pigment (P-7))

The same operation as in Production Example 1-3 was carried out to obtain an aluminum phthalocyanine pigment (P-7) represented by the following formula, except that, in the production of the aluminum phthalocyanine pigment (P-3) described above, 100 parts by mass of the aluminum phthalocyanine pigment (P-1) was changed to 100 parts by mass of chloroaluminum phthalocyanine same as that obtained in Production Example 1-1, and 31 parts by mass of diphenyl phosphate was changed to 52 parts by mass of diphenyl phosphate.

The obtained aluminum phthalocyanine pigment (P-7) did not have a halogen substituent on the phthalocyanine ring. The volume average primary particle diameter of the obtained aluminum phthalocyanine pigment (P-7) was 37 nm.

<Production of Phthalocyanine Pigment Derivative>

Production Example 2-1

(Production of Phthalocyanine Pigment Derivative (PD-1))

50 parts by mass of chloroaluminum phthalocyanine same as that obtained in Production Example 1-1 was dissolved in 500 parts by mass of 98% sulfuric acid, and the mixture was stirred at 80° C. for 6 hours. After allowing to cool to room temperature, this reaction solution was poured into 5000 parts by mass of stirred ice water with stirring, and the precipitate was separated by filtration, washed with water, and dried to obtain a phthalocyanine pigment derivative (PD-1) represented by the following formula. A peak corresponding to the same molecular weight was confirmed from the mass spectrum of the obtained phthalocyanine pigment derivative (PD-1), and it was identified as the target compound.

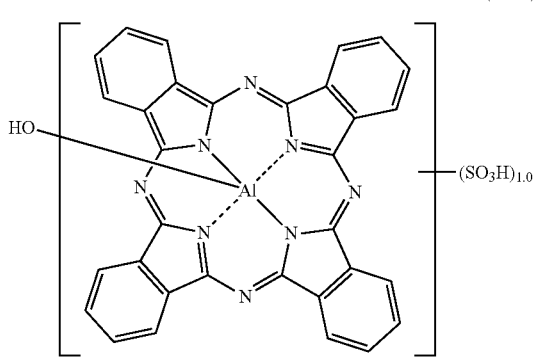

(PD-1)

Production Example 2-2

(Production of Phthalocyanine Pigment Derivative (PD-2))

In a reaction container, 30 parts by mass of the phthalocyanine pigment derivative (PD-1) was added to 750 parts by mass of 98% sulfuric acid in an ice bath. Thereafter, 44.4 parts by mass of 1,3-dibromo-5,5-dimethylhydantoin was gradually added thereto, and the mixture was stirred at 25° C. for 6 hours. Subsequently, this reaction solution was injected into 3000 parts by mass of cold water at 3° C., the formed precipitate was filtered, washed with 1% sodium hydroxide aqueous solution and then water, and dried to obtain a phthalocyanine pigment derivative (PD-2) represented by the following formula.

In a case where the number of substitutions of bromine in the obtained phthalocyanine pigment derivative (PD-2) was calculated, the average number was 6.0 and the average number of substitutions of sulfonic acid was 1.0, a peak corresponding to the same molecular weight was confirmed from the mass spectrum, and it was identified as the target compound.

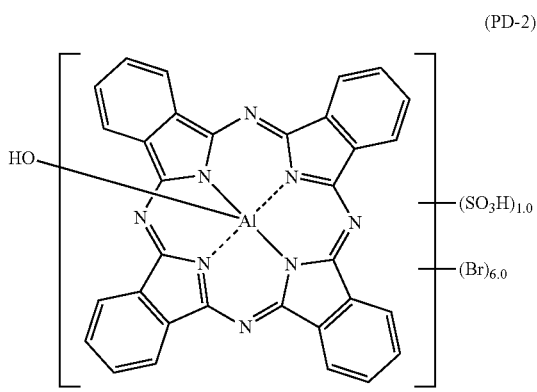

(PD-2)

Production Example 2-3

(Production of Phthalocyanine Pigment Derivative (PD-3))

To a reaction container, 100 parts by mass of N-methylpyrrolidone, 10 parts by mass of the above-described phthalocyanine pigment derivative (PD-2), and 3.9 parts by mass of diphenyl phosphate were added, and the mixture was heated to 90° C. and reacted for 3 hours. After cooling to room temperature, the reaction solution was poured into 1000 parts by mass of water to precipitate a product. The product was filtered, washed with 10000 parts by mass of water, and dried to obtain a phthalocyanine pigment derivative (PD-3) represented by the following formula.

In a case where the number of substitutions of bromine in the obtained phthalocyanine pigment derivative (PD-3) was calculated, the average number was 6.1, the average number of substitutions of sulfonic acid was 1.0, the halogen distribution width was 5, a peak corresponding to the same molecular weight was confirmed from the mass spectrum, and it was identified as the target compound. The volume average primary particle diameter of the obtained phthalocyanine pigment derivative (PD-3) was 50 nm.

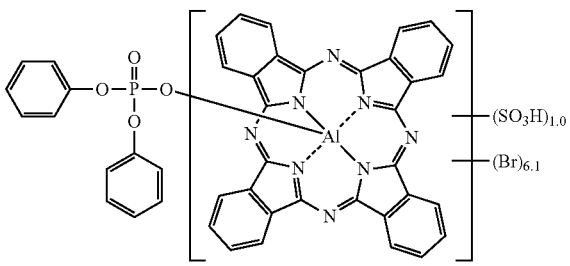

(PD-3)

<Production of Miniaturization Pigment>

Production Example 3-1

(Production of Miniaturization Pigment (PM-1))

100 parts by mass of the aluminum phthalocyanine pigment (P-1) obtained in Production Example 1-1 described above, 1200 parts by mass of sodium chloride, and 120 parts by mass of diethylene glycol were charged into a stainless steel 1-gallon kneader (manufactured by INOUE MFG., INC.) and kneaded at 60° C. for 4 hours. The obtained kneading composition was put into 3000 parts by mass of warm water and stirred for 1 hour to form a slurry, and the slurry was filtered and washed with water repeatedly to remove sodium chloride and diethylene glycol, and dried at 80° C. for 24 hours to obtain a miniaturization pigment (PM-1).

Production Examples 3-2 to 3-18

The same treatment as in Production Example 3-1 was carried out to obtain miniaturization pigments (PM-2) to (PM-8), (PG58M), (PY139M), (PY150M), (PY185M), (PR254M), (PB15:6M), (PB15:31), (PB15:4M), (PB16M), and (PV23M), except that, in Production Example 3-1 described above, the aluminum phthalocyanine pigment (P-1) was changed to the pigments shown in the table below.

TABLE 1

| Production example | Miniaturization pigment | Pigment as raw material |
|---|---|---|
| 3-1 | (PM-1) | Aluminum phthalocyanine pigment (P-1) |
| 3-2 | (PM-2) | Aluminum phthalocyanine pigment (P-2) |
| 3-3 | (PM-3) | Aluminum phthalocyanine pigment (P-3) |
| 3-4 | (PM-4) | Aluminum phthalocyanine pigment (P-4) |
| 3-5 | (PM-5) | Aluminum phthalocyanine pigment (P-5) |
| 3-6 | (PM-6) | Aluminum phthalocyanine pigment (P-6) |
| 3-7 | (PM-7) | Aluminum phthalocyanine pigment (P-7) |

TABLE 1-continued

| Production example | Miniaturization pigment | Pigment as raw material |
|---|---|---|
| 3-8 | (PM-8) | Aluminum phthalocyanine pigment (P-8) |
| 3-9 | (PG58M) | C.I. Pigment Green 58 (PG58) |
| 3-10 | (PY139M) | C.I. Pigment Yellow 139 (PY139) |
| 3-11 | (PY150M) | C.I. Pigment Yellow 150 (PY150) |
| 3-12 | (PY185M) | C.I. Pigment Yellow 185 (PY185) |
| 3-13 | (PR254M) | C.I. Pigment Red 254 (PR254) |
| 3-14 | (PB15:6M) | C.I. Pigment Blue 15:6 (PB15:6) |
| 3-15 | (PB15:3M) | C.I. Pigment Blue 15:3 (PB15:3) |
| 3-16 | (PB15:4M) | C.I. Pigment Blue PB15:4 (PB15:4) |
| 3-17 | (PB16) | C.I. Pigment Blue 16 (PB16) |
| 3-18 | (PV23M) | C.I. Pigment Violet 23 (PV23) |

<Production of Polymer Dispersant>

Production Example 4-1

(Production of Polymer Dispersant (D-1))

75 parts by mass of methyl methacrylate, 75 parts by mass of n-butyl acrylate, and 68.1 parts by mass of propylene glycol monomethyl ether acetate (PGMEA) were charged into a reaction container equipped with gas inlet pipe, thermometer, condenser, and stirrer, and the atmosphere in the reaction container was replaced with nitrogen gas. The inside of the reaction container was heated to 70° C. 9 parts by mass of 3-mercapto-1,2-propanediol was added thereto, 0.18 parts by mass of azobisisobutyronitrile (AIBN) was further added thereto, and the mixture was reacted for 12 hours. It was confirmed by solid content measurement that 95% thereof was reacted. Subsequently, 14.6 parts by mass of pyromellitic acid anhydride, 105.5 parts by mass of PGMEA, and 0.3 parts by mass of 1,8-diazabicyclo-[5.4.0]-7-undecene (DBU) as a reaction catalyst were added thereto, and the mixture was reacted at 120° C. for 7 hours. It was confirmed by acid value measurement that 98% or more of the acid anhydride was half-esterified, and the reaction was terminated. PGMEA was added thereto to adjust the concentration of solid contents to be 50%, thereby obtaining a solution of a polymer dispersant (D-1) represented by the following formula, having an acid value of 41 mgKOH/g and a weight-average molecular weight of 9000.

Polymer Dispersant (D-1)

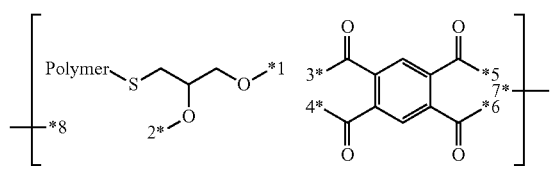

Any one of *1 or *2 is bonded to any one of *3 or *4, and the other is bonded to *8.

Any one of *3 or *4 is bonded to any one of *1 or *2, and the other is bonded to OH.

Any one of *5 or *6 is bonded to *7, and the other is bonded to OH.

*7 is bonded to any of *5 or *6.

*8 is bonded to any of *1 or *2.

In the above figure, the Polymer portion refers to a polymer having the following structure.

Polymer:

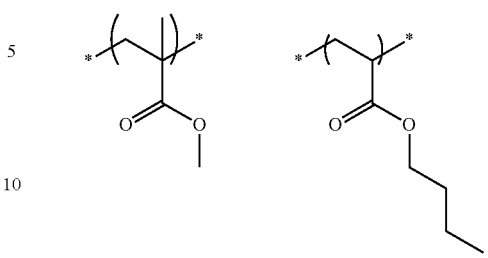

Production Example 4-2

(Production of Polymer Dispersant (D-2))

8 parts by mass of 3-mercapto-1,2-propanediol, 12 parts by mass of pyromellitic acid anhydride, 80 parts by mass of propylene glycol monomethyl ether acetate (PGMEA), and 0.2 parts by mass of monobutyltin oxide as a reaction catalyst were charged into a reaction container equipped with gas inlet pipe, thermometer, condenser, and stirrer, the atmosphere in the reaction container was replaced with nitrogen gas, and the mixture was reacted at 120° C. for 5 hours (first step). It was confirmed by acid value measurement that 95% or more of the acid anhydride was half-esterified. Next, 30 parts by mass of methyl methacrylate, 10 parts by mass of t-butyl acrylate, 10 parts by mass of ethyl acrylate, 5 parts by mass of methacrylic acid, 10 parts by mass of benzyl methacrylate, and 35 parts by mass of 2-hydroxyethyl methacrylate were charged thereto, the inside of the reaction container was heated to 80° C., 1 part by mass of 2,2'-azobis(2,4-dimethylvaleronitrile) was added thereto, and the mixture was reacted for 12 hours (second step). It was confirmed by solid content measurement that 95% thereof was reacted. Next, the inside of a flask was replaced with air, 38.0 parts by mass of 2-methacryloyloxy-ethyl isocyanate and 0.1 parts by mass of hydroquinone were charged thereto, and the mixture was reacted at 70° C. for 4 hours (third step). After confirming by infrared absorption spectroscopy (IR) that the peak of 2270 cm$^{-1}$ based on the isocyanate group disappeared, the reaction solution was cooled, and the solid content was adjusted with PGMEA, thereby obtaining a solution of a polymer dispersant (PD-2) represented by the following formula, having a concentration of solid contents of 40%. The acid value of the obtained polymer dispersant (D-2) was 40 mgKOH/g and the weight-average molecular weight was 12,000.

Polymer Dispersant (D-2)

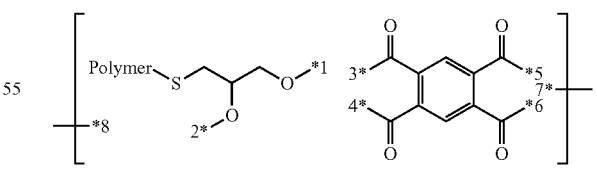

Any one of *1 or *2 is bonded to any one of *3 or *4, and the other is bonded to *8.

Any one of *3 or *4 is bonded to any one of *1 or *2, and the other is bonded to OH.

Any one of *5 or *6 is bonded to *7, and the other is bonded to OH.

*7 is bonded to any of *5 or *6.

*8 is bonded to any of *1 or *2.

In the above figure, the Polymer portion refers to a polymer having the following structure.
Polymer:

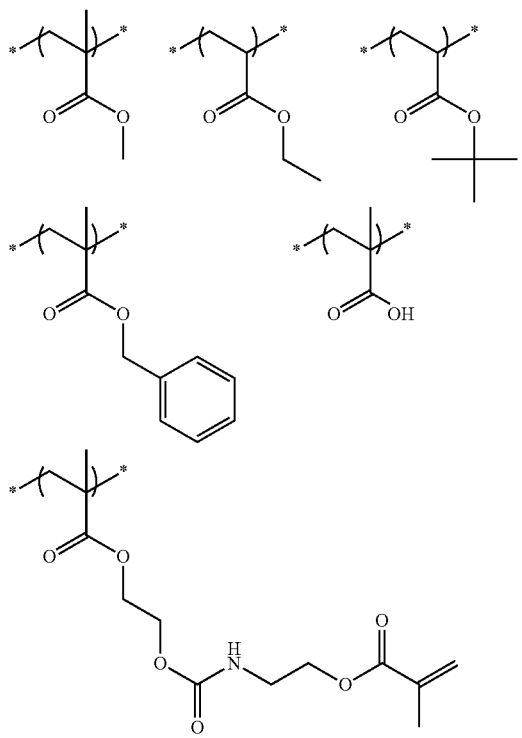

Production Example 4-3

(Production of Polymer Dispersant (D-3))

19.8 parts by mass of xylene, 2.1 parts by mass of octanol, 77.9 parts by mass of 8-caprolactone, and 0.16 parts by mass of tetrabutyl titanate were charged into a reaction container equipped with stirrer, reflux condenser, gas inlet pipe, thermometer, and dropping funnel, the mixture was heated to 150° C. to 160° C. and reacted for 5 hours under a nitrogen gas atmosphere, and after confirming that the heating residue was 78% or more, the mixture was cooled to obtain polyester monool. 31.86 parts by mass of the obtained polyester monool and 0.98 parts by mass of trimellitic acid anhydride were charged into a reaction container, and the reaction was carried out at 150° C. to 160° C. under a nitrogen atmosphere. In a case where the acid value of the resin was 22.7 or less, 2.55 parts by mass of YED122 (manufactured by Mitsubishi Chemical Corporation, trade name: alkylphenol monoglycidyl ether, epoxy equivalent: 250) was charged thereto, and the reaction was carried out at the same temperature. In a case where the acid value of the resin was 1.1 or less, 1.96 parts by mass of trimellitic acid anhydride was charged thereto and the reaction was carried out at the same temperature, in a case where the acid value of the resin was 38.7 or less, 5.1 parts by mass of YED122 was charged thereto and the reaction was carried out at the same temperature, in a case where the acid value of the resin was 1.8 or less, 3.92 parts by mass of trimellitic acid anhydride was charged thereto and the reaction was carried out at the same temperature, and in a case where the acid value of the resin was 60.1 mgKOH/g or less, the mixture was cooled, 53.6 parts by mass of xylene was added thereto, and the reaction was terminated. PGMEA was added to the polymer dispersant synthesized in this procedure so that the concentration of solid contents was 50 mass %, thereby obtaining a solution of a polyester-type polymer dispersant (D-3) having an acid value of 60 mgKOH/g and a weight-average molecular weight of 11000.

Production Example 4-4

(Production of Polymer Dispersant (D-4))

A polymer dispersant (D-4) represented by the following formula was obtained by a procedure according to the production method described in JP2009-256572A. The acid value of the resin of this polymer dispersant (D-4) was 50 mgKOH/g and the weight-average molecular weight was 21000.

Polymer Dispersant (D-4)

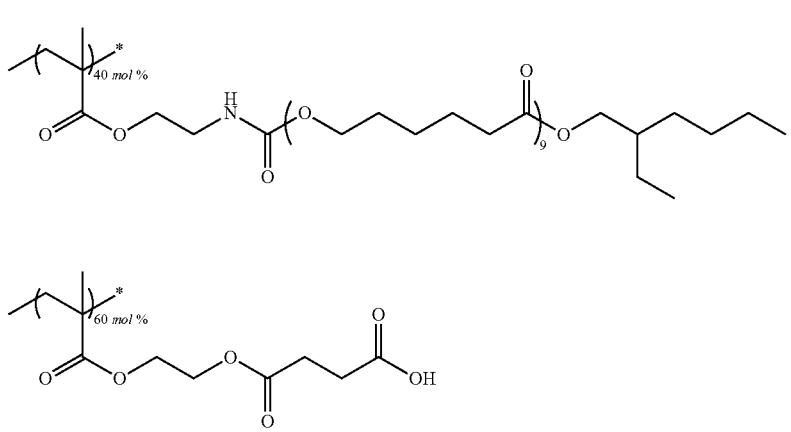

Production Example 4-5

(Production of Polymer Dispersant (D-5))

A polymer dispersant (D-5) represented by the following formula was produced by a procedure according to the production method described in JP2009-203462A. The acid value of the resin of the polymer dispersant (D-5) was 35 mgKOH/g, the amine value of the resin was 45 mgKOH/g, and the weight-average molecular weight was 21000.

Polymer Dispersant (D-5)

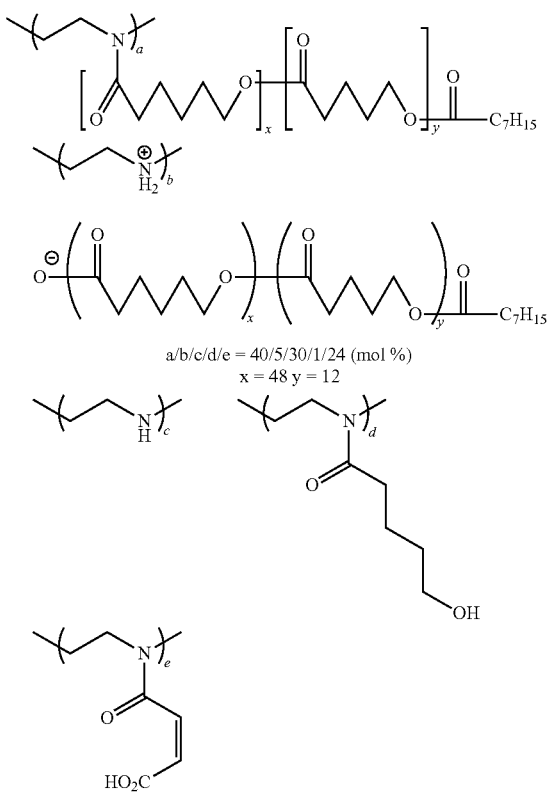

a/b/c/d/e = 40/5/30/1/24 (mol %)
x = 48 y = 12

Production Example 4-6

(Production of Polymer Dispersant (D-6))

300 parts by mass of 2-hydroxyethyl methacrylate, 1315 parts by mass of a ε-caprolactone monomer, 0.33 parts by mass of methylhydroquinone, and 0.01 parts by mass of monobutyltin oxide were charged into a reaction container equipped with air inlet pipe, condenser, and stirrer, the mixture was heated to 120° C. while flowing dry air, and the temperature was maintained for 2 hours. After confirming the disappearance of the caprolactone monomer, the reaction solution was cooled to 40° C. or lower, 111 parts by mass of polyphosphoric acid with an orthophosphoric acid equivalent content of 116% was mixed therewith, and the mixture was gradually heated to 80° C. for 6 hours with stirring, thereby obtaining a phosphoric acid ester-based polymer dispersant (D-6). The acid value of the polymer dispersant (D-6) was 100 mgKOH/g.

<Production of Pigment Dispersion Liquid>

Production Example 5-1

(Production of Pigment Dispersion Liquid (GB-1))

A mixture having the following composition was stirred and mixed so as to be uniform, and then using zirconia beads having a diameter of 0.5 mm, the mixture was dispersed for 3 hours with an Eiger mill ("Mini Model M-250 MKII" manufactured by Eiger Japan Co., Ltd.). Thereafter, the obtained mixture was filtered through a filter having a pore size of 5.0 μm to produce a pigment dispersion liquid (GB-1).

Miniaturization pigment (PM-1): 11.0 parts by mass
Derivative 1: 0.6 parts by mass
Polymer dispersant (D-1): 2.0 parts by mass
Resin 1: 2.1 parts by mass
PGMEA: 84.3 parts by mass The derivative 1 and the resin 1 represent compound represented by the following structural formulae. The weight-average molecular weight of the resin 1 is 21000.

In the resin 1 represented by the following structural formula, a repeating unit shown at the rightmost terminal corresponds to a repeating unit derived from para-cumylphenol ethylene oxide-modified acrylate (ARONIX M-110 manufactured by TOAGOSEI CO., LTD.).

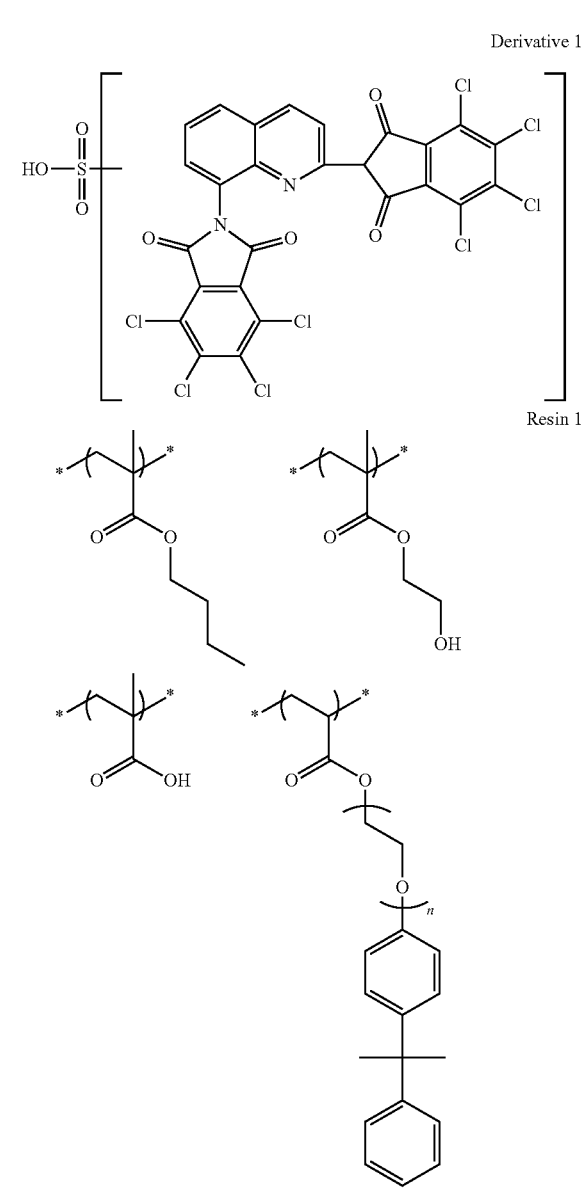

n is an interger of 1 or 2.

Production Examples 5-2 to 5-27

(Production of Pigment Dispersion Liquids (GB-2) to (GB-18), (YB-1) to (YB-3), (RB-1), (BB-1) to (BB-4), and (VB-1))

Pigment dispersion liquids (GB-2) to (GB-18), (YB-1) to (YB-3), (RB-1), (BB-1) to (BB-4), and (VB-1) were produced in the same manner as in Production Example 5-1 described above, except that the types and amounts (parts by mass) of the miniaturization pigments, derivatives, polymer dispersants, resins, and solvents used were changed as shown in the table below.

TABLE 2

| Production example | Pigment dispersion liquid | Miniaturization pigment Type | Part by mass | Pigment derivative Type | Part by mass | Polymer dispersant Type | Part by mass | Resin Type | Part by mass | Solvent Type | Part by mass |
|---|---|---|---|---|---|---|---|---|---|---|---|
| 5-1 | (GB-1) | (PM-1) | 11.0 | Derivative 1 | 0.6 | (D-1) | 2.0 | Resin 1 | 2.1 | PGMEA | 84.3 |
| 5-2 | (GB-2) | (PM-2) | 11.0 | Derivative 1 | 0.6 | (D-1) | 2.0 | Resin 1 | 2.1 | PGMEA | 84.3 |
| 5-3 | (GB-3) | (PM-3) | 11.0 | Derivative 1 | 0.6 | (D-1) | 2.0 | Resin 1 | 2.1 | PGMEA | 84.3 |
| 5-4 | (GB-4) | (PM-4) | 11.0 | Derivative 1 | 0.6 | (D-1) | 2.0 | Resin 1 | 2.1 | PGMEA | 84.3 |
| 5-5 | (GB-5) | (PM-5) | 11.0 | Derivative 1 | 0.6 | (D-1) | 2.0 | Resin 1 | 2.1 | PGMEA | 84.3 |
| 5-6 | (GB-6) | (PM-6) | 11.0 | Derivative 1 | 0.6 | (D-1) | 2.0 | Resin 1 | 2.1 | PGMEA | 84.3 |
| 5-7 | (GB-7) | (PM-7) | 11.0 | Derivative 1 | 0.6 | (D-1) | 2.0 | Resin 1 | 2.1 | PGMEA | 84.3 |
| 5-8 | (GB-8) | (PM-8) | 11.0 | Derivative 1 | 0.6 | (D-1) | 2.0 | Resin 1 | 2.1 | PGMEA | 84.3 |
| 5-9 | (GB-9) | (PM-3) | 11.0 | (PD-1) | 0.6 | (D-1) | 2.0 | Resin 1 | 2.1 | PGMEA | 84.3 |
| 5-10 | (GB-10) | (PM-3) | 11.0 | (PD-2) | 0.6 | (D-1) | 2.0 | Resin 1 | 2.1 | PGMEA | 84.3 |
| 5-11 | (GB-11) | (PM-3) | 11.0 | (PD-3) | 0.6 | (D-1) | 2.0 | Resin 1 | 2.1 | PGMEA | 84.3 |
| 5-12 | (GB-12) | (PM-3) | 11.0 | (PD-3) | 0.6 | (D-2) | 2.0 | Resin 1 | 2.1 | PGMEA | 84.3 |
| 5-13 | (GB-13) | (PM-3) | 11.0 | (PD-3) | 0.6 | (D-3) | 2.0 | Resin 1 | 2.1 | PGMEA | 84.3 |
| 5-14 | (GB-14) | (PM-3) | 11.0 | (PD-3) | 0.6 | (D-4) | 2.0 | Resin 1 | 2.1 | PGMEA | 84.3 |
| 5-15 | (GB-15) | (PM-3) | 11.0 | (PD-3) | 0.6 | (D-5) | 2.0 | Resin 1 | 2.1 | PGMEA | 84.3 |
| 5-16 | (GB-16) | (PM-3) | 11.0 | (PD-3) | 0.6 | (D-6) | 2.0 | Resin 1 | 2.1 | PGMEA | 84.3 |
| 5-17 | (GB-17) | (PM-3) | 11.0 | (PD-3) | 0.6 | (D-2)/(D-6) | 1.0/1.0 | Resin 1 | 2.1 | PGMEA | 84.3 |
| 5-18 | (GB-18) | (PG58M) | 11.0 | Derivative 1 | 0.6 | (D-1) | 2.0 | Resin 1 | 2.1 | PGMEA | 84.3 |
| 5-19 | (YB-1) | (PY139M) | 11.0 | Derivative 1 | 0.6 | (D-2) | 2.0 | Resin 1 | 1.5 | PGMEA | 84.9 |
| 5-20 | (YB-2) | (PY150M) | 11.0 | Derivative 1 | 0.6 | (D-2) | 2.0 | Resin 1 | 1.5 | PGMEA | 84.9 |
| 5-21 | (YB-3) | (PY185M) | 11.0 | Derivative 1 | 0.6 | (D-2) | 2.0 | Resin 1 | 1.5 | PGMEA | 84.9 |
| 5-22 | (RB-1) | (PR254M) | 11.0 | Derivative 1 | 0.6 | (D-2) | 2.0 | Resin 1 | 1.5 | PGMEA | 84.9 |
| 5-23 | (BB-1) | (PB15:6M) | 11.0 | Derivative 2 | 0.6 | (D-2) | 2.0 | Resin 1 | 1.5 | PGMEA | 84.9 |
| 5-24 | (BB-2) | (PB15:3M) | 11.0 | Derivative 2 | 0.6 | (D-2) | 2.0 | Resin 1 | 1.5 | PGMEA | 84.9 |
| 5-25 | (BB-3) | (PB15:4M) | 11.0 | Derivative 2 | 0.6 | (D-2) | 2.0 | Resin 1 | 1.5 | PGMEA | 84.9 |
| 5-26 | (BB-4) | (PB16M) | 11.0 | Derivative 2 | 0.6 | (D-2) | 2.0 | Resin 1 | 1.5 | PGMEA | 84.9 |
| 5-27 | (VB-1) | (PV23M) | 11.0 | Derivative 3 | 0.6 | (D-2) | 2.0 | Resin 1 | 1.5 | PGMEA | 84.9 |

In the above table, the derivative 2 and the derivative 3 are compounds having the following structures.

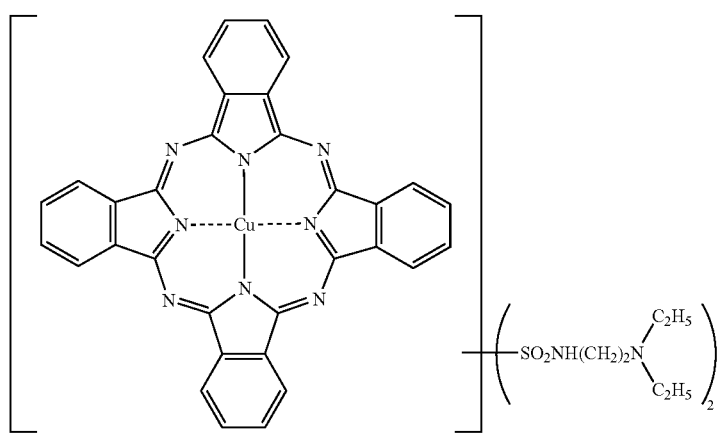

Derivative 2

-continued

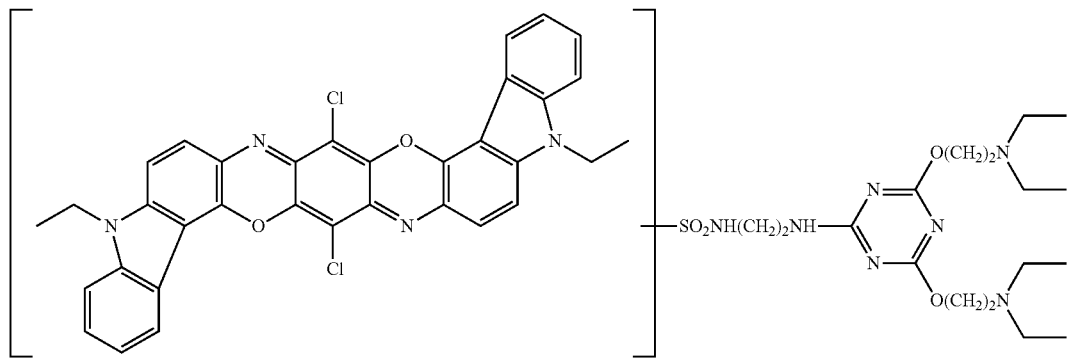

Derivative 2

<Production of Composition for Forming Pixel>

Production Example 6-1

(Production of Composition for Forming Pixel (GR-1))

A mixture having the following composition was stirred and mixed so as to be uniform, and then filtered through a filter having a pore size of 1 μm to produce a composition (GR-1) for forming a pixel.

Pigment dispersion liquid (GB-1): 50.0 parts by mass
Resin 1: 1.5 parts by mass
Polymerizable monomer (M-1): 2.0 parts by mass
Photopolymerization initiator (I-1): 0.7 parts by mass
Ultraviolet absorber (U-1): 1.4 parts by mass
Surfactant (S-1): 0.1 parts by mass
Polymerization inhibitor (IN-1): 0.005 parts by mass
PGMEA: 44.3 parts by mass Abbreviations for the various materials represent the following.

Polymerizable monomer (M-1): 7:3 mixture of dipentaerythritol hexaacrylate (DPHA) and dipentaerythritol pentaacrylate (manufactured by Nippon Kayaku Co., Ltd., KAYARAD DPHA)

Photopolymerization initiator (I-1): Irgacure OXE-01 (manufactured by BASF)

Ultraviolet absorber (U-1): triazine-based ultraviolet absorber "Tinuvin 477" (manufactured by BASF)

Surfactant (S-1): compound having the following structure (fluorine-based surfactant, weight-average molecular weight=14000; "%" representing the proportion of a repeating unit is mol %)

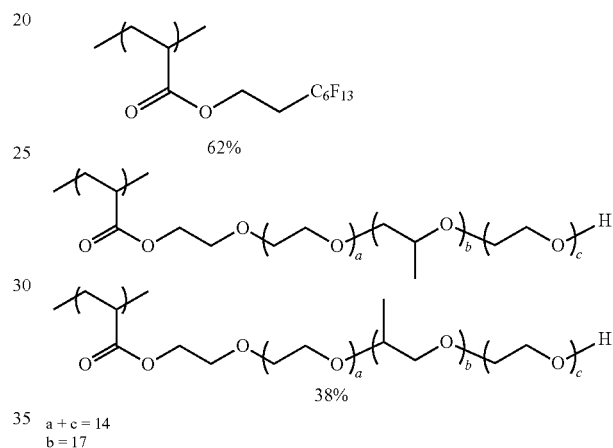

$a + c = 14$
$b = 17$

Polymerization inhibitor (IN-1): p-methoxyphenol

Production Examples 6-2 to 6-36

(Production of Compositions (GR-2) to (GR-31), (RR-1), and (BR-1) to (BR-4) for Forming Pixel)

Compositions (GR-2) to (GR-31), (RR-1), and (BR-1) to (BR-4) for forming pixel were produced in the same manner as in Production Example 6-1 described above, except that the materials used were changed as shown in the tables below.

TABLE 3

| Production example | Composition for forming pixel | Pigment dispersion liquid 1 | | Pigment dispersion liquid 2 | | Resin | |
|---|---|---|---|---|---|---|---|
| | | Type | Part by mass | Type | Part by mass | Type | Part by mass |
| 6-1 | (GR-1) | (GB-1) | 50.0 | | | Resin 1 | 1.5 |
| 6-2 | (GR-2) | (GB-2) | 50.0 | | | Resin 1 | 1.5 |
| 6-3 | (GR-3) | (GB-3) | 50.0 | | | Resin 1 | 1.5 |
| 6-4 | (GR-4) | (GB-4) | 50.0 | | | Resin 1 | 1.5 |
| 6-5 | (GR-5) | (GB-5) | 50.0 | | | Resin 1 | 1.5 |
| 6-6 | (GR-6) | (GB-6) | 50.0 | | | Resin 1 | 1.5 |
| 6-7 | (GR-7) | (GB-7) | 50.0 | | | Resin 1 | 1.5 |
| 6-8 | (GR-8) | (GB-8) | 50.0 | | | Resin 1 | 1.5 |
| 6-9 | (GR-9) | (GB-9) | 50.0 | | | Resin 1 | 1.5 |
| 6-10 | (GR-10) | (GB-10) | 50.0 | | | Resin 1 | 1.5 |
| 6-11 | (GR-11) | (GB-11) | 50.0 | | | Resin 1 | 1.5 |

TABLE 3-continued

| Production example | Composition for forming pixel | Pigment dispersion liquid 1 Type | Part by mass | Pigment dispersion liquid 2 Type | Part by mass | Resin Type | Part by mass |
|---|---|---|---|---|---|---|---|
| 6-12 | (GR-12) | (GB-12) | 50.0 | | | Resin 1 | 1.5 |
| 6-13 | (GR-13) | (GB-13) | 50.0 | | | Resin 1 | 1.5 |
| 6-14 | (GR-14) | (GB-14) | 50.0 | | | Resin 1 | 1.5 |
| 6-15 | (GR-15) | (GB-15) | 50.0 | | | Resin 1 | 1.5 |
| 6-16 | (GR-16) | (GB-16) | 50.0 | | | Resin 1 | 1.5 |
| 6-17 | (GR-17) | (GB-17) | 50.0 | | | Resin 1 | 1.5 |
| 6-18 | (GR-18) | (GB-12) | 50.0 | | | Resin 1 | 1.5 |
| 6-19 | (GR-19) | (GB-12) | 50.0 | | | Resin 1 | 1.5 |
| 6-20 | (GR-20) | (GB-12) | 50.0 | | | Resin 1 | 1.5 |
| 6-21 | (GR-21) | (GB-12) | 50.0 | | | Resin 1 | 1.6 |
| 6-22 | (GR-22) | (GB-12) | 50.0 | | | Resin 1 | 1.7 |
| 6-23 | (GR-23) | (GB-12) | 50.0 | | | Resin 1 | 1.7 |
| 6-24 | (GR-24) | (GB-12) | 50.0 | | | Resin 1 | 1.6 |
| 6-25 | (GR-25) | (GB-12) | 50.0 | | | Resin 1 | 1.5 |
| 6-26 | (GR-26) | (GB-12) | 50.0 | | | Resin 1/Resin 2 | 1.0/0.5 |
| 6-27 | (GR-27) | (GB-12) | 50.0 | | | Resin 1/Resin 2 | 1.0/0.5 |
| 6-28 | (GR-28) | (GB-12) | 50.0 | | | Resin 1/Resin 2 | 1.0/0.5 |
| 6-29 | (GR-29) | (GB-12) | 50.0 | | | Resin 1/Resin 2 | 1.0/0.5 |
| 6-30 | (GR-30) | (GB-12) | 40.0 | (YB-1) | 10.0 | Resin 1 | 1.6 |
| 6-31 | (GR-31) | (GB-12) | 30.0 | (GB-18) | 20.0 | Resin 1 | 1.6 |
| 6-32 | (RR-1) | (RB-1) | 35.0 | (YB-1) | 15.0 | Resin 1 | 1.5 |
| 6-33 | (BR-1) | (BB-1) | 40.0 | (VB-1) | 10.0 | Resin 1 | 1.5 |
| 6-34 | (BR-2) | (BB-2) | 50.0 | | | Resin 1 | 1.5 |
| 6-35 | (BR-3) | (BB-3) | 50.0 | | | Resin 1 | 1.5 |
| 6-36 | (BR-4) | (BB-4) | 50.0 | | | Resin 1 | 1.5 |

TABLE 4

| Production example | Composition for forming pixel | Polymerizable monomer Type | Part by mass | Photopolymerization initiator Type | Part by mass | Ultraviolet absorber Type | Part by mass |
|---|---|---|---|---|---|---|---|
| 6-1 | (GR-1) | (M-1) | 2.0 | (I-1) | 0.7 | (U-1) | 1.4 |
| 6-2 | (GR-2) | (M-1) | 2.0 | (I-1) | 0.7 | (U-1) | 1.4 |
| 6-3 | (GR-3) | (M-1) | 2.0 | (I-1) | 0.7 | (U-1) | 1.4 |
| 6-4 | (GR-4) | (M-1) | 2.0 | (I-1) | 0.7 | (U-1) | 1.4 |
| 6-5 | (GR-5) | (M-1) | 2.0 | (I-1) | 0.7 | (U-1) | 1.4 |
| 6-6 | (GR-6) | (M-1) | 2.0 | (I-1) | 0.7 | (U-1) | 1.4 |
| 6-7 | (GR-7) | (M-1) | 2.0 | (I-1) | 0.7 | (U-1) | 1.4 |
| 6-8 | (GR-8) | (M-1) | 2.0 | (I-1) | 0.7 | (U-1) | 1.4 |
| 6-9 | (GR-9) | (M-1) | 2.0 | (I-1) | 0.7 | (U-1) | 1.4 |
| 6-10 | (GR-10) | (M-1) | 2.0 | (I-1) | 0.7 | (U-1) | 1.4 |
| 6-11 | (GR-11) | (M-1) | 2.0 | (I-1) | 0.7 | (U-1) | 1.4 |
| 6-12 | (GR-12) | (M-1) | 2.0 | (I-1) | 0.7 | (U-1) | 1.4 |
| 6-13 | (GR-13) | (M-1) | 2.0 | (I-1) | 0.7 | (U-1) | 1.4 |
| 6-14 | (GR-14) | (M-1) | 2.0 | (I-1) | 0.7 | (U-1) | 1.4 |
| 6-15 | (GR-15) | (M-1) | 2.0 | (I-1) | 0.7 | (U-1) | 1.4 |
| 6-16 | (GR-16) | (M-1) | 2.0 | (I-1) | 0.7 | (U-1) | 1.4 |
| 6-17 | (GR-17) | (M-1) | 2.0 | (I-1) | 0.7 | (U-1) | 1.4 |
| 6-18 | (GR-18) | (M-2) | 2.0 | (I-1) | 0.7 | (U-1) | 1.4 |
| 6-19 | (GR-19) | (M-3) | 2.0 | (I-1) | 0.7 | (U-1) | 1.4 |
| 6-20 | (GR-20) | (M-1)/(M-3) | 1.0/1.0 | (I-1) | 0.7 | (U-1) | 1.4 |
| 6-21 | (GR-21) | (M-1) | 2.0 | (I-2) | 0.6 | (U-1) | 1.4 |
| 6-22 | (GR-22) | (M-1) | 2.0 | (I-3) | 0.5 | (U-1) | 1.4 |
| 6-23 | (GR-23) | (M-1)/(M-3) | 1.0/1.0 | (I-3) | 0.5 | (U-1) | 1.4 |
| 6-24 | (GR-24) | (M-1) | 2.0 | (I-2)/(I-3) | 0.3/0.3 | (U-1) | 1.4 |
| 6-25 | (GR-25) | (M-2)/(M-3) | 1.0/1.0 | (I-1)/(I-4) | 0.5/0.2 | (U-1) | 1.4 |
| 6-26 | (GR-26) | (M-1)/(M-3) | 1.0/1.0 | (I-1)/(I-4) | 0.5/0.2 | (U-1) | 1.4 |
| 6-27 | (GR-27) | (M-1)/(M-3) | 1.0/1.0 | (I-1)/(I-4) | 0.5/0.2 | (U-1) | 1.4 |
| 6-28 | (GR-28) | (M-1)/(M-3) | 1.0/1.0 | (I-1)/(I-4) | 0.5/0.2 | (U-1) | 1.4 |
| 6-29 | (GR-29) | (M-1)/(M-3) | 1.0/1.0 | (I-5)/(I-6) | 0.4/0.3 | (U-1) | 1.4 |
| 6-30 | (GR-30) | (M-1) | 2.0 | (I-2)/(I-3) | 0.3/0.3 | (U-1) | 1.4 |
| 6-31 | (GR-31) | (M-1) | 2.0 | (I-2)/(I-3) | 0.3/0.3 | (U-1) | 1.4 |
| 6-32 | (RR-1) | (M-1)/(M-3) | 1.0/1.0 | (I-1) | 0.7 | | |
| 6-33 | (BR-1) | (M-2) | 2.0 | (I-1) | 0.7 | | |
| 6-34 | (BR-2) | (M-2) | 2.0 | (I-1) | 0.7 | | |

TABLE 4-continued

| Composition Production example | for forming pixel | Polymerizable monomer Type | Part by mass | Photopolymerization initiator Type | Part by mass | Ultraviolet absorber Type | Part by mass |
|---|---|---|---|---|---|---|---|
| 6-35 | (BR-3) | (M-2) | 2.0 | (I-1) | 0.7 | | |
| 6-36 | (BR-4) | (M-2) | 2.0 | (I-1) | 0.7 | | |

TABLE 5

| Composition Production example | for forming pixel | Surfactant Type | Part by mass | Solvent Type | Part by mass |
|---|---|---|---|---|---|
| 6-1 | (GR-1) | (S-1) | 0.1 | PGMEA | 44.3 |
| 6-2 | (GR-2) | (S-1) | 0.1 | PGMEA | 44.3 |
| 6-3 | (GR-3) | (S-1) | 0.1 | PGMEA | 44.3 |
| 6-4 | (GR-4) | (S-1) | 0.1 | PGMEA | 44.3 |
| 6-5 | (GR-5) | (S-1) | 0.1 | PGMEA | 44.3 |
| 6-6 | (GR-6) | (S-1) | 0.1 | PGMEA | 44.3 |
| 6-7 | (GR-7) | (S-1) | 0.1 | PGMEA | 44.3 |
| 6-8 | (GR-8) | (S-1) | 0.1 | PGMEA | 44.3 |
| 6-9 | (GR-9) | (S-1) | 0.1 | PGMEA | 44.3 |
| 6-10 | (GR-10) | (S-1) | 0.1 | PGMEA | 44.3 |
| 6-11 | (GR-11) | (S-1) | 0.1 | PGMEA | 44.3 |
| 6-12 | (GR-12) | (S-1) | 0.1 | PGMEA | 44.3 |
| 6-13 | (GR-13) | (S-1) | 0.1 | PGMEA | 44.3 |
| 6-14 | (GR-14) | (S-1) | 0.1 | PGMEA | 44.3 |
| 6-15 | (GR-15) | (S-1) | 0.1 | PGMEA | 44.3 |
| 6-16 | (GR-16) | (S-1) | 0.1 | PGMEA | 44.3 |
| 6-17 | (GR-17) | (S-1) | 0.1 | PGMEA | 44.3 |
| 6-18 | (GR-18) | (S-1) | 0.1 | PGMEA | 44.3 |
| 6-19 | (GR-19) | (S-1) | 0.1 | PGMEA | 44.3 |
| 6-20 | (GR-20) | (S-1) | 0.1 | PGMEA | 44.3 |
| 6-21 | (GR-21) | (S-1) | 0.1 | PGMEA | 44.3 |
| 6-22 | (GR-22) | (S-1) | 0.1 | PGMEA | 44.3 |
| 6-23 | (GR-23) | (S-1) | 0.1 | PGMEA | 44.3 |
| 6-24 | (GR-24) | (S-1) | 0.1 | PGMEA | 44.3 |
| 6-25 | (GR-25) | (S-1) | 0.1 | PGMEA | 44.3 |
| 6-26 | (GR-26) | (S-1) | 0.1 | PGMEA | 44.3 |
| 6-27 | (GR-27) | (S-1) | 0.1 | PGMEA/PGME | 22.3/22.0 |
| 6-28 | (GR-28) | (S-1) | 0.1 | PGMEA/CyHx | 14.3/30.0 |
| 6-29 | (GR-29) | (S-1) | 0.1 | PGMEA/PGME | 22.3/22.0 |
| 6-30 | (GR-30) | (S-1) | 0.1 | PGMEA | 44.3 |
| 6-31 | (GR-31) | (S-1) | 0.1 | PGMEA | 44.3 |
| 6-32 | (RR-1) | (S-1) | 0.1 | PGMEA | 44.3 |
| 6-33 | (BR-1) | (S-1) | 0.1 | PGMEA | 44.3 |
| 6-34 | (BR-2) | (S-1) | 0.1 | PGMEA | 44.3 |
| 6-35 | (BR-3) | (S-1) | 0.1 | PGMEA | 44.3 |
| 6-36 | (BR-4) | (S-1) | 0.1 | PGMEA | 44.3 |

In the above tables, abbreviations for the various materials represent the following.

Resin 2: acrylic resin represented by the following formula (weight-average molecular weight: 12000, acid value: 30 mgKOH/g)

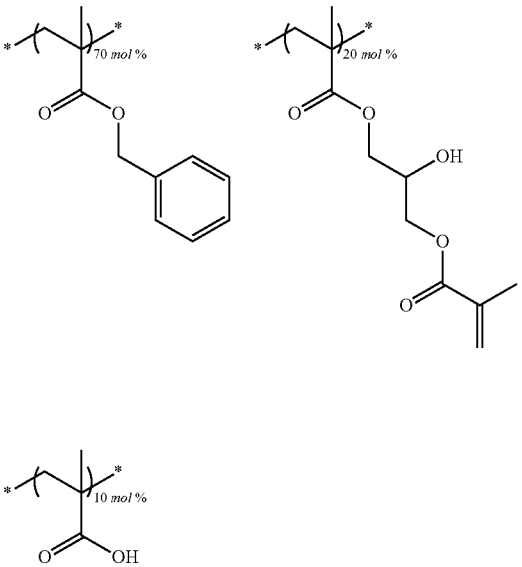

Polymerizable monomer (M-2): trimethylolpropane triacrylate (manufactured by Shin-Nakamura Chemical Co., Ltd., A-TMPT)

Polymerizable monomer (M-3): compound represented by the following formula (manufactured by Shin-Nakamura Chemical Co., Ltd., A-DPH-12E)

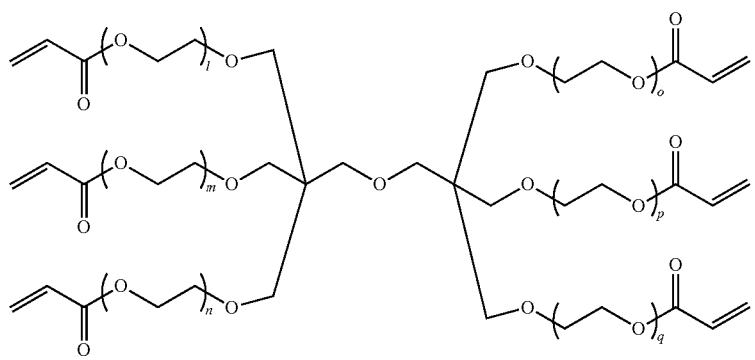

$l + m + n + o + p + q \approx 12$

Photopolymerization initiator (I-2): Irgacure OXE-02 (manufactured by BASF)

Photopolymerization initiator (I-3): compound having the following structure

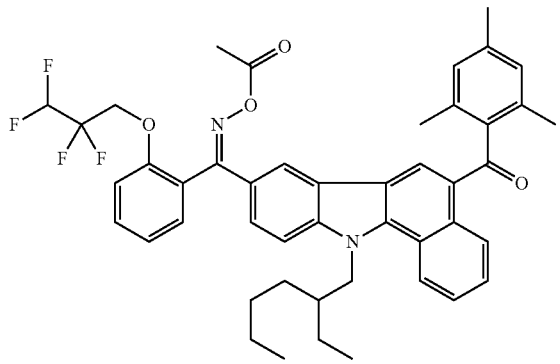 [SMILES: CCCCC(CC)Cn1c2ccc(/C(=N\OC(C)=O)c3ccccc3OCC(F)(F)C(F)F)cc2c2cc(C(=O)c3c(C)cc(C)cc3C)c3ccccc3c21]

Photopolymerization initiator (I-4): Omnirad 369 (manufactured by IGM Resins B.V.)

Photopolymerization initiator (I-5): compound having the following structure

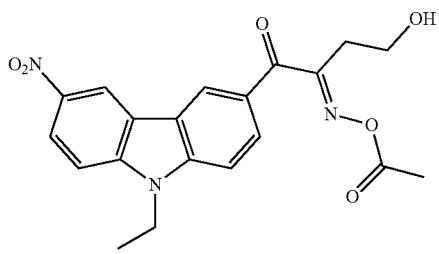 [SMILES: CCn1c2ccc(C(=O)/C(CCO)=N/OC(C)=O)cc2c2cc([N+](=O)[O-])ccc21]

Photopolymerization initiator (I-6): compound having the following structure

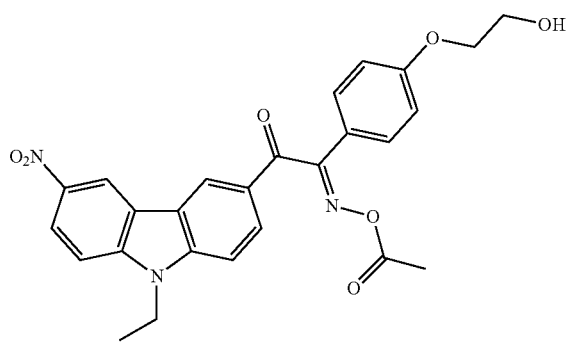 [SMILES: CCn1c2ccc(C(=O)/C(=N/OC(C)=O)c3ccc(OCCO)cc3)cc2c2cc([N+](=O)[O-])ccc21]

<Production of Composition for Forming Ultraviolet Absorbing Layer>

Production Example 7-1

(Production of Composition (UR-1) for Forming Ultraviolet Absorbing Layer)

A mixture having the following composition was stirred and mixed so as to be uniform, and then filtered through a filter having a pore size of 1 μm to produce a composition (UR-1) for forming an ultraviolet absorbing layer.

Pigment dispersion liquid (YB-1): 50.0 parts by mass
Resin 1: 1.5 parts by mass
Polymerizable monomer (M-1): 2.0 parts by mass
Photopolymerization initiator (I-1): 0.7 parts by mass
Ultraviolet absorber (U-1): 1.4 parts by mass
Surfactant (S-1): 0.1 parts by mass
Polymerization inhibitor (IN-1): 0.005 parts by mass
PGMEA: 44.3 parts by mass Production Example 7-2

(Production of Composition (UR-2) for Forming Ultraviolet Absorbing Layer)

A composition (UR-2) for forming an ultraviolet absorbing layer was produced in the same manner as in Production Example 7-1 described above, except that the pigment dispersion liquid (YB-1) was changed to the same amount of the pigment dispersion liquid (YB-2).

Production Example 7-3

(Production of Composition (UR-3) for Forming Ultraviolet Absorbing Layer)

A composition (UR-3) for forming an ultraviolet absorbing layer was produced in the same manner as in Production Example 7-1 described above, except that the pigment dispersion liquid (YB-1) was changed to the same amount of the pigment dispersion liquid (YB-3).

Production Example 7-4

(Production of Composition (UR-4) for Forming Ultraviolet Absorbing Layer)

A mixture having the following composition was stirred and mixed so as to be uniform, and then filtered through a filter having a pore size of 0.1 μm to produce a composition (UR-4) for forming an ultraviolet absorbing layer.

Ultraviolet absorber (U-1): 11.0 parts by mass
Resin 1: 2.1 parts by mass
Polymerizable monomer (M-1): 2.0 parts by mass
Photopolymerization initiator (I-1): 0.7 parts by mass
Surfactant (S-1): 0.1 parts by mass
Polymerization inhibitor (IN-1): 0.005 parts by mass
PGMEA: 84.1 parts by mass Production Example 7-5

(Production of Composition (UR-5) for Forming Ultraviolet Absorbing Layer)

A composition (UR-5) for forming an ultraviolet absorbing layer was produced in the same manner as in Production Example 7-4 described above, except that the ultraviolet absorber (U-1) was changed to the same amount of an ultraviolet absorber (U-2).

Ultraviolet absorber (U-2): benzotriazole-based ultraviolet absorber (manufactured by ADEKA Corporation, ADK STAB LA-31RG)

Production Example 7-6

(Production of Composition (UR-6) for Forming Ultraviolet Absorbing Layer)

A composition (UR-6) for forming an ultraviolet absorbing layer was produced in the same manner as in Production Example 7-4 described above, except that the ultraviolet absorber (U-1) was changed to the same amount of an ultraviolet absorber (U-3).

Ultraviolet absorber (U-3): benzophenone-based ultraviolet absorber (manufactured by Sumika Chemtex Co., Ltd., Sumisorb 130)

Production Example 7-7

(Production of Composition (UR-7) for Forming Ultraviolet Absorbing Layer)

A mixture having the following composition was stirred and mixed so as to be uniform, and then filtered through a filter having a pore size of 1 μm to produce a composition (UR-7) for forming an ultraviolet absorbing layer.
Pigment dispersion liquid (YB-1): 51.7 parts by mass
Resin 1: 1.5 parts by mass
Polymerizable monomer (M-1): 2.0 parts by mass
Photopolymerization initiator (I-1): 0.4 parts by mass
Surfactant (S-1): 0.1 parts by mass
Polymerization inhibitor (IN-1): 0.005 parts by mass
PGMEA: 44.3 parts by mass Production Example 7-8

(Production of Composition (UR-8) for Forming Ultraviolet Absorbing Layer)

A mixture having the following composition was stirred and mixed so as to be uniform, and then filtered through a filter having a pore size of 1 μm to produce a composition (UR-8) for forming an ultraviolet absorbing layer.
Pigment dispersion liquid (YB-1): 25.0 parts by mass
Pigment dispersion liquid (YB-3): 25.0 parts by mass
Resin 1: 1.5 parts by mass
Polymerizable monomer (M-1): 2.0 parts by mass
Photopolymerization initiator (I-1): 0.7 parts by mass
Ultraviolet absorber (U-1): 1.4 parts by mass
Surfactant (S-1): 0.1 parts by mass
Polymerization inhibitor (IN-1): 0.005 parts by mass
PGMEA: 44.3 parts by mass Production Example 7-9

(Production of Composition (UR-9) for Forming Ultraviolet Absorbing Layer)

A mixture having the following composition was stirred and mixed so as to be uniform, and then filtered through a filter having a pore size of 0.1 μm to produce a composition (UR-9) for forming an ultraviolet absorbing layer.
Ultraviolet absorber (U-2): 5.5 parts by mass
Ultraviolet absorber (U-3): 5.5 parts by mass
Resin 1: 2.1 parts by mass
Polymerizable monomer (M-1): 2.0 parts by mass
Photopolymerization initiator (I-1): 0.7 parts by mass
Surfactant (S-1): 0.1 parts by mass
Polymerization inhibitor (IN-1): 0.005 parts by mass
PGMEA: 84.1 parts by mass Production Example 7-10

(Production of Composition (UR-1) for Forming Ultraviolet Absorbing Layer)

A mixture having the following composition was stirred and mixed so as to be uniform, and then filtered through a filter having a pore size of 1 μm to produce a composition (UR-10) for forming an ultraviolet absorbing layer.
Pigment dispersion liquid (YB-1): 90.0 parts by mass
Resin 1: 0.5 parts by mass
Polymerizable monomer (M-1): 1.2 parts by mass
Photopolymerization initiator (I-1): 0.4 parts by mass
Ultraviolet absorber (U-1): 0.8 parts by mass
Surfactant (S-1): 0.1 parts by mass
Polymerization inhibitor (IN-1): 0.005 parts by mass
PGMEA: 5.3 parts by mass <Evaluation of Color Filter>

Example 1

(Manufacturing of Color Filter)

The composition (GR-1) for forming a pixel produced in Production Example 6-1 described above was applied to a glass wafer using a spin coater such that the thickness of a film after drying was 0.4 μm, and a heating treatment (pre-baking) was performed for 120 seconds using a hot plate at 100° C.

Next, using an i-ray stepper exposure device FPA-3000 i5+ (manufacture by Canon Corporation), exposure was performed with 50 mJ/cm² steps from 50 to 1500 mJ/cm² through a photo mask in which a 1.1 μm square Bayer pattern was formed, and after determining the optimum exposure amount for resolving the square pixel pattern, exposure was performed with this optimum exposure amount. Thereafter, the glass wafer on which the exposed coating film was formed was placed on a horizontal rotary table of a spin-shower developing machine (DW-30 Type, manufactured by Chemitronics Co., Ltd.), and subjected to a puddle development at 23° C. for 60 seconds using a developer (CD-2060, manufactured by Fujifilm Electronic Materials Co., Ltd.). Next, rinse treatment was performed with pure water, and spin drying was performed. Next, a heating treatment (post-baking) was performed for 300 seconds using a hot plate at 200° C. to form a green-colored pattern (green pixel) on the glass wafer.

Next, the composition (UR-2) for forming an ultraviolet absorbing layer produced in Production Example 7-2 described above was applied to the glass wafer on which the green pixel was formed using a spin coater such that the thickness of a film after drying was 0.4 μm, and a heating treatment (pre-baking) was performed for 120 seconds using a hot plate at 100° C. to obtain a laminated wafer.

Next, using an i-ray stepper exposure device FPA-3000 i5+ (manufactured by Canon Corporation), exposure was performed with 50 mJ/cm² steps from 50 to 1500 mJ/cm² through a photo mask in which a 1.1 μm square Bayer pattern was formed, and after determining the optimum exposure amount for resolving the square pixel pattern, the alignment was adjusted so that the region exactly the same as the region where the green pixel pattern was formed was exposed, and the layer formed of the composition (UR-2) for forming an ultraviolet absorbing layer on the laminated wafer was exposed at the optimum exposure amount.

Thereafter, the glass wafer on which the exposed coating film was formed was placed on a horizontal rotary table of a spin-shower developing machine (DW-30 Type, manufactured by Chemitronics Co., Ltd.), and subjected to a puddle development at 23° C. for 60 seconds using a developer (CD-2060, manufactured by Fujifilm Electronic Materials Co., Ltd.). Next, rinse treatment was performed with pure water, and spin drying was performed. Next, a heating treatment (post-baking) was performed for 300 seconds using a hot plate at 200° C. to produce a glass wafer in which an ultraviolet absorbing layer was laminated on the green-colored pattern (green pixel).

Subsequently, as the same method, the composition (RR-1) for forming a pixel and the composition (BR-1) for forming a pixel were patterned by the same process, except that the thickness of a film after drying was adjured to 0.8

μm, and a red pixel and a blue pixel were sequentially formed, thereby forming a color filter having a green pixel, a red pixel, and a blue pixel. In this color filter, green pixels were formed in the Bayer pattern, and red pixels and blue pixels were formed in an island pattern in an adjacent region thereof.

(Evaluation of Light Resistance)

Using Super Xenon Weather Meter SX75 (manufactured by Suga Test instruments Co., Ltd.), the above-described color filter was irradiated with light at an illuminance of 100000 lux for 1500 hours to perform a light resistance test. At this time, the color filter was installed so that the light was irradiated to a side where the ultraviolet absorbing layer was laminated.

The chromaticity of the green pixel before and after the light resistance test was measured, and the chromaticity difference ΔEab before and after the light resistance test was determined.

<Evaluation Standard>
5: ΔEab≤1
4: 1<ΔEab≤2
3: 2<ΔEab≤3
2: 3<ΔEab≤5
1: 5<ΔEab ((Evaluation of Foreign Matters)

In the process of manufacturing the color filter described above, after forming the green pixel, the red pixel was then formed on the glass wafer. Thereafter, in a case of forming the blue pixel, instead of the heating treatment (post-baking) at 200° C. for 300 seconds, the heating treatment (post-baking) at 265° C. for 300 seconds was performed, and then a boundary region between the green pixel and the blue pixel was observed with an electron microscope to observe the degree of foreign matter generation, thereby evaluating foreign matters according to the following standard.

<Evaluation Standard>
5: no foreign matter was observed in the boundary region between the green pixel and the blue pixel.
4: no foreign matter having a size of 0.1 μm or more was observed in the boundary region between the green pixel and the blue pixel, but one foreign matter having a size of less than 0.1 μm was observed.
3: no foreign matter having a size of 0.1 μm or more was observed in the boundary region between the green pixel and the blue pixel, but two foreign matters having a size of less than 0.1 μm were observed.
2: no foreign matter having a size of 0.1 μm or more was observed in the boundary region between the green pixel and the blue pixel, but three foreign matters having a size of less than 0.1 μm were observed.
1: four or more foreign matters having a size of less than 0.1 μm were observed in the boundary region between the green pixel and the blue pixel, or one or more foreign matters having a size of 0.1 μm or more were observed.

Examples 2 to 39 and Comparative Example 1

A color filter was manufactured in the same manner as in Example 1 and the light resistance and foreign matters were evaluated, except that the types of the composition for forming a pixel and the composition for forming an ultraviolet absorbing layer were changed to the types shown in the tables below.

Example 4

A color filter was manufactured in the same manner as in Example 1 and the light resistance and foreign matters were evaluated, except that the types of the composition for forming a pixel and the composition for forming an ultraviolet absorbing layer were changed to the types shown in the tables below, and the film thickness of the ultraviolet absorbing layer was 0.2 μm.

TABLE 6

| | | | | Composition for forming pixel | | | |
|---|---|---|---|---|---|---|---|
| | Type | Contained pigment | Contained pigment derivative | Contained polymer dispersant | Contained resin | Contained polymerizable monomer | Contained photo-polymerization initiator |
| Example 1 | (GR-1) | (P-1) | Derivative 1 | (D-1) | Resin 1 | (M-1) | (I-1) |
| Example 2 | (GR-2) | (P-2) | Derivative 1 | (D-1) | Resin 1 | (M-1) | (I-1) |
| Example 3 | (GR-3) | (P-3) | Derivative 1 | (D-1) | Resin 1 | (M-1) | (I-1) |
| Example 4 | (GR-4) | (P-4) | Derivative 1 | (D-1) | Resin 1 | (M-1) | (I-1) |
| Example 5 | (GR-5) | (P-5) | Derivative 1 | (D-1) | Resin 1 | (M-1) | (I-1) |
| Example 6 | (GR-6) | (P-6) | Derivative 1 | (D-1) | Resin 1 | (M-1) | (I-1) |
| Example 7 | (GR-7) | (P-7) | Derivative 1 | (D-1) | Resin 1 | (M-1) | (I-1) |
| Example 8 | (GR-8) | (P-8) | Derivative 1 | (D-1) | Resin 1 | (M-1) | (I-1) |
| Example 9 | (GR-9) | (P-3) | (PD-1) | (D-1) | Resin 1 | (M-1) | (I-1) |
| Example 10 | (GR-10) | (P-3) | (PD-2) | (D-1) | Resin 1 | (M-1) | (I-1) |
| Example 11 | (GR-11) | (P-3) | (PD-3) | (D-1) | Resin 1 | (M-1) | (I-1) |
| Example 12 | (GR-12) | (P-3) | (PD-3) | (D-2) | Resin 1 | (M-1) | (I-1) |
| Example 13 | (GR-13) | (P-3) | (PD-3) | (D-3) | Resin 1 | (M-1) | (I-1) |
| Example 14 | (GR-14) | (P-3) | (PD-3) | (D-4) | Resin 1 | (M-1) | (I-1) |
| Example 15 | (GR-15) | (P-3) | (PD-3) | (D-5) | Resin 1 | (M-1) | (I-1) |
| Example 16 | (GR-16) | (P-3) | (PD-3) | (D-6) | Resin 1 | (M-1) | (I-1) |
| Example 17 | (GR-17) | (P-3) | (PD-3) | (D-2)/(D-6) | Resin 1 | (M-1) | (I-1) |
| Example 18 | (GR-18) | (P-3) | (PD-3) | (D-2) | Resin 1 | (M-2) | (I-1) |
| Example 19 | (GR-19) | (P-3) | (PD-3) | (D-2) | Resin 1 | (M-3) | (I-1) |
| Example 20 | (GR-20) | (P-3) | (PD-3) | (D-2) | Resin 1 | (M-1)/(M-3) | (I-1) |
| Example 21 | (GR-21) | (P-3) | (PD-3) | (D-2) | Resin 1 | (M-1) | (I-2) |
| Example 22 | (GR-22) | (P-3) | (PD-3) | (D-2) | Resin 1 | (M-1) | (I-3) |
| Example 23 | (GR-23) | (P-3) | (PD-3) | (D-2) | Resin 1 | (M-1)/(M-3) | (I-3) |
| Example 24 | (GR-24) | (P-3) | (PD-3) | (D-2) | Resin 1 | (M-1) | (I-2)/(I-3) |
| Example 25 | (GR-25) | (P-3) | (PD-3) | (D-2) | Resin 1 | (M-2)/(M-3) | (I-1)/(I4) |
| Example 26 | (GR-26) | (P-3) | (PD-3) | (D-2) | Resin 1/Resin 2 | (M-1)/(M-3) | (I-1)/(I4) |

TABLE 6-continued

| | | | | | | |
|---|---|---|---|---|---|---|
| Example 27 | (GR-27) (P-3) | (PD-3) | (D-2) | Resin 1/Resin 2 | (M-1)/(M-3) | (I-1)/(I4) |
| Example 28 | (GR-28) (P-3) | (PD-3) | (D-2) | Resin 1/Resin 2 | (M-1)/(M-3) | (I-1)/(I4) |
| Example 29 | (GR-29) (P-3) | (PD-3) | (D-2) | Resin 1/Resin 2 | (M-1)/(M-3) | (I-5)/(I-6) |
| Example 30 | (GR-30) (P-3)/(PY150) | (PD-3) | (D-2) | Resin 1 | (M-1) | (I-2)/(I-3) |

| | Composition for forming ultraviolet absorbing layer | | | |
|---|---|---|---|---|
| | Type | Maximum absorption wavelength of ultraviolet absorbing layer at wavelength of 300 to 450 nm | Minimum value of transmittance of ultraviolet absorbing layer at wavelength shown on left | Light resistance | Foreign matters |
| Example 1 | (UR-2) | 430 nm | 9% | 3 | 3 |
| Example 2 | (UR-2) | 430 nm | 9% | 3 | 3 |
| Example 3 | (UR-2) | 430 nm | 9% | 4 | 3 |
| Example 4 | (UR-2) | 430 nm | 9% | 3 | 3 |
| Example 5 | (UR-2) | 430 nm | 9% | 3 | 3 |
| Example 6 | (UR-2) | 430 nm | 9% | 3 | 3 |
| Example 7 | (UR-2) | 430 nm | 9% | 2 | 3 |
| Example 8 | (UR-2) | 430 nm | 9% | 2 | 3 |
| Example 9 | (UR-2) | 430 nm | 9% | 4 | 4 |
| Example 10 | (UR-2) | 430 nm | 9% | 4 | 4 |
| Example 11 | (UR-2) | 430 nm | 9% | 5 | 4 |
| Example 12 | (UR-2) | 430 nm | 9% | 5 | 5 |
| Example 13 | (UR-2) | 430 nm | 9% | 5 | 4 |
| Example 14 | (UR-2) | 430 nm | 9% | 4 | 3 |
| Example 15 | (UR-2) | 430 nm | 9% | 4 | 3 |
| Example 16 | (UR-2) | 430 nm | 9% | 5 | 4 |
| Example 17 | (UR-2) | 430 nm | 9% | 5 | 5 |
| Example 18 | (UR-2) | 430 nm | 9% | 5 | 5 |
| Example 19 | (UR-2) | 430 nm | 9% | 5 | 5 |
| Example 20 | (UR-2) | 430 nm | 9% | 5 | 5 |
| Example 21 | (UR-2) | 430 nm | 9% | 5 | 5 |
| Example 22 | (UR-2) | 430 nm | 9% | 5 | 5 |
| Example 23 | (UR-2) | 430 nm | 9% | 5 | 5 |
| Example 24 | (UR-2) | 430 nm | 9% | 5 | 5 |
| Example 25 | (UR-2) | 430 nm | 9% | 5 | 5 |
| Example 26 | (UR-2) | 430 nm | 9% | 5 | 5 |
| Example 27 | (UR-2) | 430 nm | 9% | 5 | 5 |
| Example 28 | (UR-2) | 430 nm | 9% | 5 | 5 |
| Example 29 | (UR-2) | 430 nm | 9% | 5 | 5 |
| Example 30 | (UR-2) | 430 nm | 9% | 5 | 5 |

TABLE 7

| | Composition for forming pixel | | | | | |
|---|---|---|---|---|---|---|
| | Type | Contained pigment | Contained pigment derivative | Contained polymer dispersant | Contained resin | Contained polymerizable monomer | Contained photo-polymerization initiator |
| Example 31 | (GR-31) | (P-3)/(PG58) | (PD-3) | (D-2) | Resin 1 | (M-1) | (I-2)/(I-3) |
| Example 32 | (GR-24) | (P-3) | (PD-3) | (D-2) | Resin 1 | (M-1) | (I-2)/(I-3) |
| Example 33 | (GR-24) | (P-3) | (PD-3) | (D-2) | Resin 1 | (M-1) | (I-2)/(I-3) |
| Example 34 | (GR-24) | (P-3) | (PD-3) | (D-2) | Resin 1 | (M-1) | (I-2)/(I-3) |
| Example 35 | (GR-24) | (P-3) | (PD-3) | (D-2) | Resin 1 | (M-1) | (I-2)/(I-3) |
| Example 36 | (GR-24) | (P-3) | (PD-3) | (D-2) | Resin 1 | (M-1) | (I-2)/(I-3) |
| Example 37 | (GR-24) | (P-3) | (PD-3) | (D-2) | Resin 1 | (M-1) | (I-2)/(I-3) |
| Example 38 | (GR-24) | (P-3) | (PD-3) | (D-2) | Resin 1 | (M-1) | (I-2)/(I-3) |
| Example 39 | (GR-24) | (P-3) | (PD-3) | (D-2) | Resin 1 | (M-1) | (I-2)/(I-3) |
| Example 40 | (GR-24) | (P-3) | (PD-3) | (D-2) | Resin 1 | (M-1) | (I-2)/(I-3) |
| Comparative example 1 | (GR-1) | (P-1) | Derivative 1 | (D-1) | Resin 1 | (M-1) | (I-1) |

TABLE 7-continued

| | | Composition for forming ultraviolet absorbing layer | | | |
|---|---|---|---|---|---|
| | Type | Maximum absorption wavelength of ultraviolet absorbing layer at wavelength of 300 to 450 nm | Minimum value of transmittance of ultraviolet absorbing layer at wavelength shown on left | Light resistance | Foreign matters |
| Example 31 | (UR-2) | 430 nm | 9% | 5 | 5 |
| Example 32 | (UR-1) | 430 nm | 6% | 5 | 5 |
| Example 33 | (UR-3) | 430 nm | 5% | 5 | 5 |
| Example 34 | (UR-4) | 355 nm | 3% | 5 | 5 |
| Example 35 | (UR-5) | 350 nm | 4% | 5 | 5 |
| Example 36 | (UR-6) | 335 nm | 3% | 5 | 5 |
| Example 37 | (UR-7) | 430 nm | 6% | 5 | 5 |
| Example 38 | (UR-8) | 430 nm | 6% | 5 | 5 |
| Example 39 | (UR-9) | 355 nm | 3% | 5 | 5 |
| Example 40 | (UR-10) (film thickness: 0.2 um) | 430 nm | 14% | 4 | 5 |
| Comparative example 1 | — | — | — | 1 | 1 |

As shown in the above tables, all of Examples were excellent in the evaluation of foreign matters and light resistance. All of the transmittance of the ultraviolet absorbing layers of Examples 1 to 40 in the wavelength region of 550 to 800 nm were 80% or more.

As the transmittance and the maximal absorption wavelength of the ultraviolet absorbing layer of each example, the composition for forming an ultraviolet absorbing layer shown in the above table was applied to a glass substrate using a spin coater such that the thickness of a film after drying was 0.4 μm (Examples 1 to 39) or 0.2 μm (Example 40), and a heating treatment (pre-baking) was performed for 120 seconds using a hot plate at 100° C. Next, the entire surface of the pre-baked coating film was exposed to i-ray at an exposure amount of 1000 mJ/cm$^2$, and then post-baked using a hot plate at 220° C. for 5 minutes to form a film. Using a spectrophotometer (U-4100, manufactured by Hitachi High-Tech Corporation), the absorbance and transmittance of the obtained film at a wavelength of 300 to 800 nm was measured, and the transmittance in the wavelength region of 550 to 800 nm, the minimum value of the transmittance in a wavelength region of 300 to 450 nm, and the maximum absorption wavelength in the wavelength region of 300 to 450 nm were measured, respectively.

In Example 24, even in a case of using a composition for forming a pixel produced by using a pigment dispersion liquid including the same amount of C. I. Pigment Green 63 instead of the aluminum phthalocyanine pigment (P-3), the same effect as in Example 24 was obtained.

In each example, even in a case where the composition for forming a blue pixel used in the evaluation of foreign matters was changed from (BR-1) to (BR-2), (BR-3), or (BR-4), same as the above table, the generation of foreign matters could be suppressed.

EXPLANATION OF REFERENCES

1: support
2: colored pixel A
3: ultraviolet absorbing layer
4: pixel B
5: partition wall

What is claimed is:

1. A color filter comprising:
    a colored pixel A including an aluminum phthalocyanine pigment; and
    an ultraviolet absorbing layer which is provided on an optical path on a light incident side of the colored pixel A and has a wavelength region having a transmittance of 20% or less in a wavelength range of 300 to 450 nm, in which a transmittance in a wavelength region of 550 to 800 inn is 80% or more.
2. The color filter according to claim 1,
    wherein the ultraviolet absorbing layer is laminated on a surface of the colored pixel A.
3. The color filter according to claim 1,
    wherein the aluminum phthalocyanine pigment is at least one selected from a compound represented by Formula (AL1) or a compound represented by Formula (AL2),

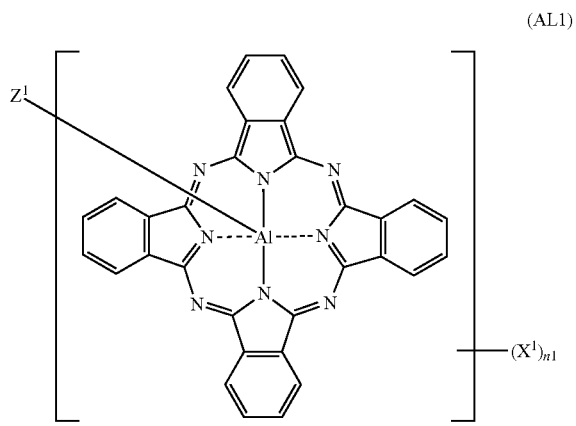

(AL1)

in Formula (AL1), X$^1$ represents a halogen atom,
Z$^1$ represents a hydroxy group, —OP(=O)R$^1$R$^2$, —OC(=O)R$^3$, —OS(=O)$_2$R$^4$, or —O—SiR$^5$R$^6$R$^7$, where R$^1$ and R$^2$ each independently represent a hydroxy group, an alkyl group, an aryl group, a heterocyclic group, an alkoxy group, or an aryloxy group, $R^1$ and $R^2$ may be bonded to each other to form a ring, $R^3$ to $R^7$ each independently represent a hydrogen atom, a hydroxy group, an alkyl group, an aryl group, a heterocyclic group, an alkoxy group, or an aryloxy group, and $R^5$ and $R^6$ may be bonded to each other to form a ring, and n1 represents an integer of 0 to 16,

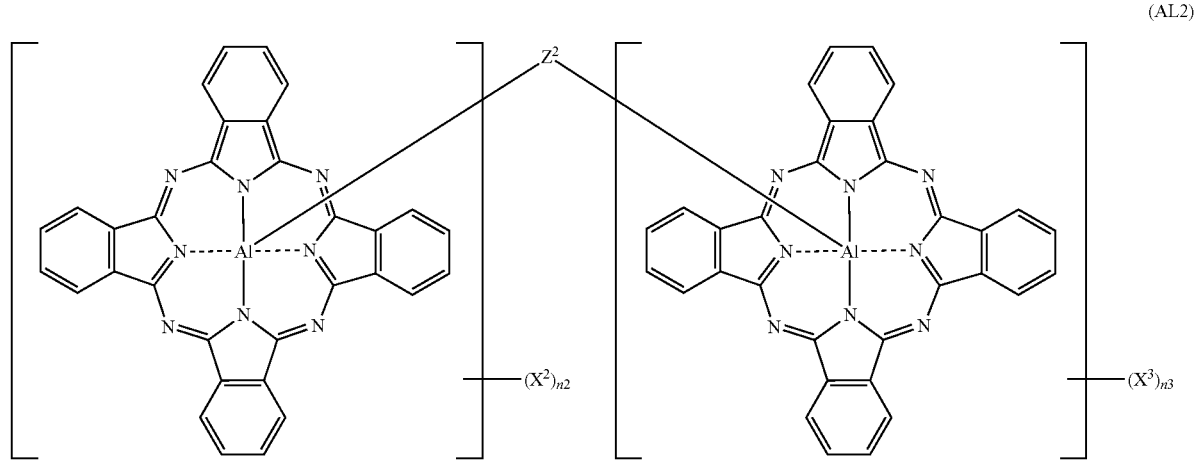

(AL2)

in Formula (AL2), $X^2$ and $X^3$ each independently represent a halogen atom, $Z^2$ represents —O—SiR$^{11}$R$^{12}$—O—, —O—SiR$^{13}$R$^{14}$—O—SiR$^{15}$R$^{16}$—O—, or —O—P(=O)R$^{17}$—O—, where $R^{11}$ to $R^{17}$ each independently represent a hydrogen atom, a hydroxy group, an alkyl group, an aryl group, a heterocyclic group, an alkoxy group, or an aryloxy group, and n2 and n3 each independently represent an integer of 0 to 16.

4. The color filter according to claim 3, wherein the aluminum phthalocyanine pigment is the compound represented by Formula (AL1), and $Z^1$ is —OP(=O)R$^1$R$^2$.

5. The color filter according to claim 3, wherein the aluminum phthalocyanine pigment is the compound represented by Formula (AL1), and n1 represents an integer of 4 to 16, an average value of the number of substitutions of halogen atoms represented by $X^1$ is 6 to 15, and a halogen distribution width is 4 or more.

6. The color filter according to claim 5, wherein $X^1$ is a bromine atom.

7. The color filter according to claim 1, wherein the colored pixel A includes a phthalocyanine pigment derivative.

8. The color filter according to claim 1, wherein the colored pixel A includes a resin having an aromatic carboxyl group.

9. The color filter according to claim 1, wherein the ultraviolet absorbing layer includes at least one selected from an ultraviolet absorber or a yellow colorant.

10. The color filter according to claim 1, further comprising:
an another pixel which is different from the colored pixel A and is in contact with at least a part of a side surface of the colored pixel A.

11. The color filter according to claim 10, wherein the another pixel includes a phthalocyanine pigment.

12. A solid-state imaging element comprising: the color filter according to claim 1.

13. An image display device comprising: the color filter according to claim 1.

* * * * *